United States Patent
Little et al.

(10) Patent No.: US 9,843,148 B2
(45) Date of Patent: Dec. 12, 2017

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Wei-Hao Su, New Taipei (TW); Cheng-Chi Yeh, New Taipei (TW); Yuan Zhang, Rowland-Heights, CA (US); Stephen Sedio, Valley Center, CA (US); Hendrikus P. G. Van der Steen, Den Dungen (NL)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/667,632

(22) Filed: Mar. 24, 2015

(65) Prior Publication Data
US 2015/0200504 A1    Jul. 16, 2015

Related U.S. Application Data

(63) Continuation-in-part of application No. 14/558,732, filed on Dec. 3, 2014, now Pat. No. 9,490,594, and a
(Continued)

(51) Int. Cl.
*H01R 24/60* (2011.01)
*H01R 12/58* (2011.01)
(Continued)

(52) U.S. Cl.
CPC ............ *H01R 24/60* (2013.01); *H01R 12/58* (2013.01); *H01R 13/6581* (2013.01);
(Continued)

(58) Field of Classification Search
CPC ............ H01R 13/6581; H01R 13/6593; H01R 13/6594; H01R 13/6587; H01R 12/724
(Continued)

(56) References Cited

U.S. PATENT DOCUMENTS 5,073,130 A * 12/1991 Nakamura ....... H01R 13/65802
439/607.32
5,370,543 A * 12/1994 Hamada ............... H01R 13/641
439/188
(Continued)

FOREIGN PATENT DOCUMENTS

CM    CN201868687 U    6/2011
CN    1253402 A    5/2000
(Continued)

OTHER PUBLICATIONS

Universal Serial Bus Type-C Cable and Connector Specification Revision 0.7 Working Draft Jan. xx, 2014, pp. 13-14,20-21,33,38.
(Continued)

*Primary Examiner* — James Harvey
*Assistant Examiner* — Oscar C Jimenez
(74) *Attorney, Agent, or Firm* — Wei Te Chung; Ming Chieh Chang

(57) ABSTRACT

A receptacle connector includes a housing defining a base and a mating tongue forwardly extending therefrom, a first row of contacts disposed in the housing with contacting sections and surface mount type tail sections for mounting on a PCB, a second row of contacts disposed in the housing with contacting sections and through hole type tail sections for mounting in the PCB; a metallic shield including a capsular segment surrounding the mating tongue to define a mating cavity and a rear wall covering a rear face of the base to surrounding the surface mount type tail sections and a lower bracket attached to the metallic shielding. The lower
(Continued)

bracket is located upon a bottom side of the shield and includes a bottom wall, two sidewalls and a rear wall commonly surrounding the through hole type tail sections.

15 Claims, 83 Drawing Sheets

Related U.S. Application Data continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, and a continuation-in-part of application No. 14/477,889, filed on Sep. 5, 2014, now Pat. No. 9,525,223, and a continuation-in-part of application No. 14/454,737, filed on Aug. 8, 2014, now Pat. No. 9,525,227, and a continuation-in-part of application No. 14/337,180, filed on Jul. 21, 2014, now Pat. No. 9,318,853, and a continuation-in-part of application No. 14/517,941, filed on Oct. 20, 2014, now Pat. No. 9,496,662.

(60) Provisional application No. 61/977,115, filed on Apr. 9, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
| | | |
|---|---|---|
| *H01R 13/6581* | (2011.01) | |
| *H05K 1/11* | (2006.01) | |
| *H05K 1/18* | (2006.01) | |
| *H01R 13/642* | (2006.01) | |
| *H01R 24/30* | (2011.01) | |
| *H01R 12/72* | (2011.01) | |
| *H01R 107/00* | (2006.01) | |

(52) U.S. Cl.
CPC .......... *H01R 12/724* (2013.01); *H01R 13/642* (2013.01); *H01R 24/30* (2013.01); *H01R 2107/00* (2013.01); *H05K 1/117* (2013.01); *H05K 1/184* (2013.01); *H05K 2201/09063* (2013.01); *H05K 2201/10189* (2013.01)

(58) Field of Classification Search
USPC .................................................. 439/607.55
See application file for complete search history.

(56) References Cited

U.S. PATENT DOCUMENTS

| | | | | |
|---|---|---|---|---|
| 6,217,378 B1* | 4/2001 | Wu | .................... | H01R 23/6873 |
| | | | | 439/567 |
| 6,755,689 B2* | 6/2004 | Zhang | ................. | H01R 12/716 |
| | | | | 439/357 |
| 7,252,519 B2* | 8/2007 | Saka | .................... | H05K 7/026 |
| | | | | 439/76.2 |
| 7,549,896 B2* | 6/2009 | Zhang | ................. | H01R 12/716 |
| | | | | 439/607.01 |
| 7,758,379 B2 | 7/2010 | Chen | | |
| 7,794,279 B1* | 9/2010 | Ye | .......... | H01R 9/032 |
| | | | | 439/607.41 |
| 8,087,944 B2 | 1/2012 | Kumamoto et al. | | |
| 8,109,795 B2* | 2/2012 | Lin | .................... | H01R 13/6461 |
| | | | | 439/660 |
| 8,282,417 B2* | 10/2012 | Xiao | .................... | H01R 13/648 |
| | | | | 439/607.36 |
| 8,517,773 B2 | 8/2013 | Lee et al. | | |
| 8,827,742 B2* | 9/2014 | Wang | .................... | H01R 24/68 |
| | | | | 439/569 |
| 8,968,031 B2 | 3/2015 | Simmel et al. | | |
| 9,281,626 B2* | 3/2016 | Lin | .................... | H01R 13/6581 |
| 9,300,095 B2* | 3/2016 | Lin | .................... | H01R 24/60 |
| 2007/0049100 A1 | 3/2007 | Tsai | | |
| 2009/0156027 A1 | 6/2009 | Chen | | |
| 2010/0267261 A1 | 10/2010 | Lin | | |
| 2013/0095702 A1 | 4/2013 | Golko et al. | | |
| 2013/0183844 A1* | 7/2013 | Wang | .................... | H01R 24/68 |
| | | | | 439/271 |
| 2014/0024257 A1 | 1/2014 | Castillo et al. | | |
| 2014/0099832 A1* | 4/2014 | Chang | ................ | H01R 13/6581 |
| | | | | 439/660 |
| 2015/0056839 A1 | 2/2015 | Zhang | | |
| 2015/0162684 A1 | 6/2015 | Amini et al. | | |
| 2015/0171562 A1 | 6/2015 | Gao et al. | | |
| 2015/0171574 A1* | 6/2015 | Little | .................... | H01R 24/60 |
| | | | | 439/78 |
| 2015/0194768 A1* | 7/2015 | Little | ................. | H01R 13/6594 |
| | | | | 439/607.37 |
| 2015/0194772 A1* | 7/2015 | Little | ................. | H01R 13/6597 |
| | | | | 439/357 |
| 2015/0207280 A1* | 7/2015 | Little | .................... | H01R 24/60 |
| | | | | 439/607.34 |
| 2015/0214673 A1 | 7/2015 | Gao et al. | | |
| 2015/0214674 A1 | 7/2015 | Simmel et al. | | |
| 2015/0229077 A1* | 8/2015 | Little | ................. | H01R 13/6582 |
| | | | | 439/78 |
| 2015/0244111 A1* | 8/2015 | Ju | ...................... | H01R 13/6585 |
| | | | | 439/607.05 |
| 2015/0255905 A1* | 9/2015 | Little | ................. | H01R 13/6658 |
| | | | | 439/78 |
| 2015/0270646 A1* | 9/2015 | Kao | .................... | H01R 13/6581 |
| | | | | 439/76.1 |
| 2015/0295362 A1 | 10/2015 | Tziviskos et al. | | |
| 2015/0340813 A1 | 11/2015 | Ng et al. | | |
| 2015/0340815 A1 | 11/2015 | Gao et al. | | |
| 2015/0340825 A1 | 11/2015 | Ng et al. | | |
| 2016/0064868 A1* | 3/2016 | Little | ................. | H01R 13/6581 |
| | | | | 439/607.01 |
| 2016/0118752 A1 | 4/2016 | Guo et al. | | |

FOREIGN PATENT DOCUMENTS

| | | |
|---|---|---|
| CN | 2454802 Y | 10/2001 |
| CN | 2724249 Y | 9/2005 |
| CN | 2728006 Y | 9/2005 |
| CN | 2821921 Y | 9/2006 |
| CN | 201029143 Y | 2/2008 |
| CN | 201078847 Y | 6/2008 |
| CN | 201230066 Y | 4/2009 |
| CN | 101573840 A | 11/2009 |
| CN | 201498627 U | 6/2010 |
| CN | 201623280 U | 11/2010 |
| CN | 201708399 U | 1/2011 |
| CN | 201717435 U | 1/2011 |
| CN | 201741935 U | 2/2011 |
| CN | 201741937 U | 2/2011 |
| CN | 102280732 B | 12/2011 |
| CN | 202076514 U | 12/2011 |
| CN | 102437482 A | 5/2012 |
| CN | 202217831 U | 5/2012 |
| CN | 202231226 U | 5/2012 |

(56) References Cited

FOREIGN PATENT DOCUMENTS

| | | |
|---|---|---|
| CN | 102544812 A | 7/2012 |
| CN | 202423735 | 9/2012 |
| CN | 202513384 U | 10/2012 |
| CN | 202737282 | 2/2013 |
| CN | 103081253 A | 5/2013 |
| CN | 203242848 U | 10/2013 |
| CN | 103401087 A | 11/2013 |
| CN | 103427263 A | 12/2013 |
| CN | 203326282 U | 12/2013 |
| CN | 103579820 A | 2/2014 |
| CN | 103647172 A | 3/2014 |
| CN | 203481540 U | 3/2014 |
| CN | 103762479 A | 4/2014 |
| CN | 203521683 | 4/2014 |
| CN | 104377509 A | 2/2015 |
| CN | 204243365 U | 4/2015 |
| CN | 204577669 U | 8/2015 |
| KR | 2020100004799 U | 5/2010 |
| TW | M288035 | 2/2006 |
| TW | M357077 | 5/2009 |
| TW | M391213 | 10/2010 |
| TW | M398256 | 2/2011 |
| TW | M398262 | 2/2011 |
| TW | I427870 | 6/2011 |
| TW | M414692 | 10/2011 |
| TW | M426911 | 4/2012 |
| TW | M443957 | 12/2012 |
| TW | M453995 | 5/2013 |
| TW | M454654 | 6/2013 |
| TW | M471688 | 2/2014 |
| TW | M475728 | 4/2014 |
| WO | WO2009147791 | 12/2009 |
| WO | WO2013/020359 | 2/2013 |

OTHER PUBLICATIONS

USB Type-C Specification 0.9c05-20140518, p. 24-44,47,53-64,84-86.
Universal Serial Bus Type-C Cable and Connector Specification Revision 1.0 Aug. 11, 2014, p. 18-19,28-48,51,55,58,59-63,65-67,70,93,96-99.

* cited by examiner

FLIPPABLE ELECTRICAL CONNECTOR

CROSS REFERENCE TO RELATED APPLICATIONS

This application is a continuation-in-part of the co-pending application Ser. No. 14/558,732 filed Dec. 3, 2014, and the instant application further claims the benefit of, and priority to, U.S. Provisional Patent Application No. 61/977,115, filed Apr. 9, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a receptacle connector for being mounted in a notch defined on a printed circuit board (PCB). The receptacle connector comprises an insulative housing defining a base and a mating tongue forwardly extending therefrom, a first row of contacts disposed in the housing with contacting sections exposed upon a first surface of the mating tongue and surface mount type tail sections for mounting on the PCB, a second row of contacts disposed in the housing with contacting sections exposed upon a second surface of the mating tongue and through hole type tail sections for mounting in the PCB; a metallic shield comprising a capsular segment surrounding the mating tongue to define a mating cavity and a rear wall covering a rear face of the base to surrounding the surface mount type tail sections of the first row of contacts and a metallic lower bracket attached to the metallic shielding. The lower bracket is located upon a bottom side of the shield and comprises a bottom wall, two sidewalls and a rear wall commonly surrounding the through hole type tail sections of the second row of contacts.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
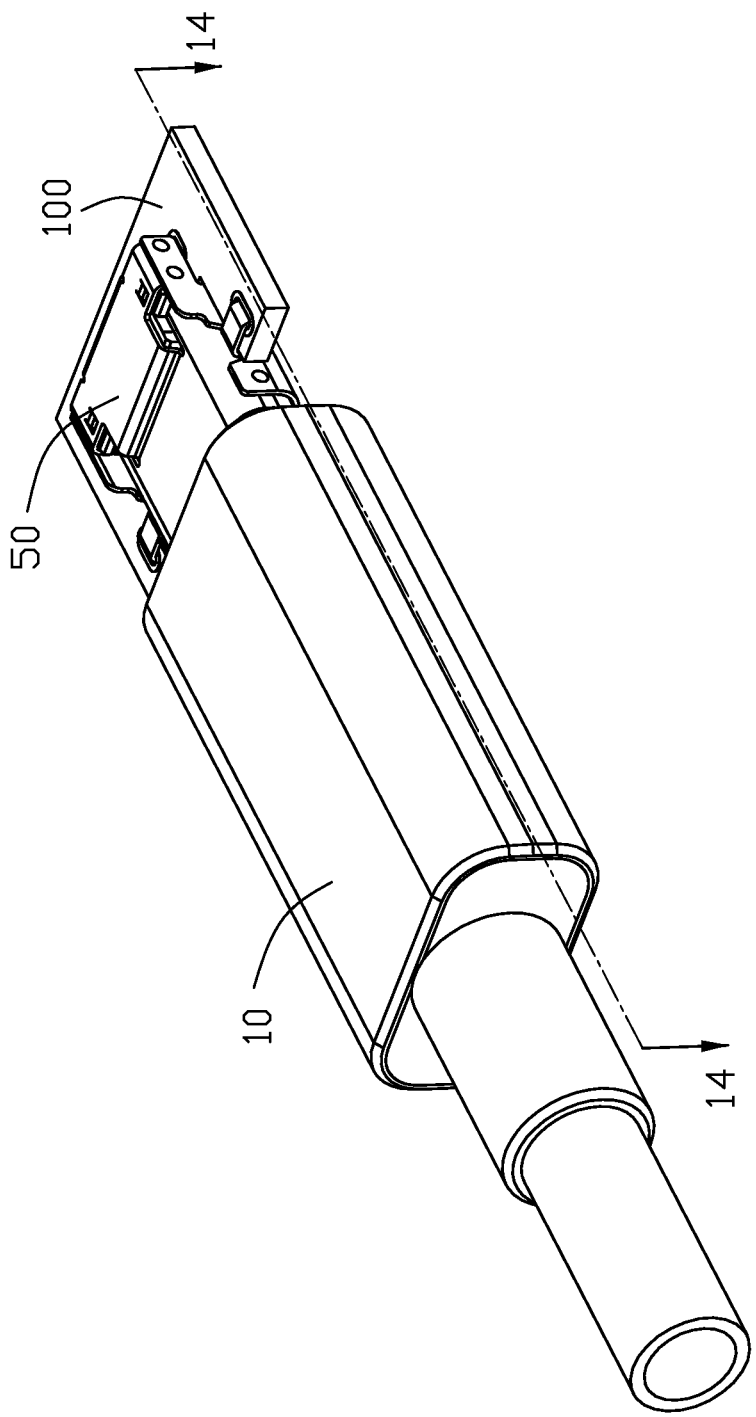
FIG. 1 is an assembled perspective view of a mated receptacle connector on the printed circuit board and a plug connector of a first embodiment of the instant invention.
Figure 2:
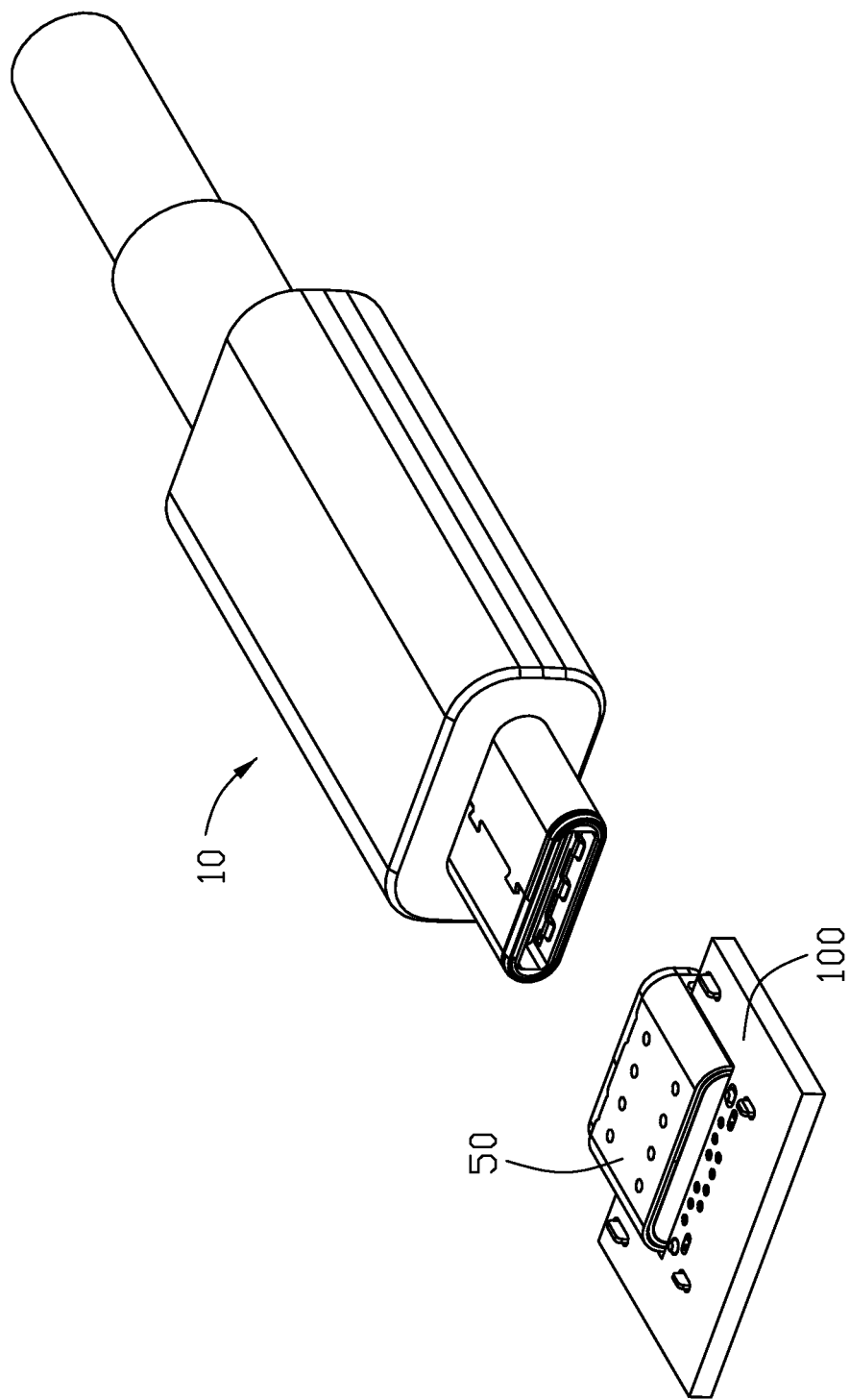
FIG. 2 is a rear exploded perspective view of the receptacle connector and the plug connector of FIG. 1.
Figure 3:
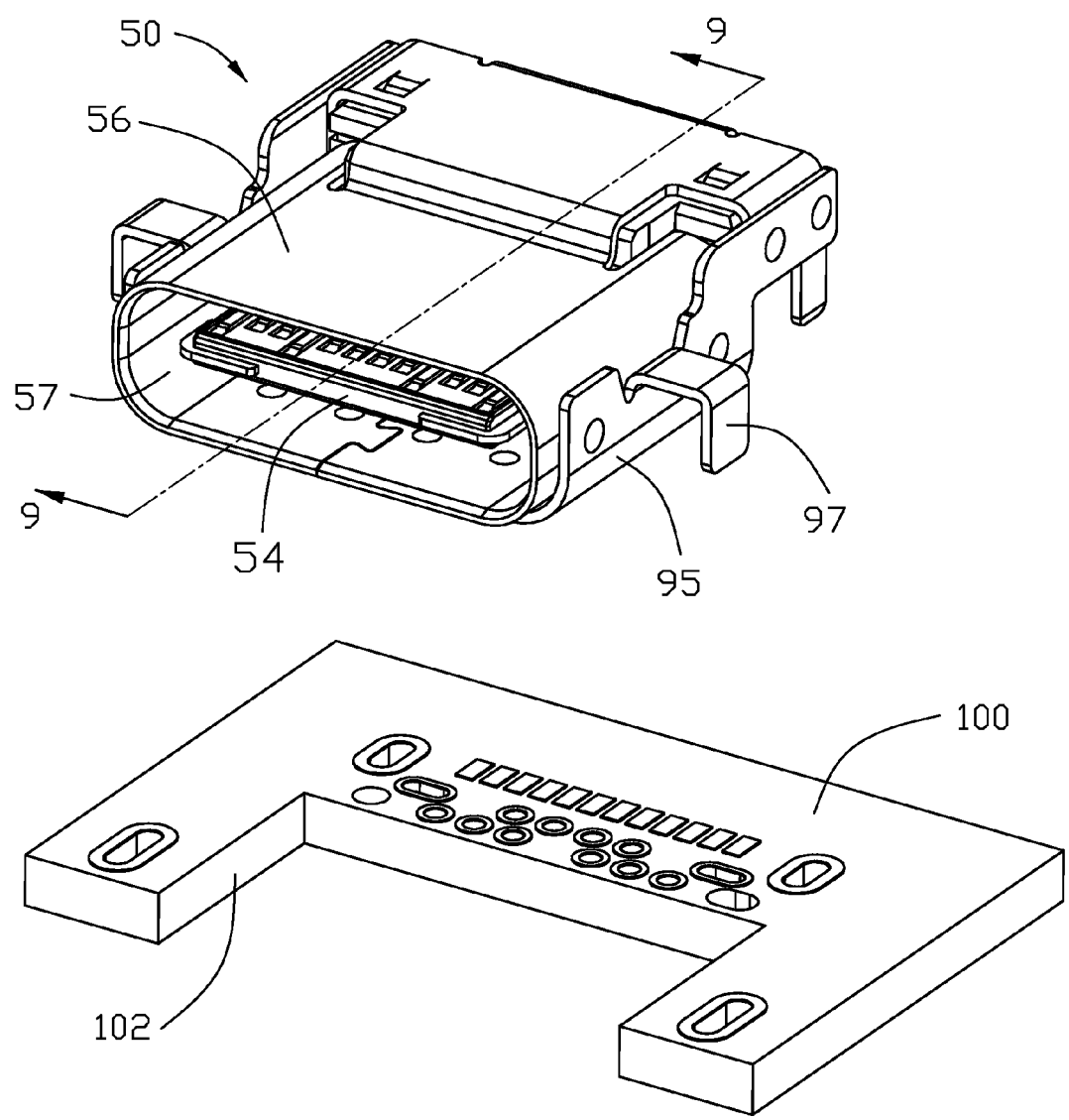
FIG. 3 is a front perspective view of the receptacle connector spaced from the printed circuit board of FIG. 1.
Figure 4A:
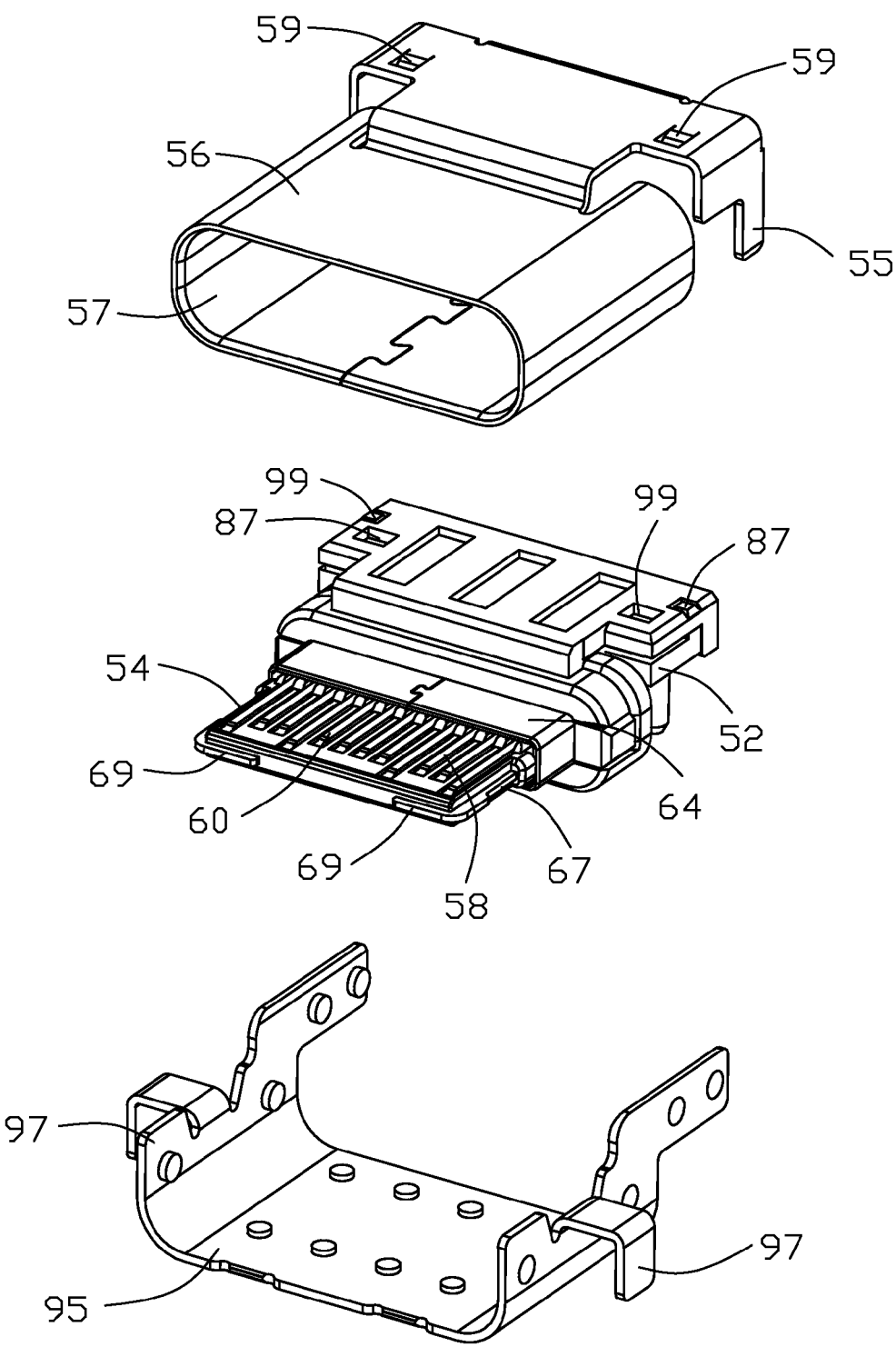
FIG. 4(A) is a front partially exploded perspective view of the receptacle connector of FIG. 1.
Figure 4B:
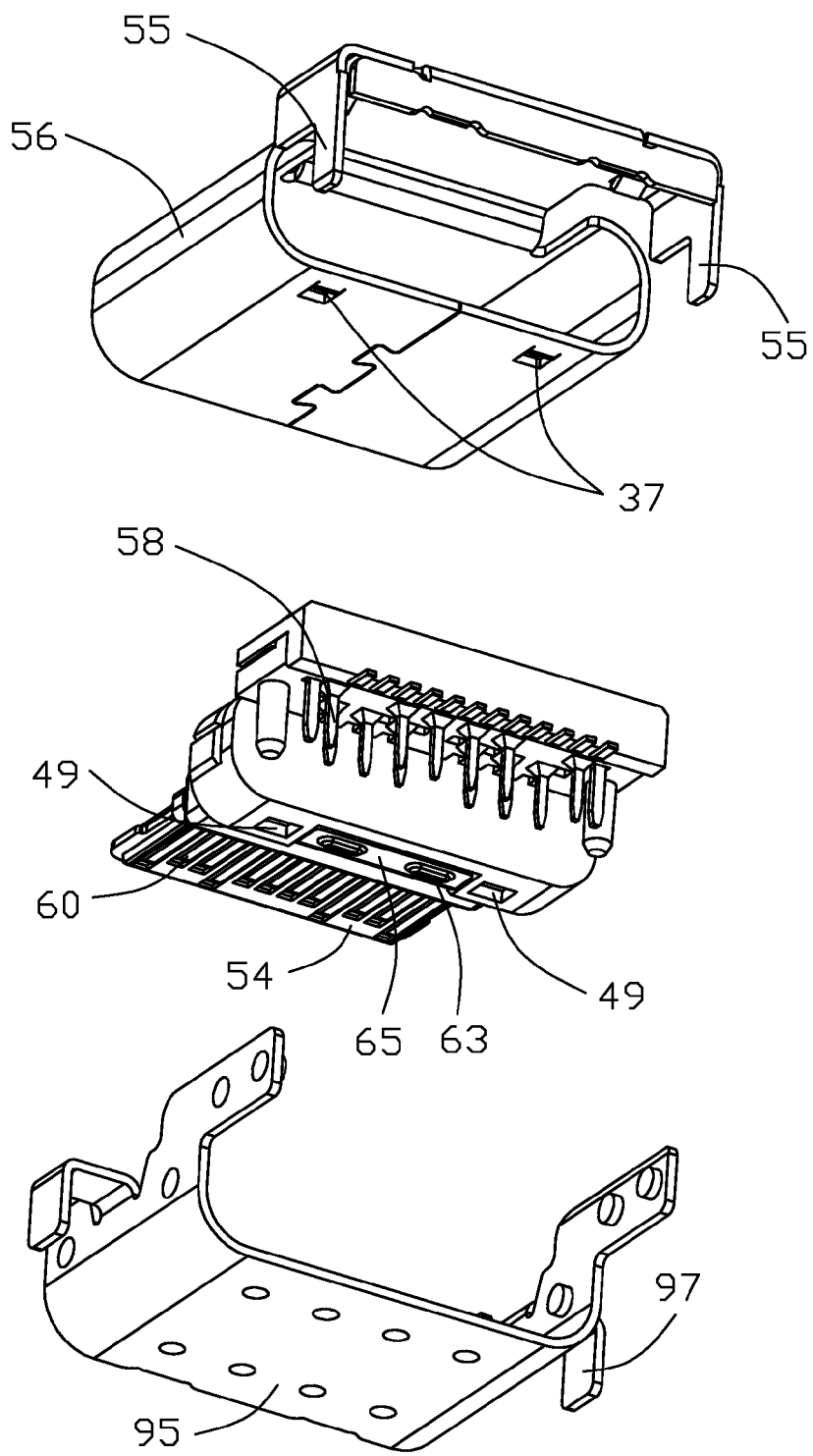
FIG. 4(B) is a rear partially exploded perspective view of the receptacle connector of FIG. 1.
Figure 5:
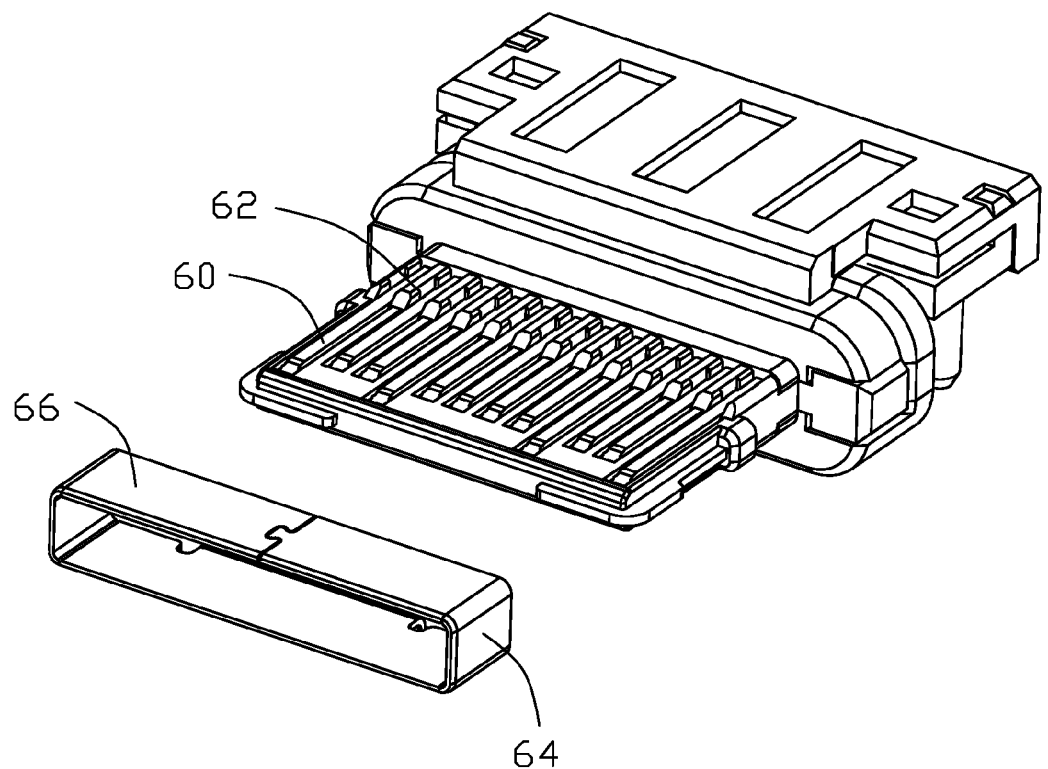
FIG. 5 is a front partially exploded perspective view of the receptacle connector of FIG. 1 without the shield thereof.
Figure 6A:
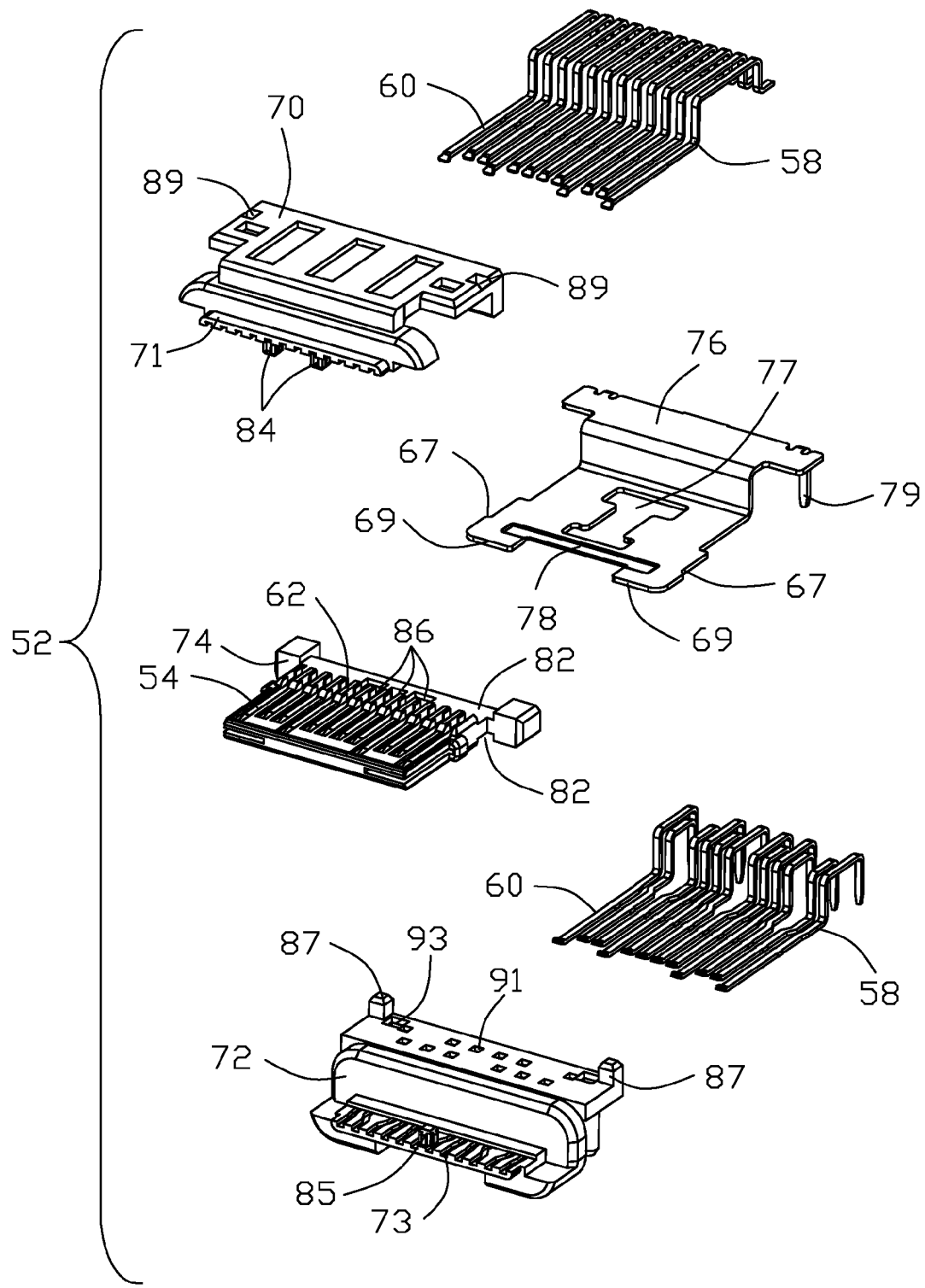
FIG. 6(A) is a front partially exploded perspective view of the receptacle connector of FIG. 1 to show the housing and the contacts thereof.
Figure 6B:
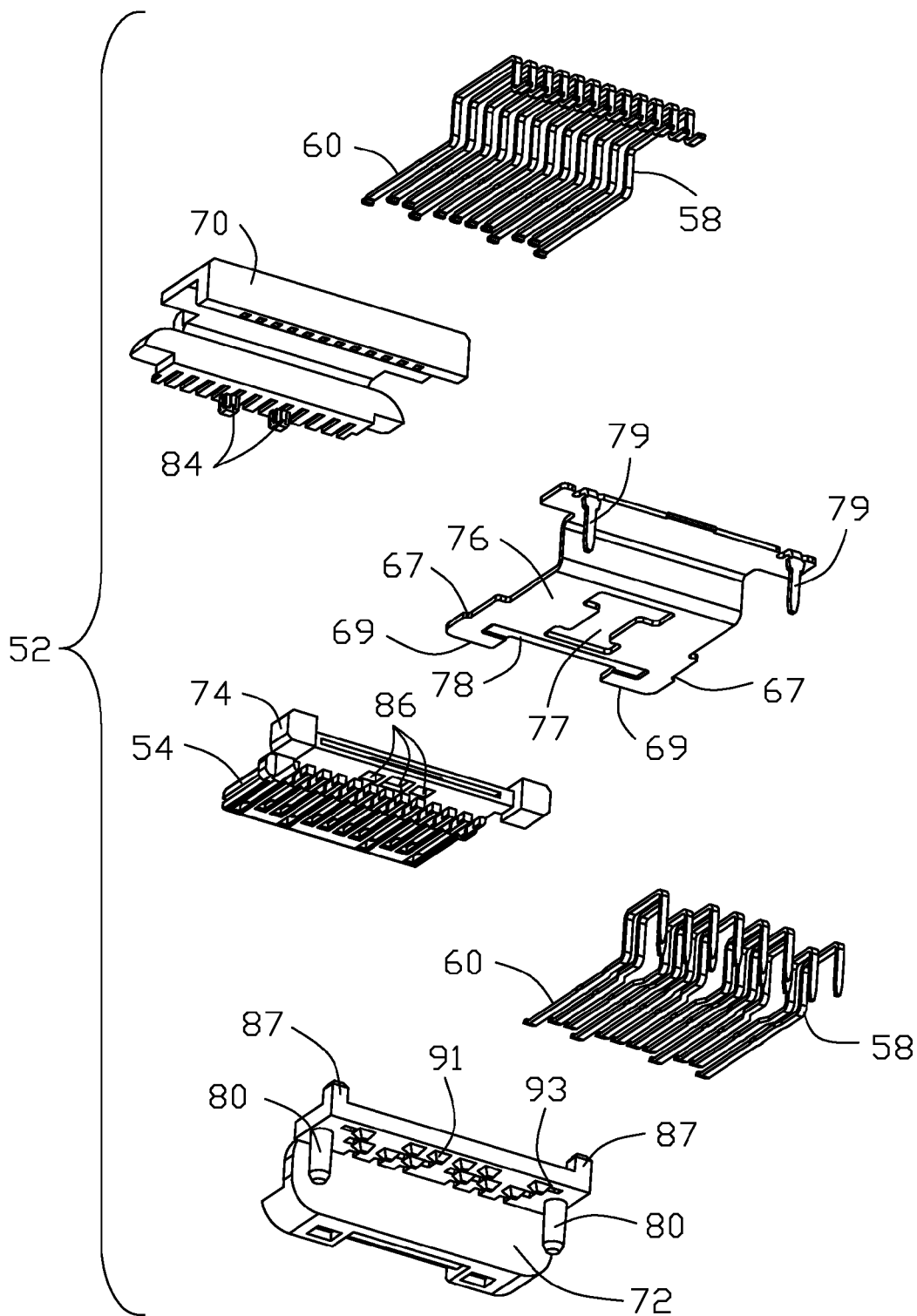
FIG. 6(B) is a rear partially exploded perspective view of the receptacle connector of FIG. 1 to show the housing and the contacts thereof.
Figure 7A:
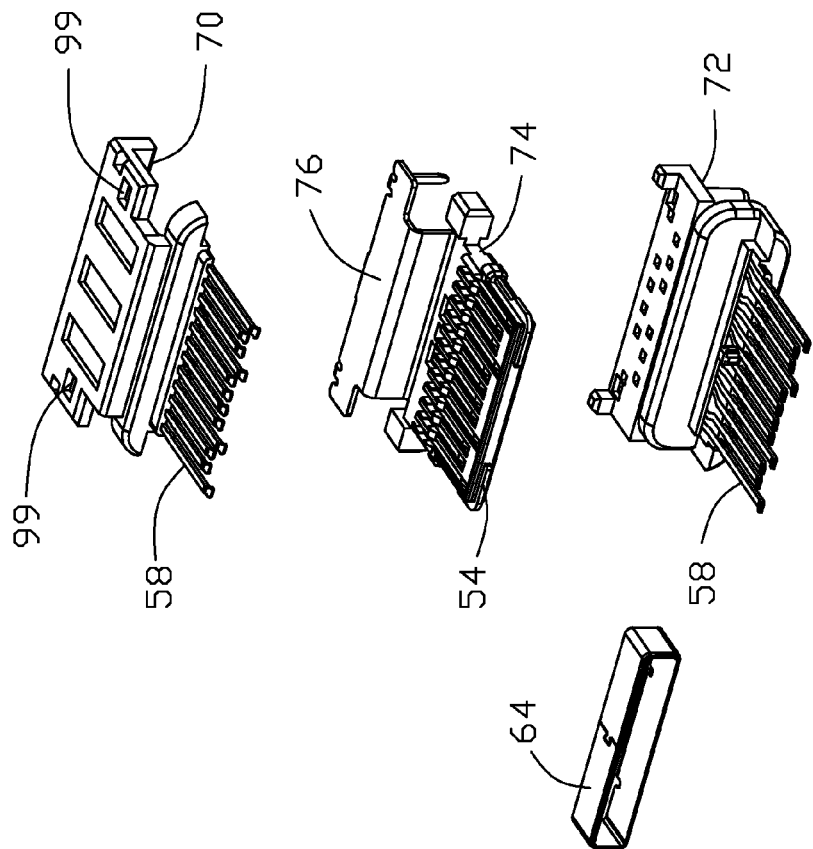
FIG. 7(A) is a front partially exploded perspective view of the receptacle connector of FIG. 1 wherein the housing and the contacts are pre-assembled together.
Figure 7A:
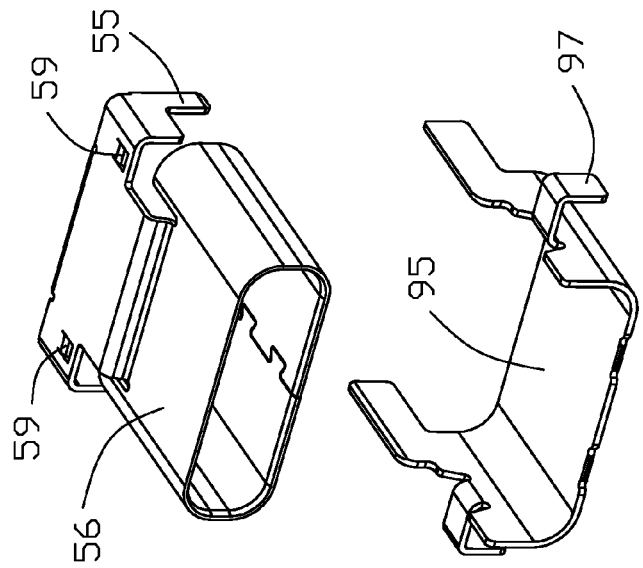
Figure 7B:
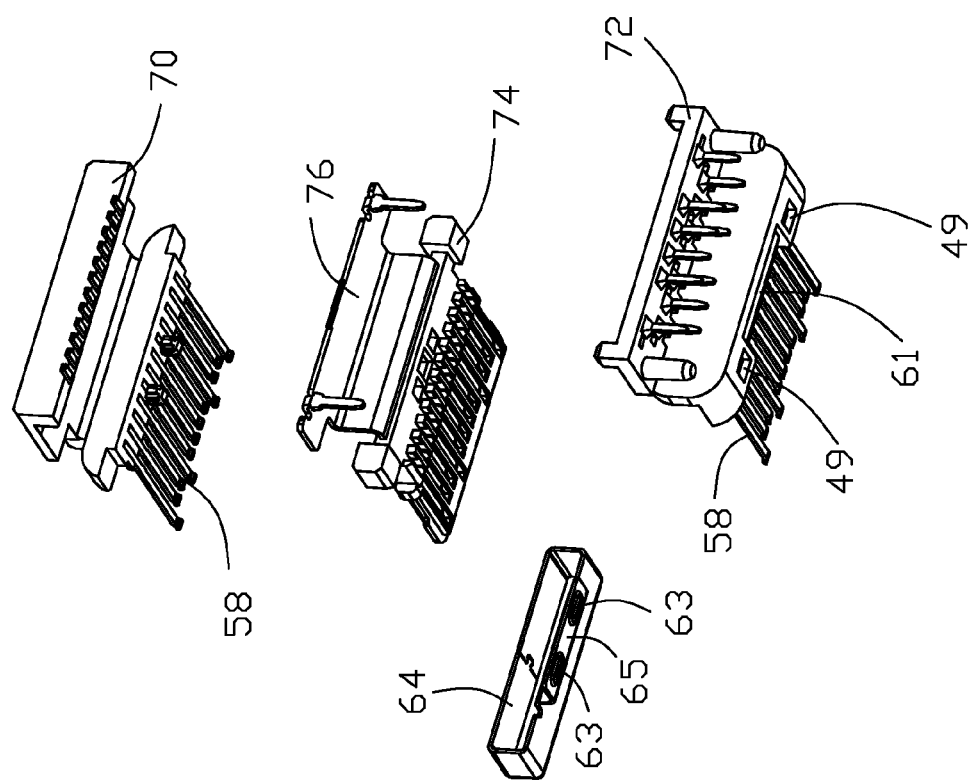
FIG. 7(B) is a rear partially exploded perspective view of the receptacle connector of FIG. 1 wherein the housing and the contacts are pre-assembled together.
Figure 7B:
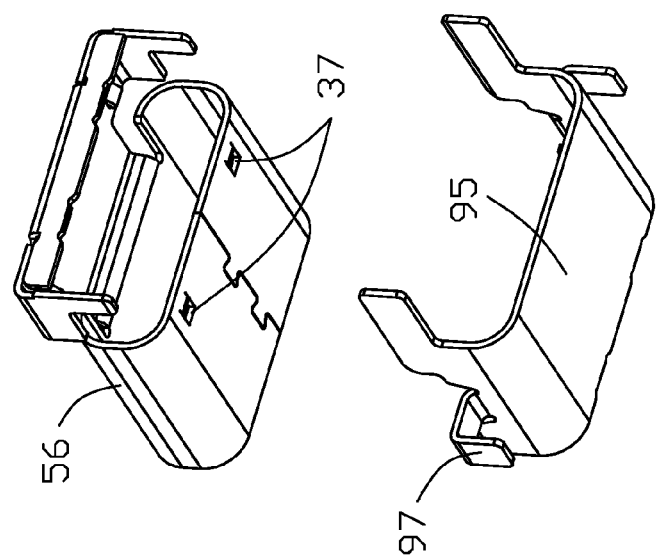
Figure 8A:
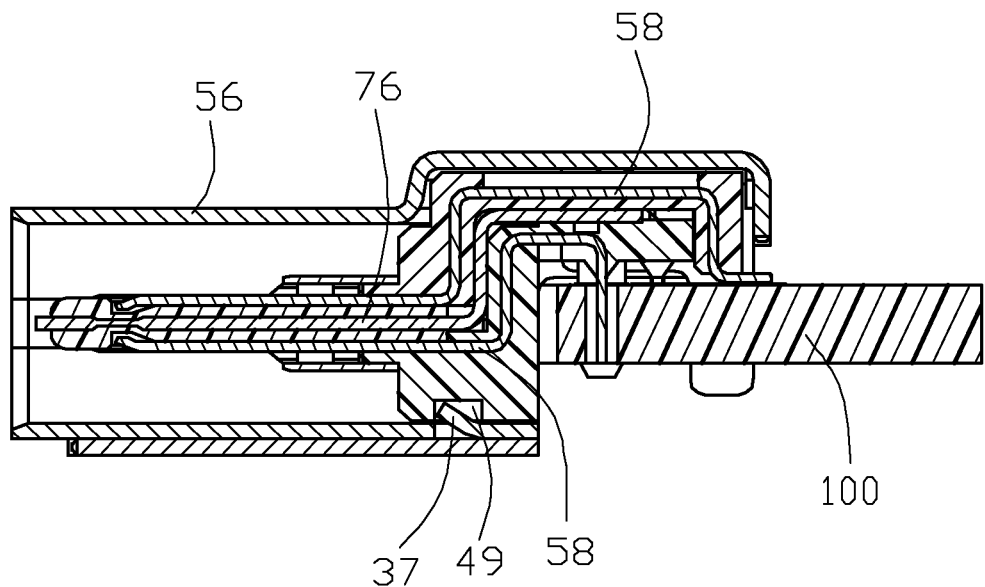
FIG. 8(A) is a cross-sectional view of the receptacle connector on the printed circuit board of FIG. 1 to show the retention tang of the shield.
Figure 8B:
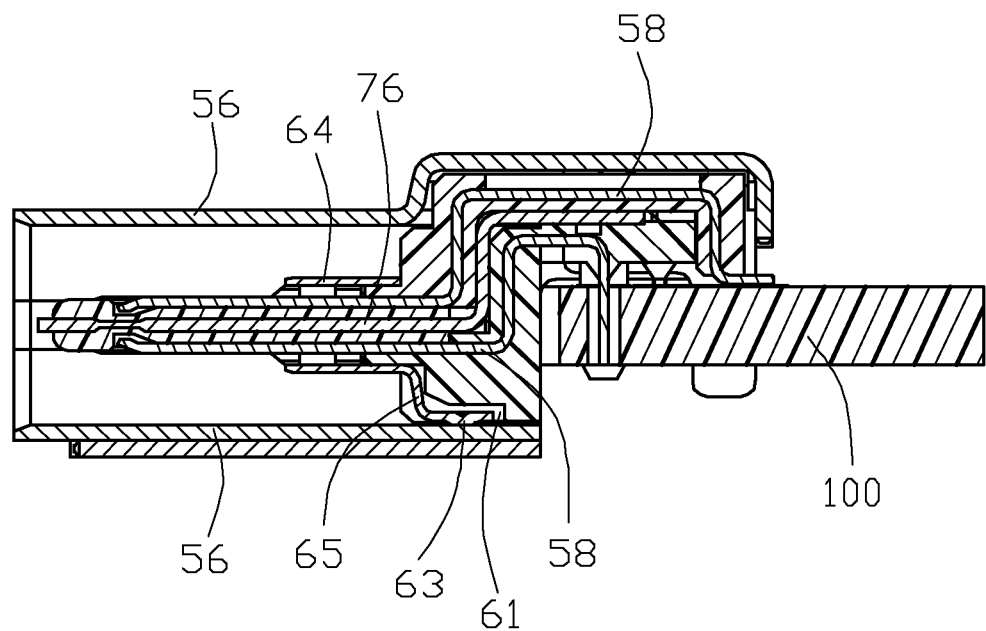
FIG. 8(B) is a cross-sectional view of the receptacle connector to show the extending plate of the collar.
Figure 9:
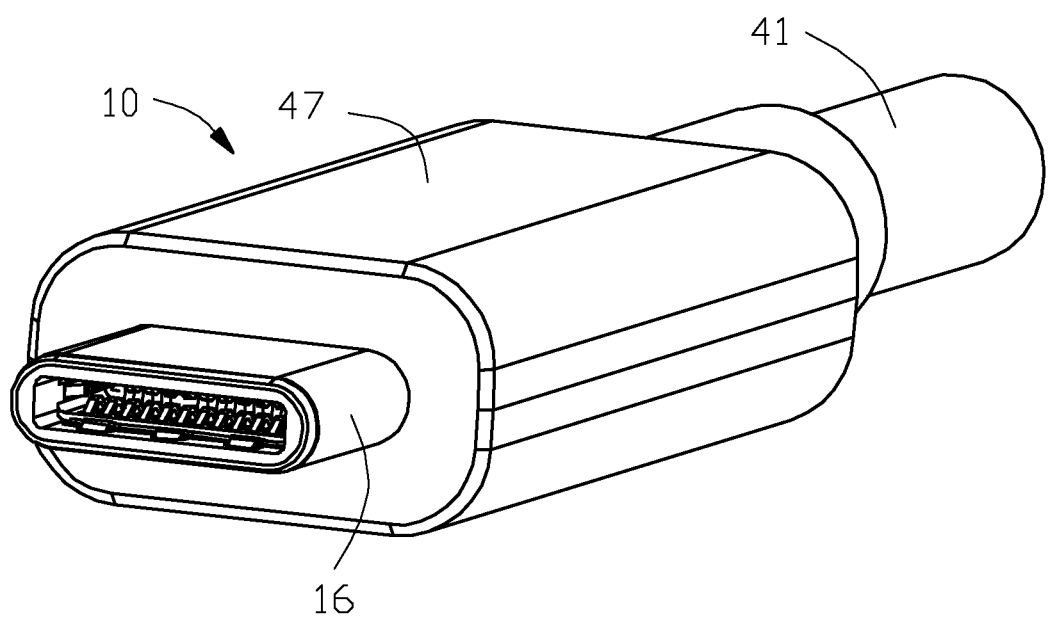
FIG. 9 is a front assembled perspective view of the plug connector of FIG. 1.
Figure 10:
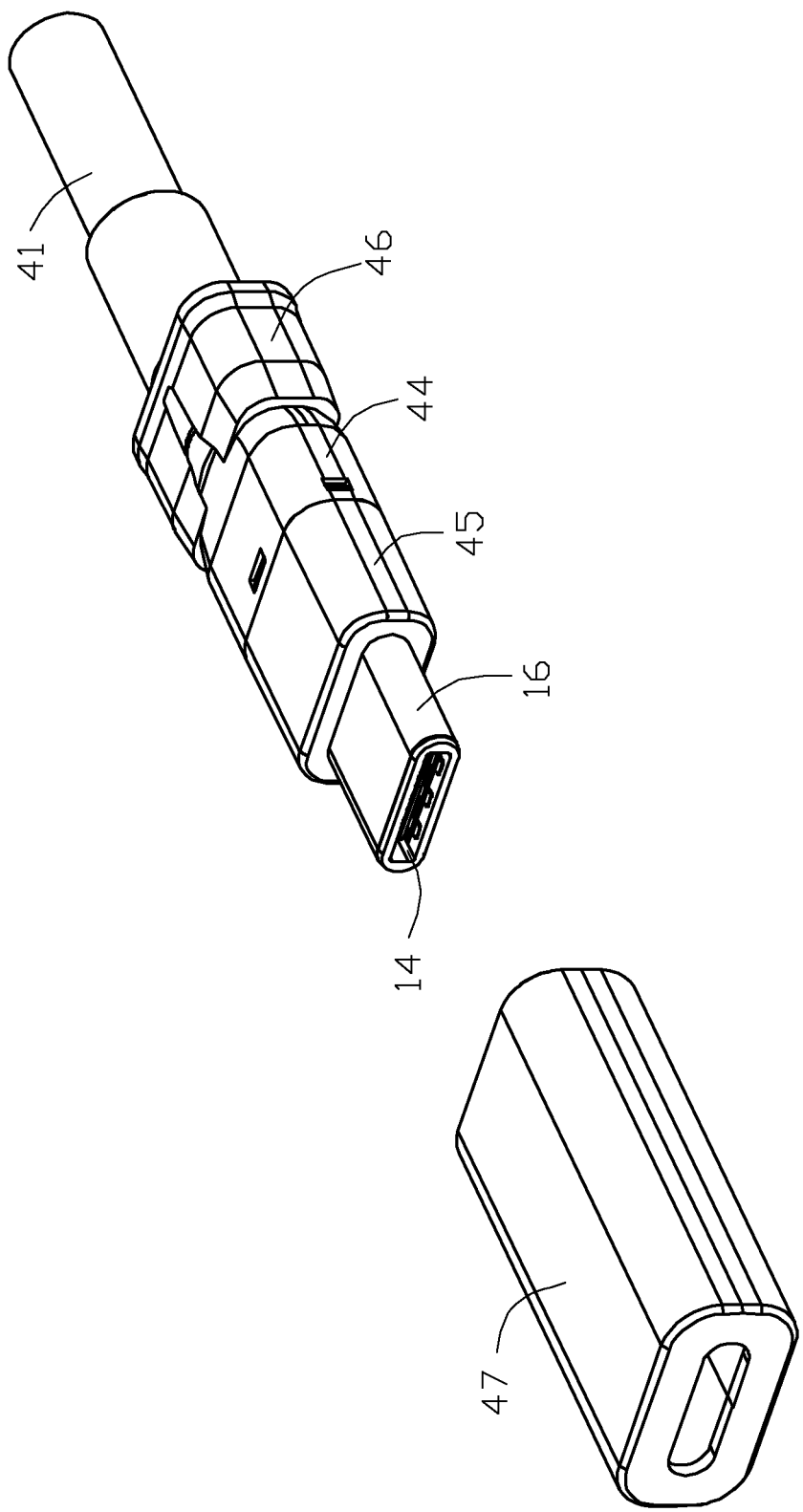
FIG. 10 is a front partially exploded perspective view of the plug connector of FIG. 1 wherein the cover is removed away from the remainder.
Figure 11:
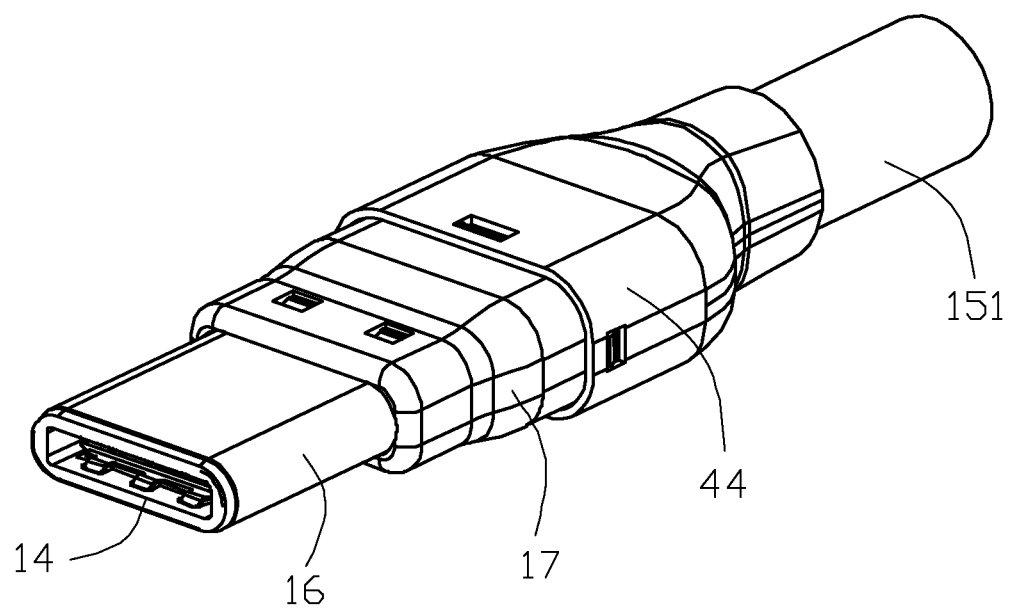
FIG. 11 is a front partially exploded perspective view of the plug connector of FIG. 10 wherein the front and rear over-moldings have been further removed.
Figure 12:
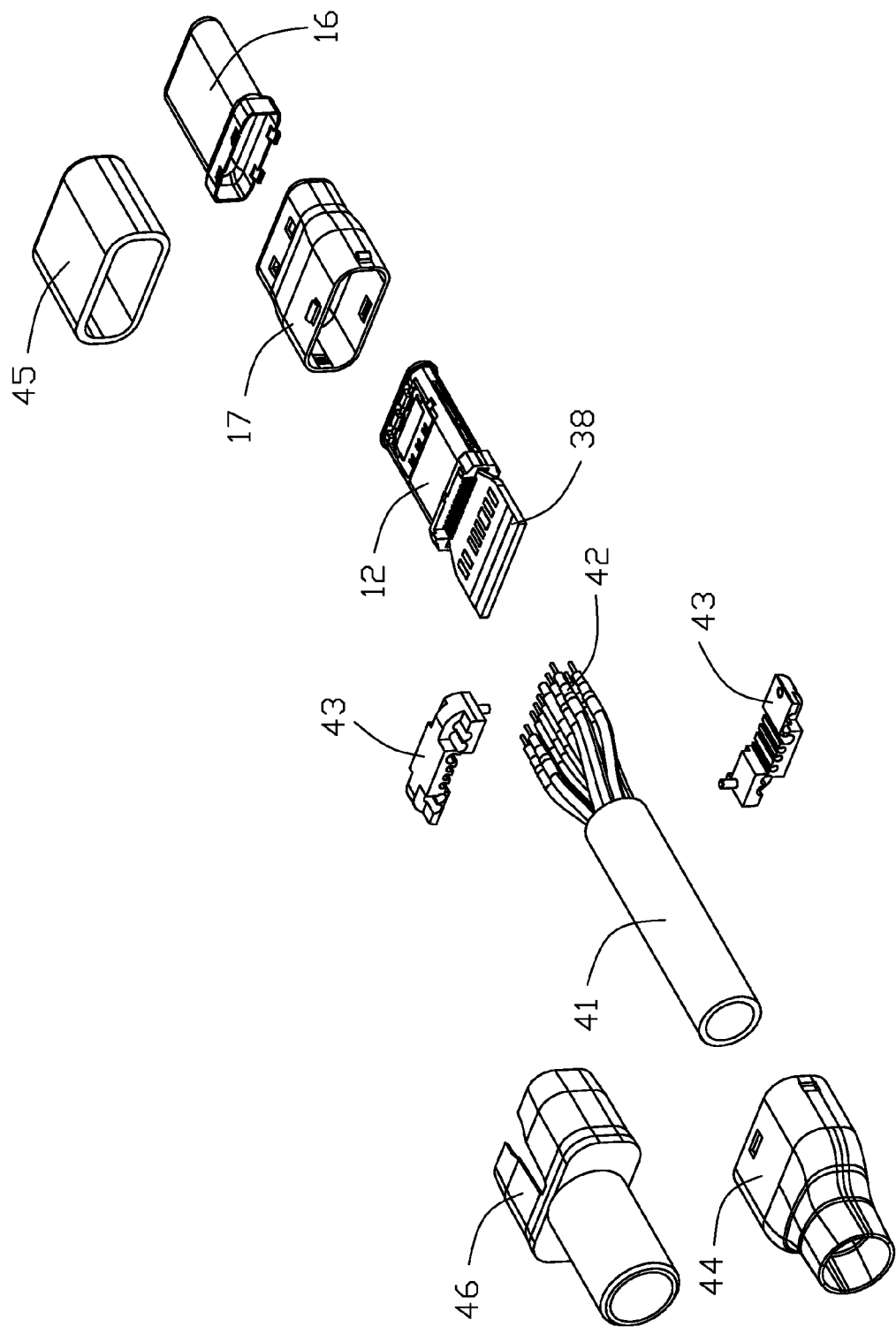
FIG. 12 is a rear partially exploded perspective view of the plug connector of FIG. 10.
Figure 13A:
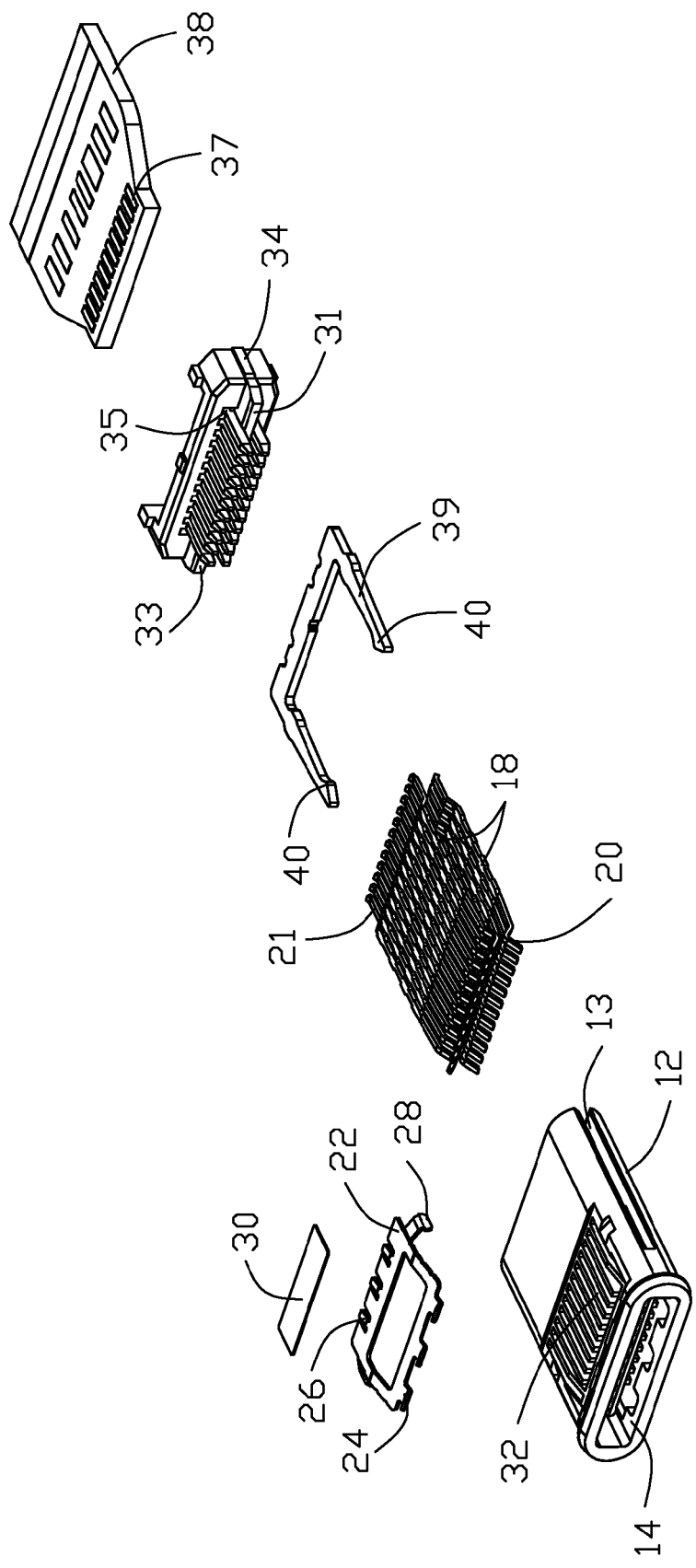
FIG. 13(A) is a front partially exploded perspective view of the plug connector of FIG. 12 by removal of additional parts therefrom.
Figure 13B:
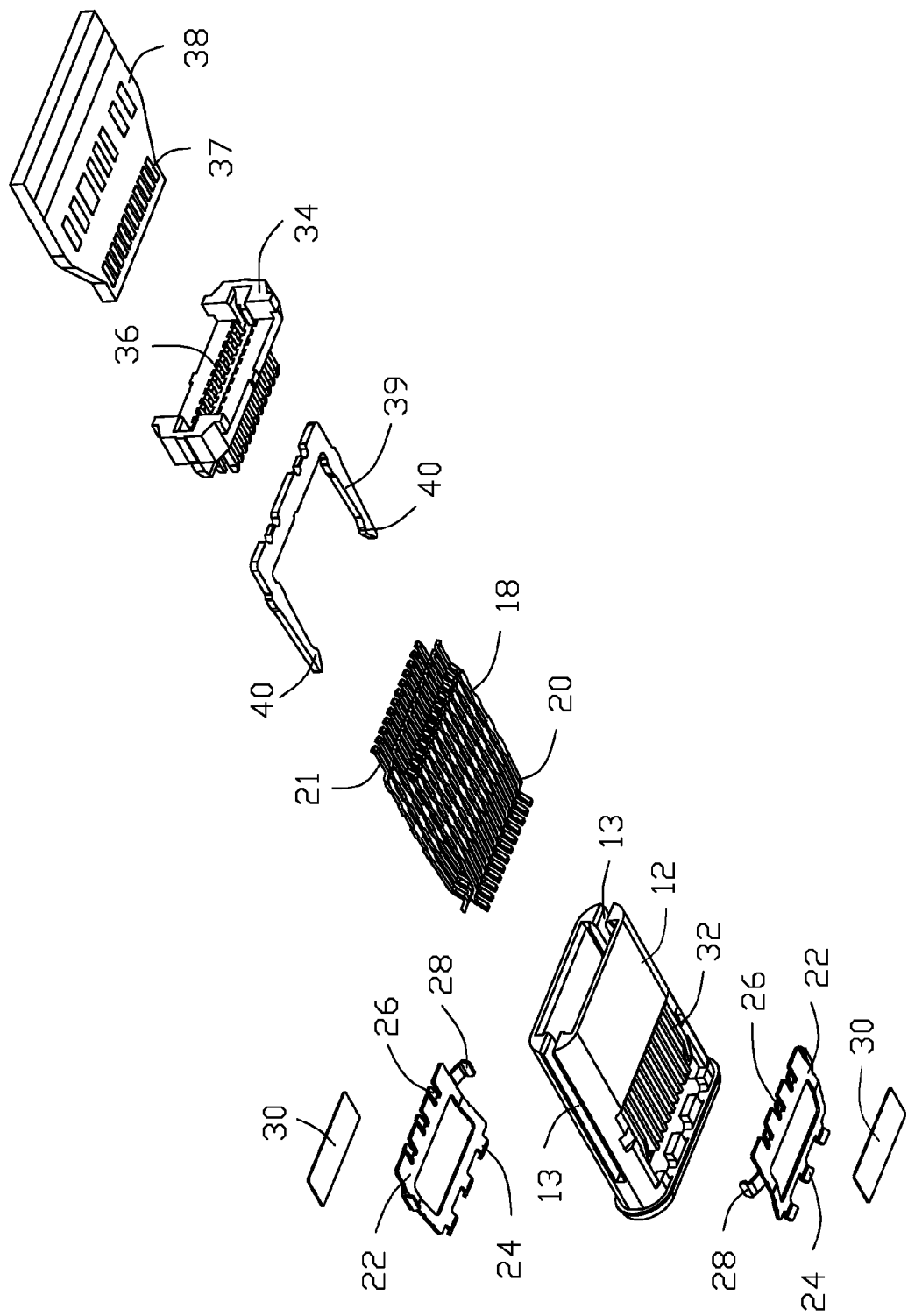
FIG. 13(B) is a rear partially exploded perspective view of the plug connector of FIG. 13(A).

FIGS. 1-2(B) show a plug connector 10 mated with a receptacle connector 50 mounted in a notch 102 of a printed circuit board 100, of a first embodiment. Referring to FIGS. 3-8(B), the receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56.

The housing 52 is composed of the upper piece 70 and a lower piece 72 commonly sandwiching therebeween a middle piece 74 which forms the mating tongue 54. The upper row contacts 58 are associated with the upper piece 70, the lower row contacts 58 associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100. The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismsting consideration, and a pair of lateral edge sections 67 for locking with a latch 39 of the plug connector 10 (illustrated later). In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 14:
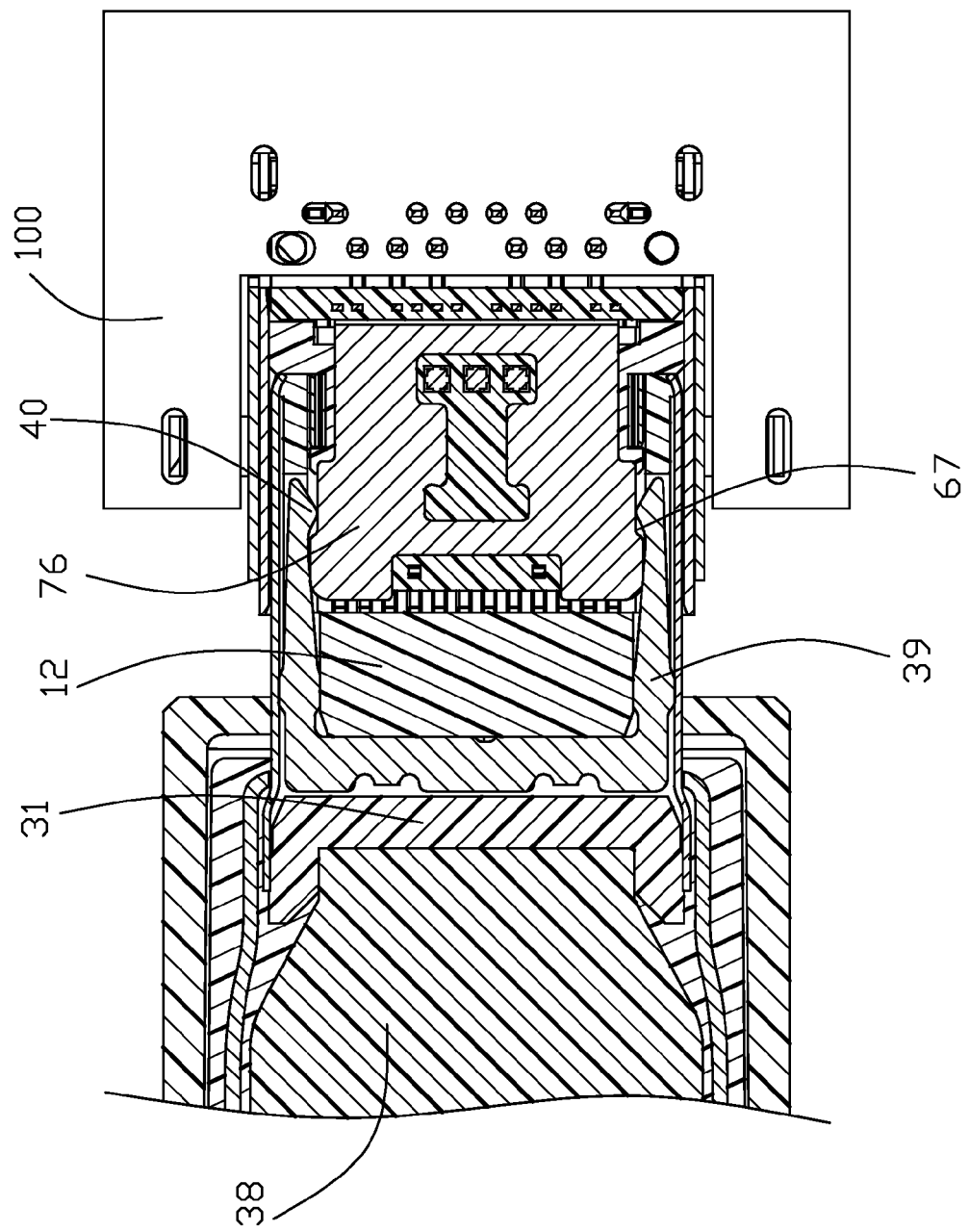
FIG. 14 is a cross-sectional view of the mated plug connector and receptacle connector of FIG. 1 to show how the latch of the plug connector is lockable engaged with the shielding plate of the receptacle connector.
Figure 15A:
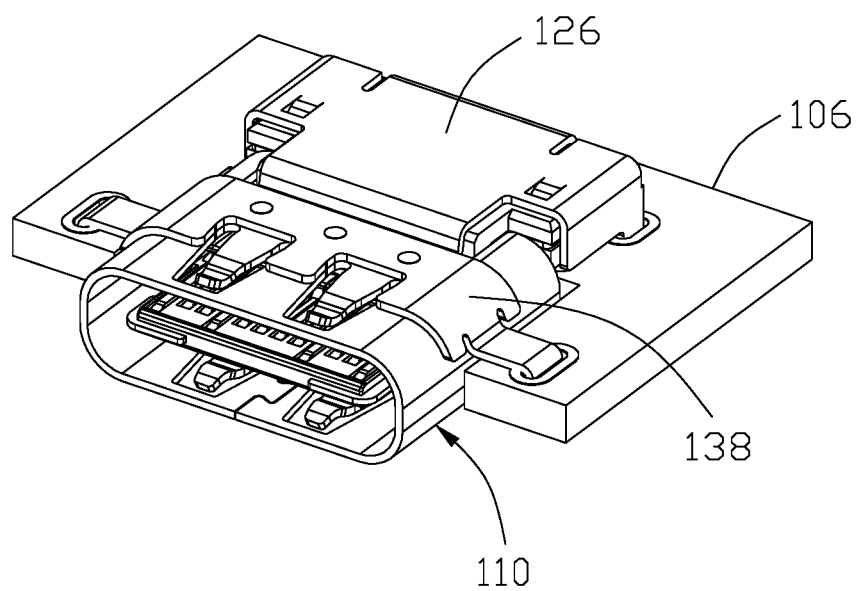
FIG. 15(A) is a front assembled perspective view of a second embodiment of the receptacle connector mounted to the printed circuit board.
Figure 15B:
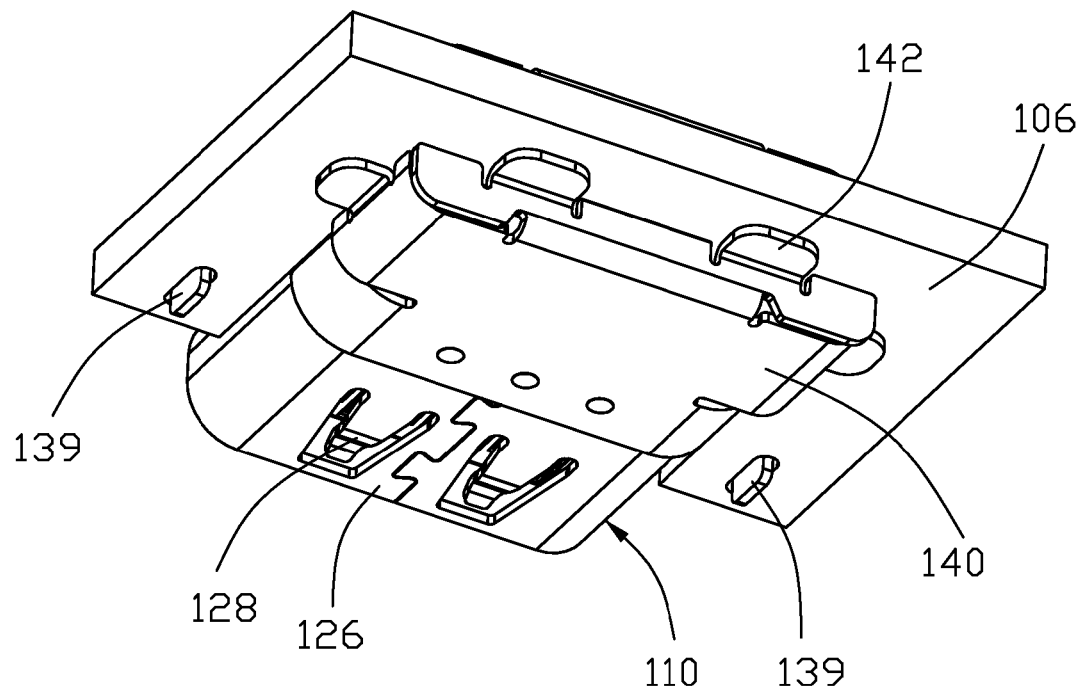
FIG. 15(B) is a rear assembled perspective view of the receptacle connector mounted upon the printed circuit board of FIG. 15(A).
Figure 16A:
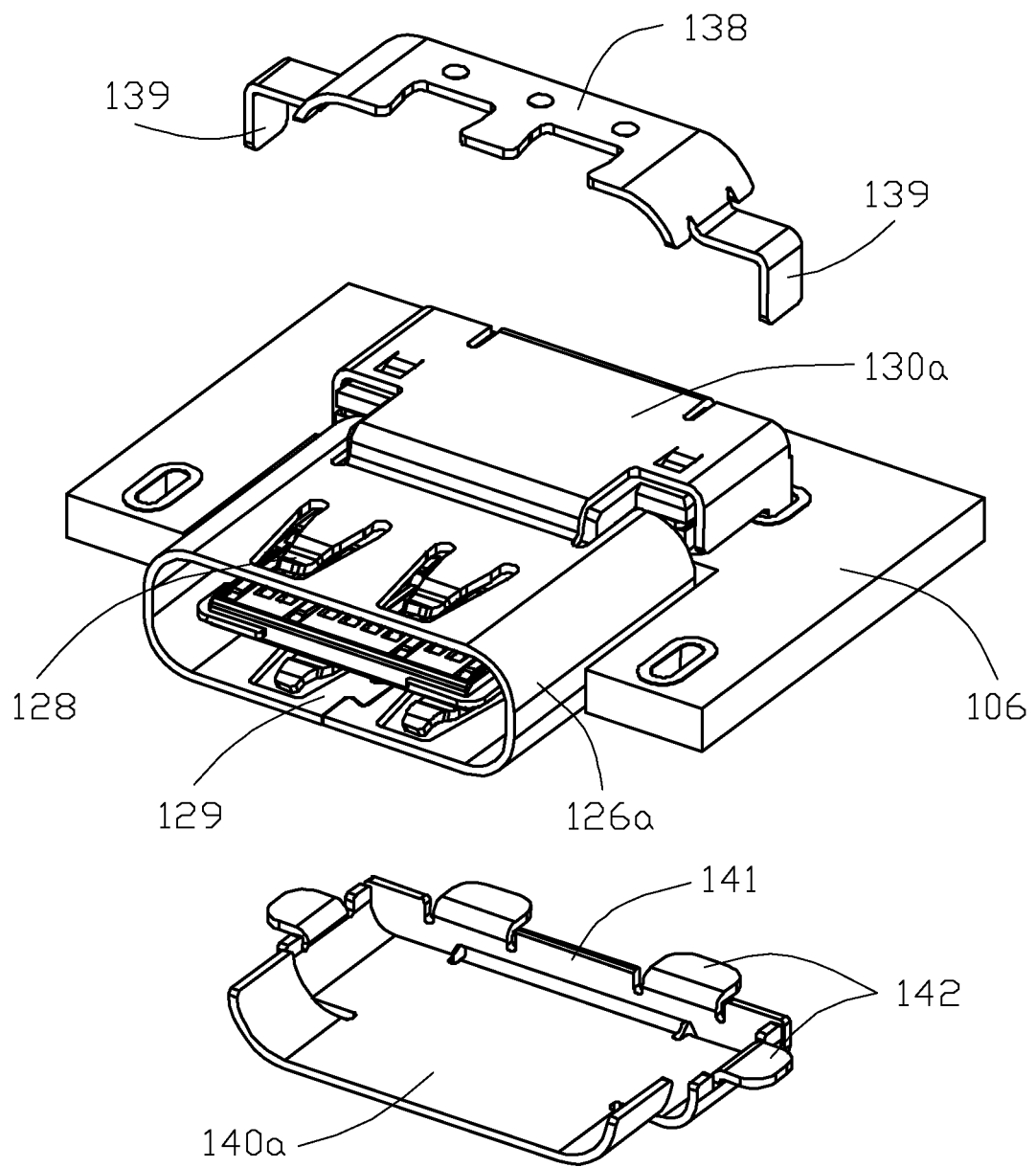
FIG. 16(A) is a front exploded perspective view of the receptacle connector on the printed circuit board of FIG. 15(A).
Figure 16B:
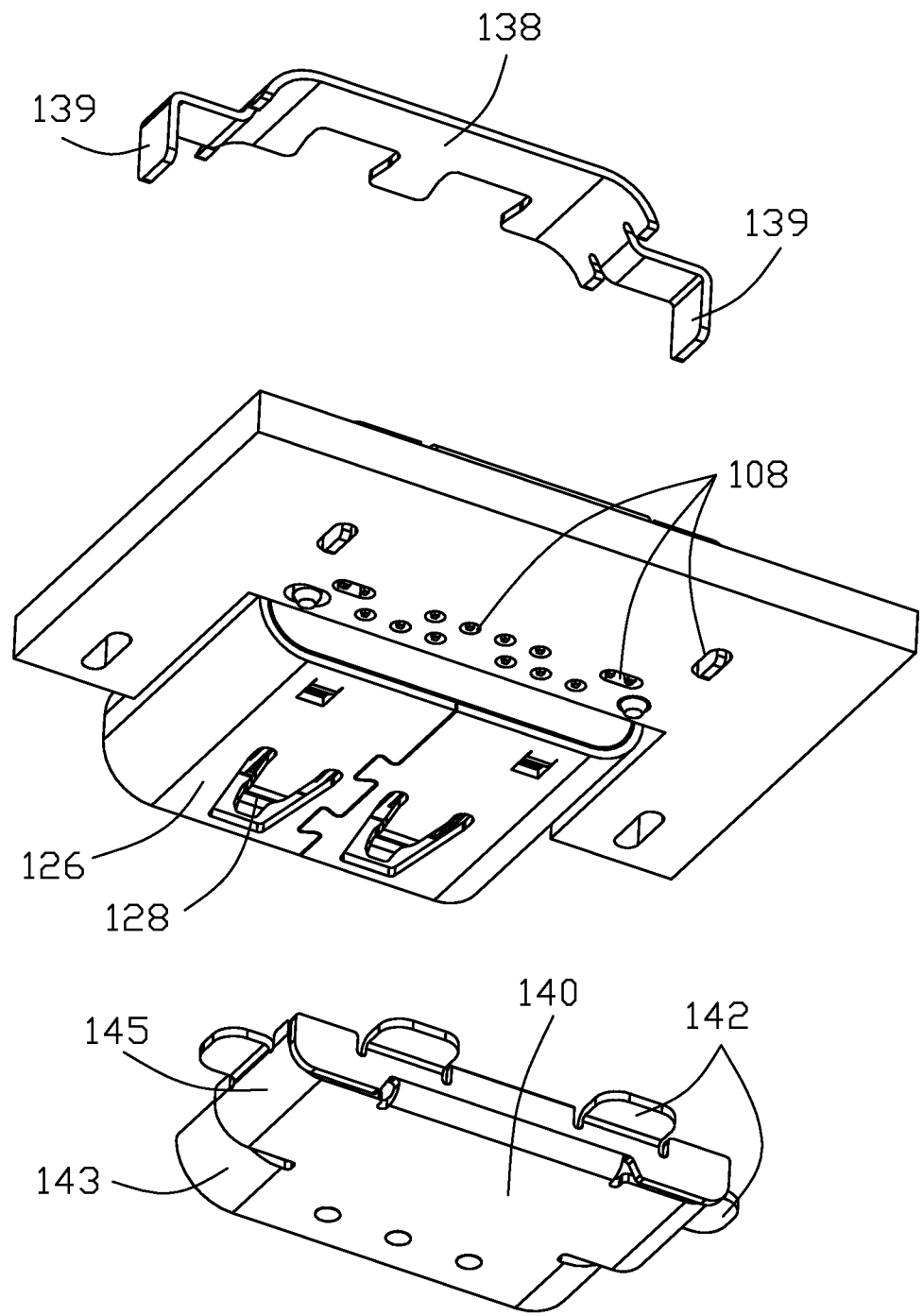
FIG. 16(B) is a rear exploded perspective view of the receptacle connector on the printed circuit board of FIG. 15(B).
Figure 17A:
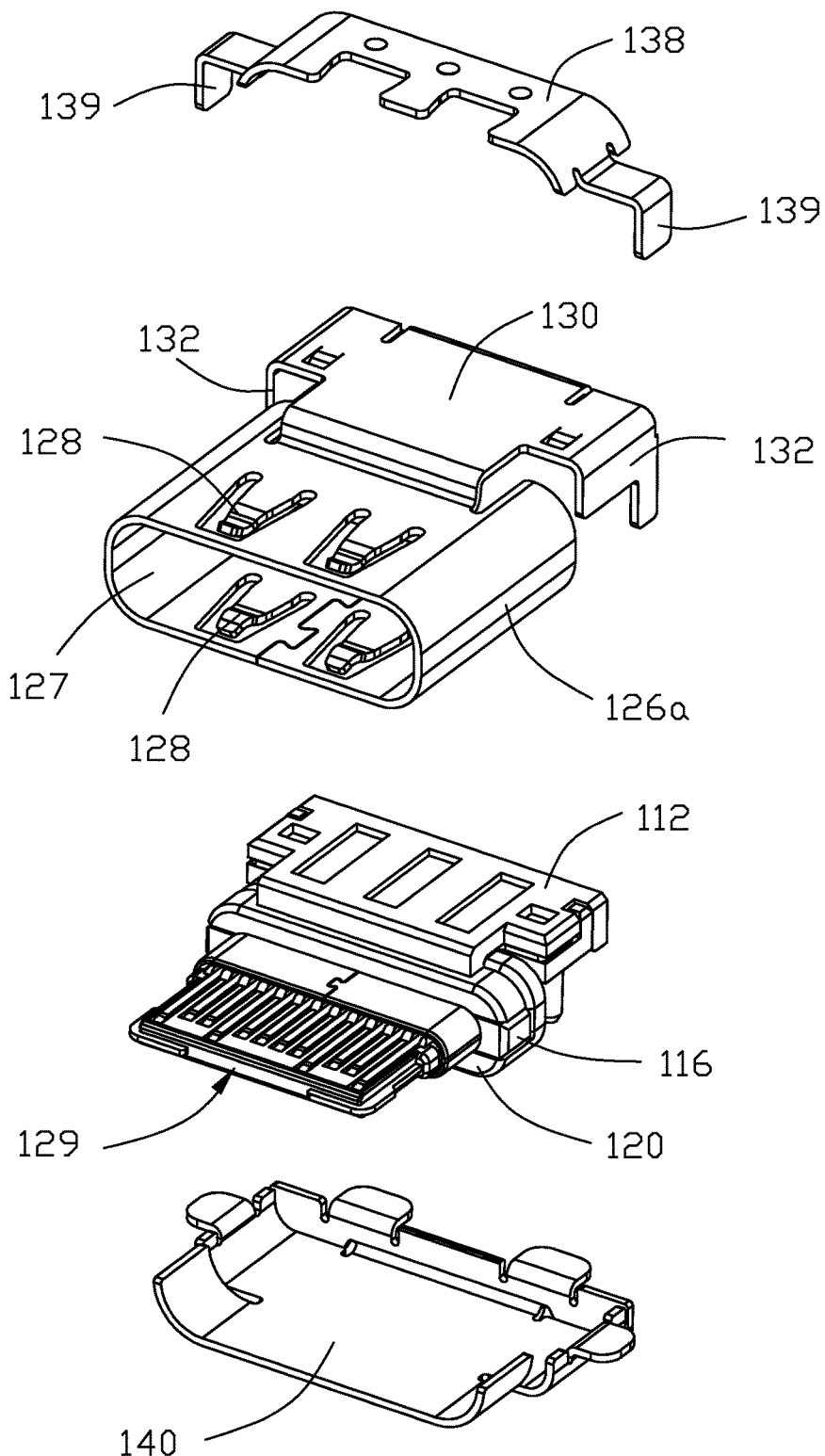
FIG. 17(A) is a further front exploded perspective view of the receptacle connector of FIG. 16(A).
Figure 17B:
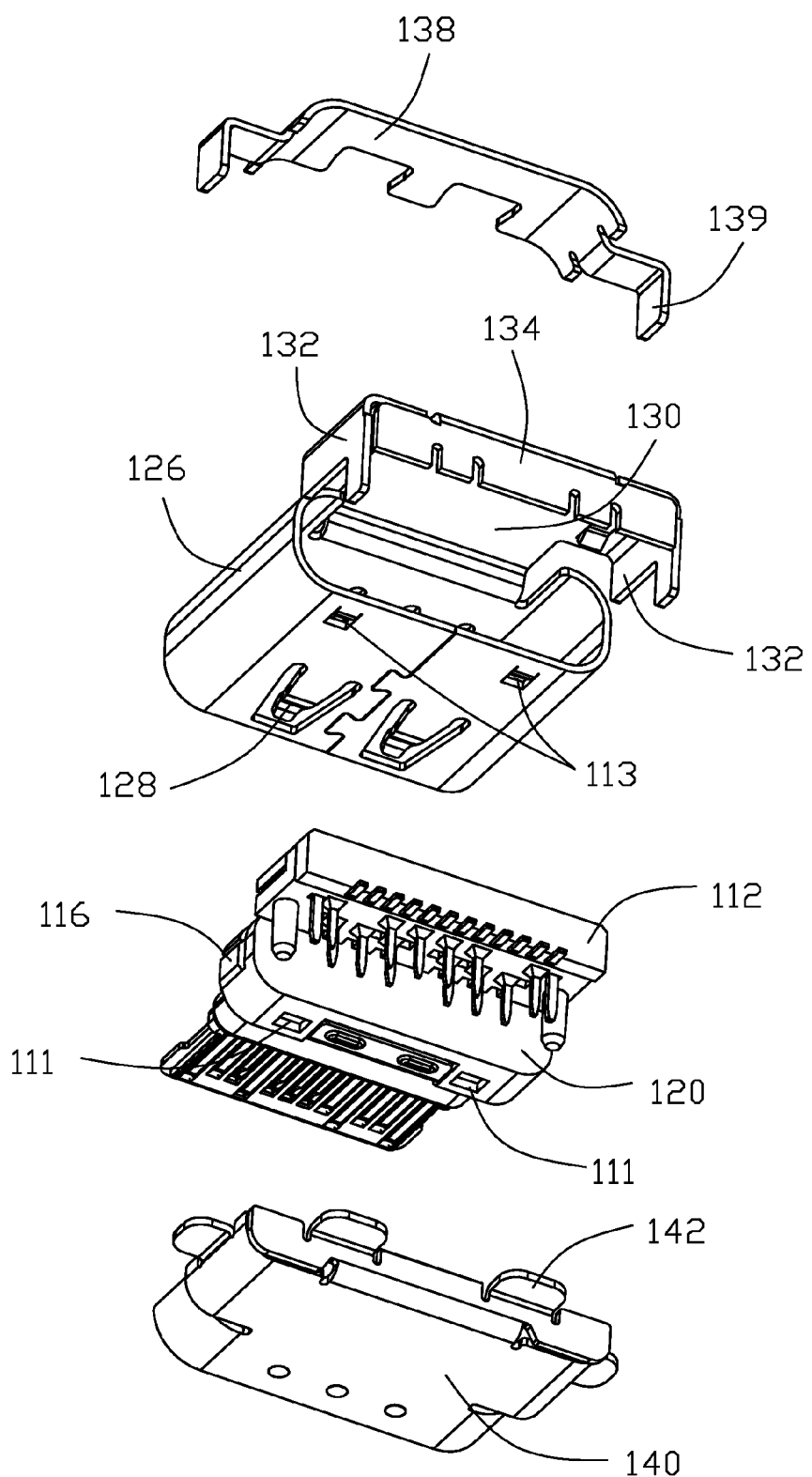
FIG. 17(B) is a further rear exploded perspective view of the receptacle connector of FIG. 16(B).
Figure 18:
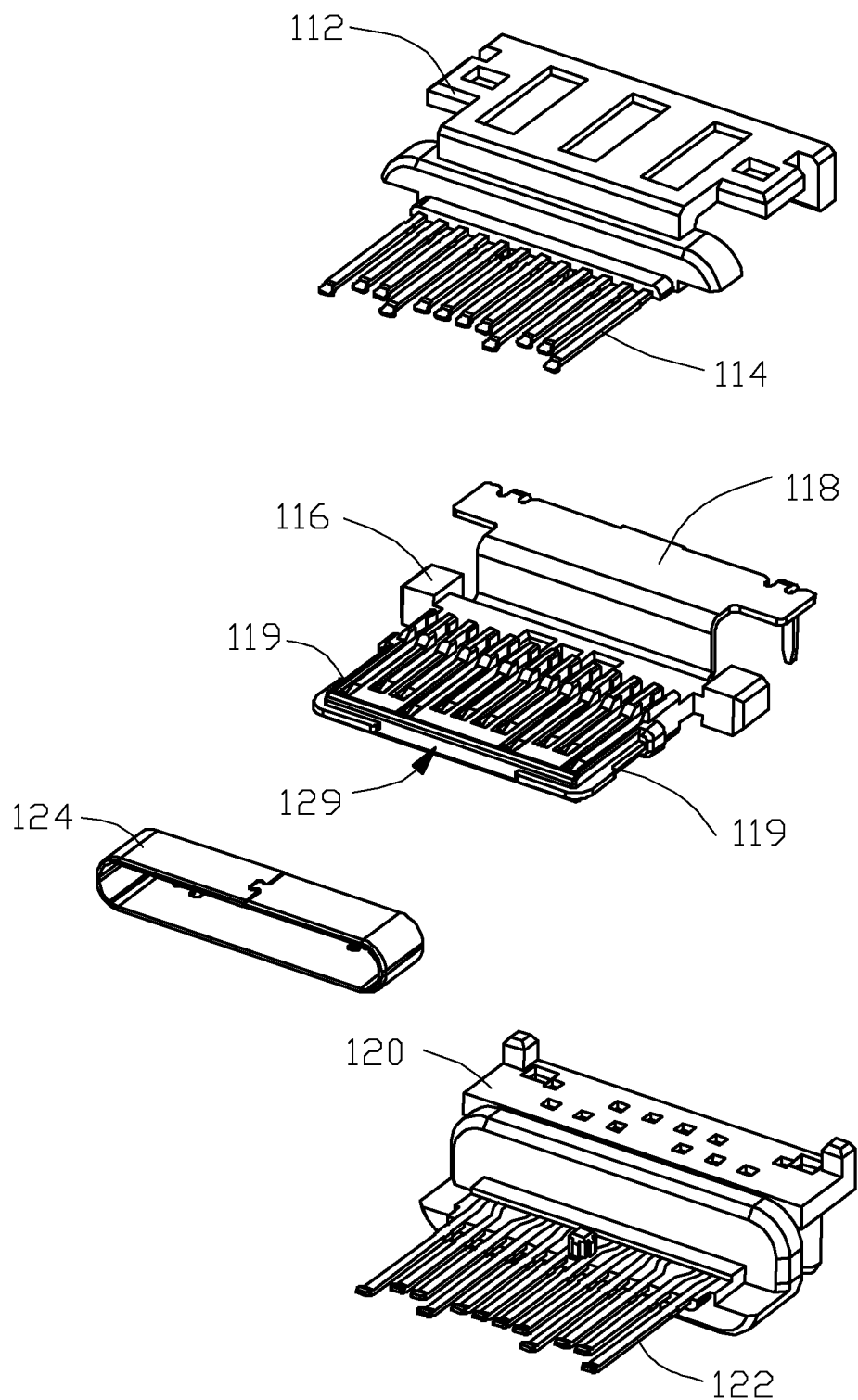
FIG. 18 is a further front exploded perspective view of the receptacle connector of FIG. 17(A).
Figure 19:
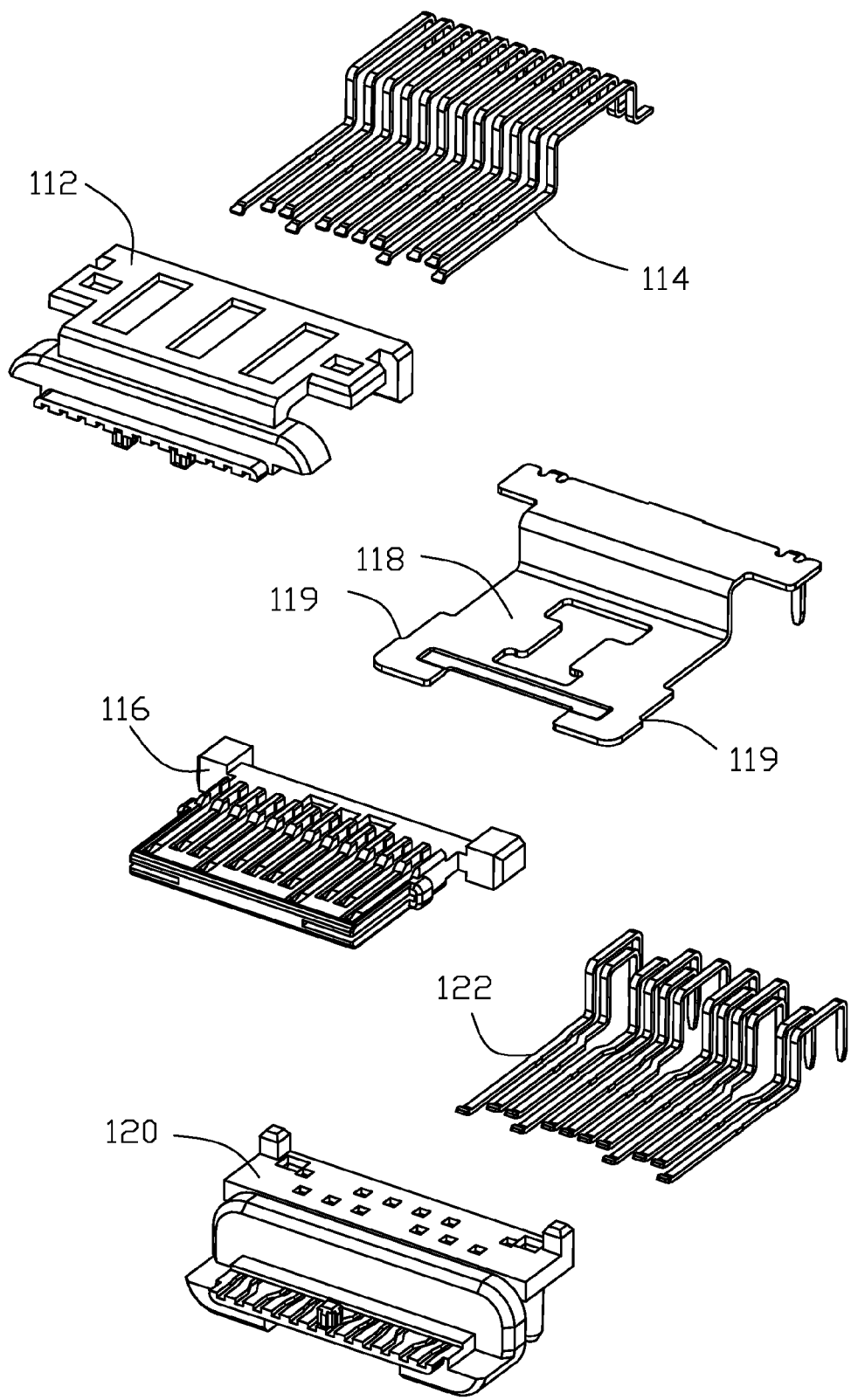
FIG. 19 is a further front exploded perspective view of the receptacle connector of FIG. 18.
Figure 20:
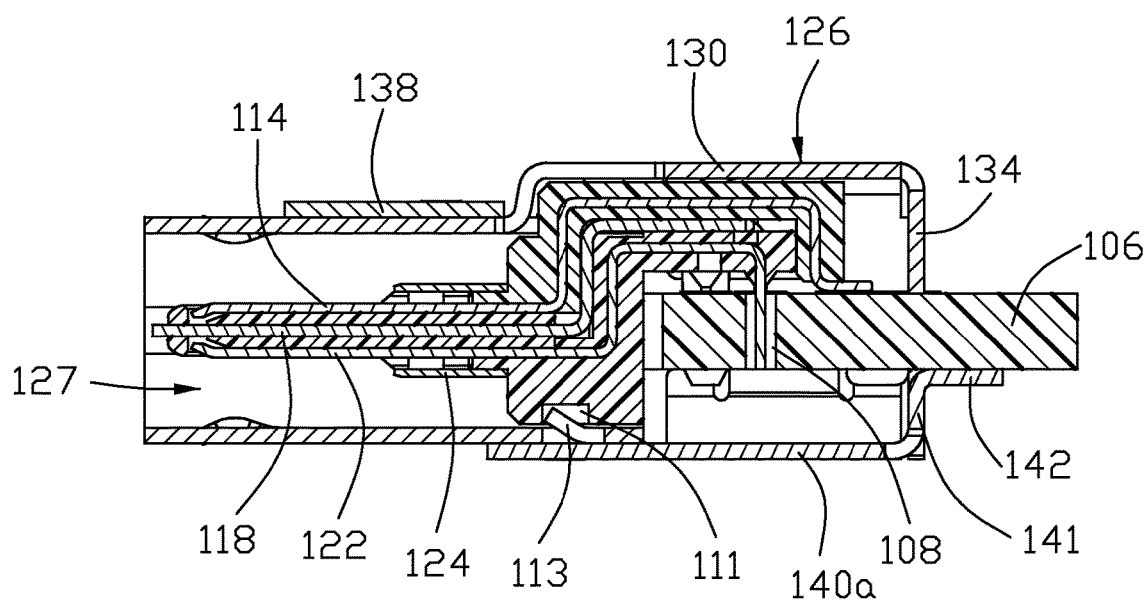
FIG. 20 is a cross-sectional view of the receptacle connector mounted upon the printed circuit board of FIG. 15(A).
Figure 21A:
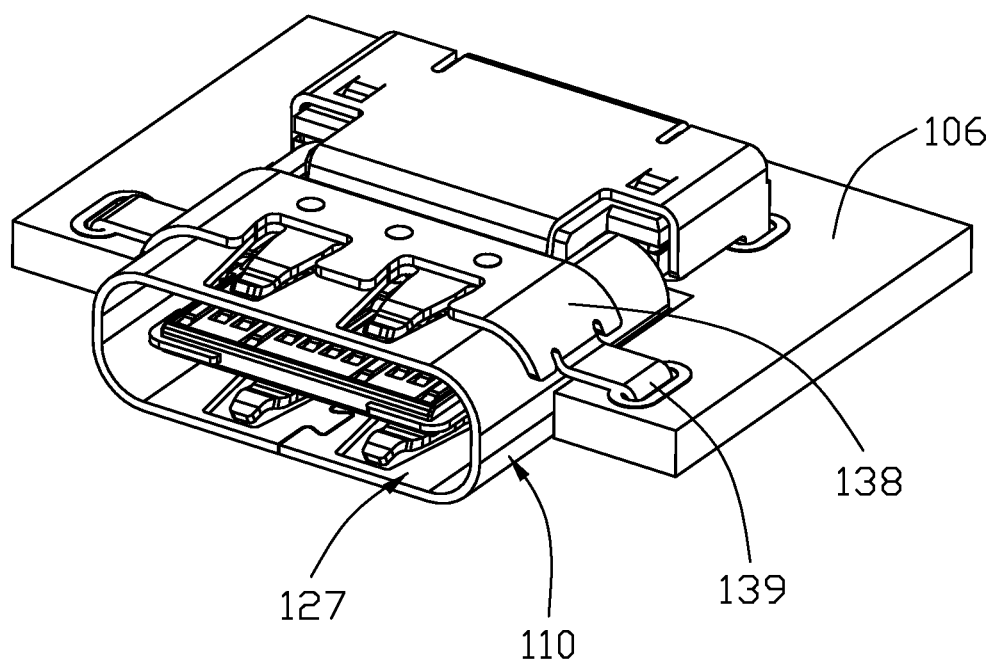
FIG. 21(A) is a front assembled perspective view of a third embodiment of the receptacle connector mounted upon the printed circuit board.
Figure 21B:
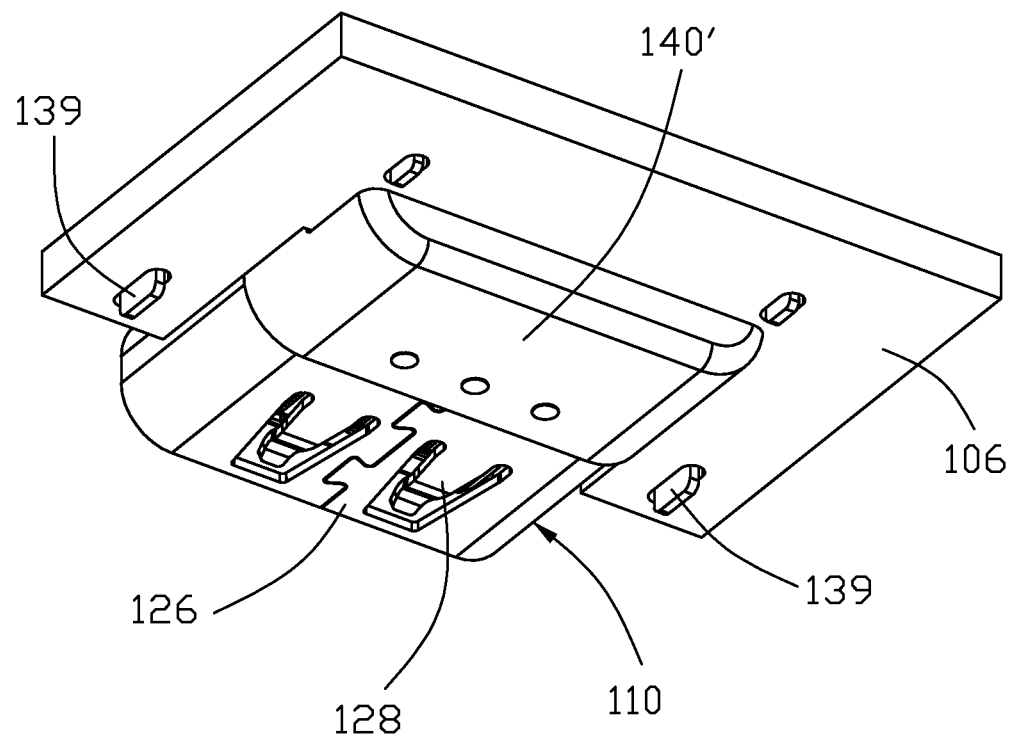
FIG. 21(B) is a rear assembled perspective view of the receptacle connector mounted upon the printed circuit board of FIG. 21(A).
Figure 22A:
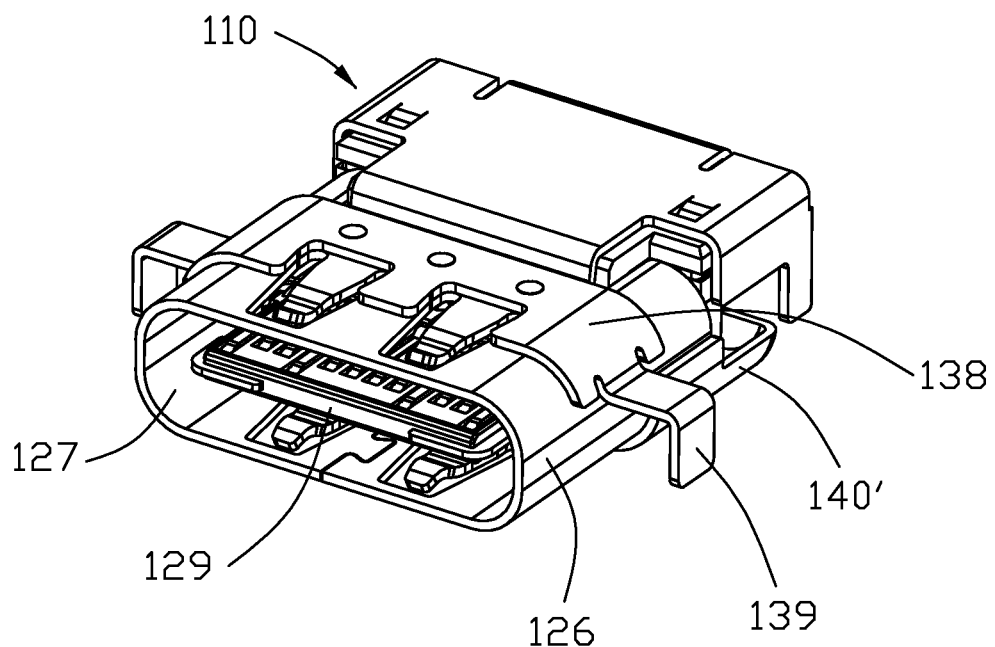
FIG. 22(A) is a front exploded perspective view of the receptacle connector mounted upon the printed circuit board of FIG. 21(A).
Figure 22A:
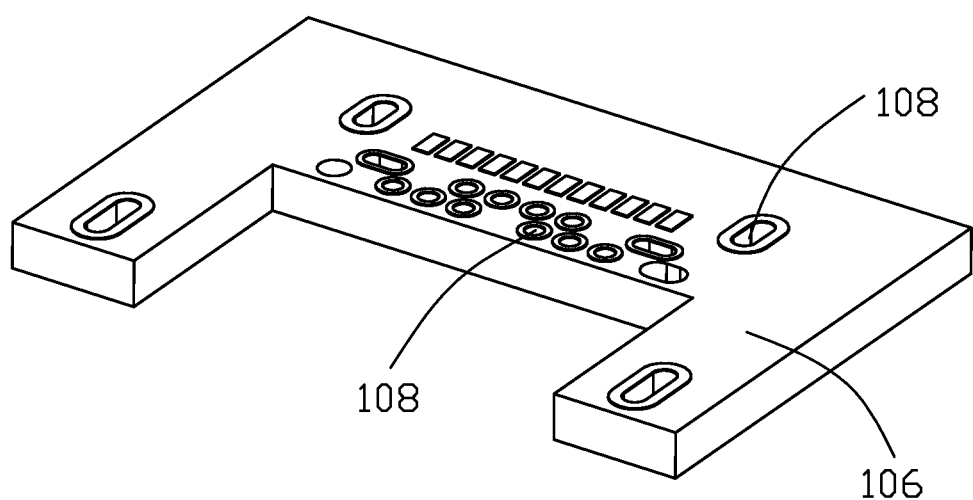
Figure 22B:
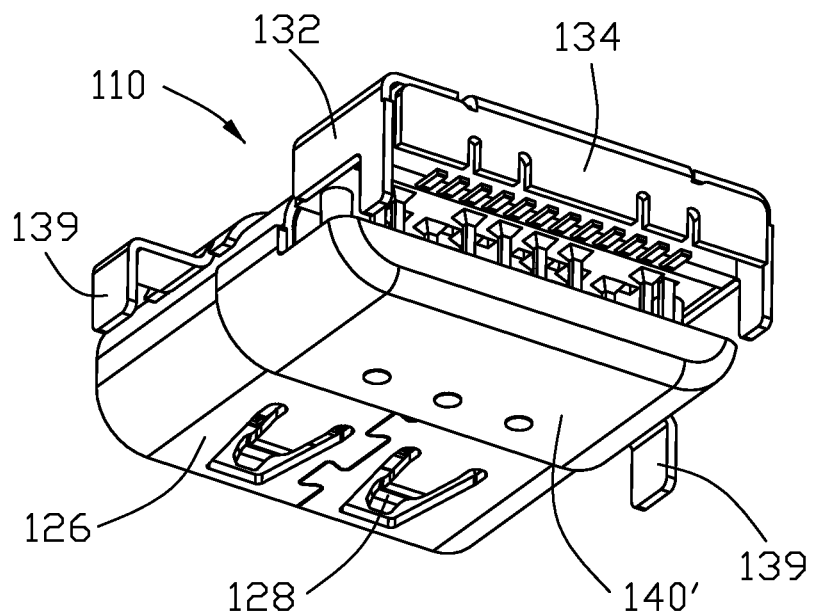
FIG. 22(B) is a rear exploded perspective view of the receptacle connector mounted upon the printed circuit board of FIG. 21(B).
Figure 22B:
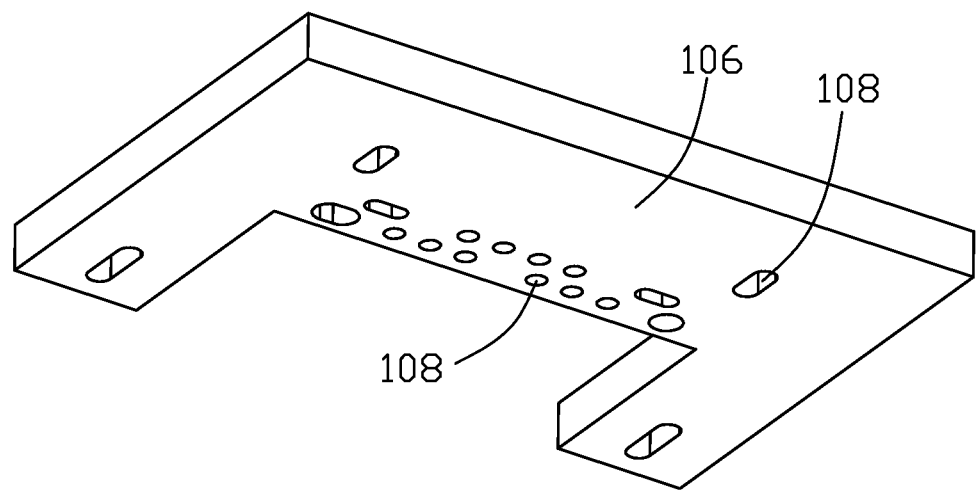
Figure 23A:
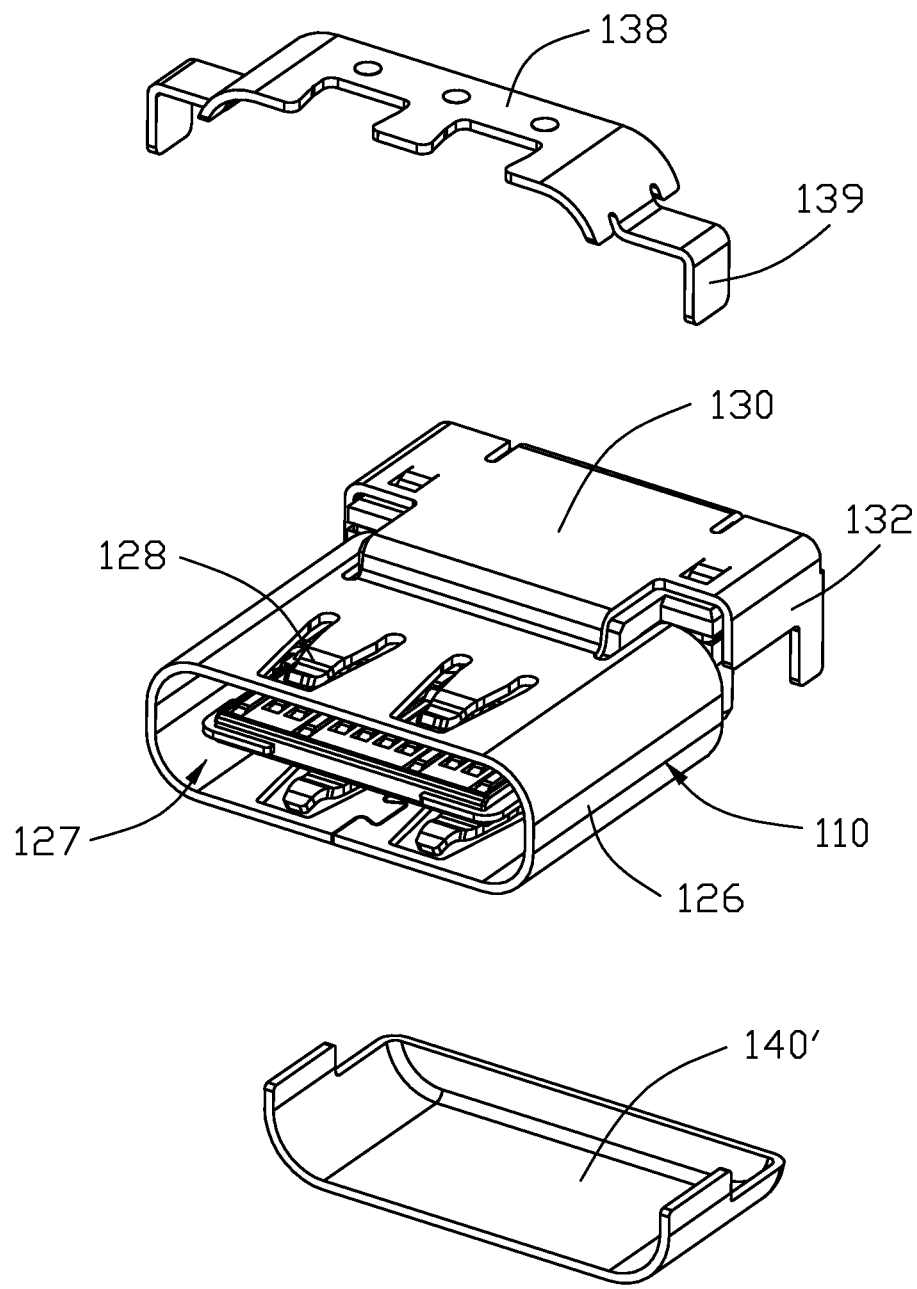
FIG. 23(A) is a further front exploded perspective view of the receptacle connector of FIG. 21(A).
Figure 23B:
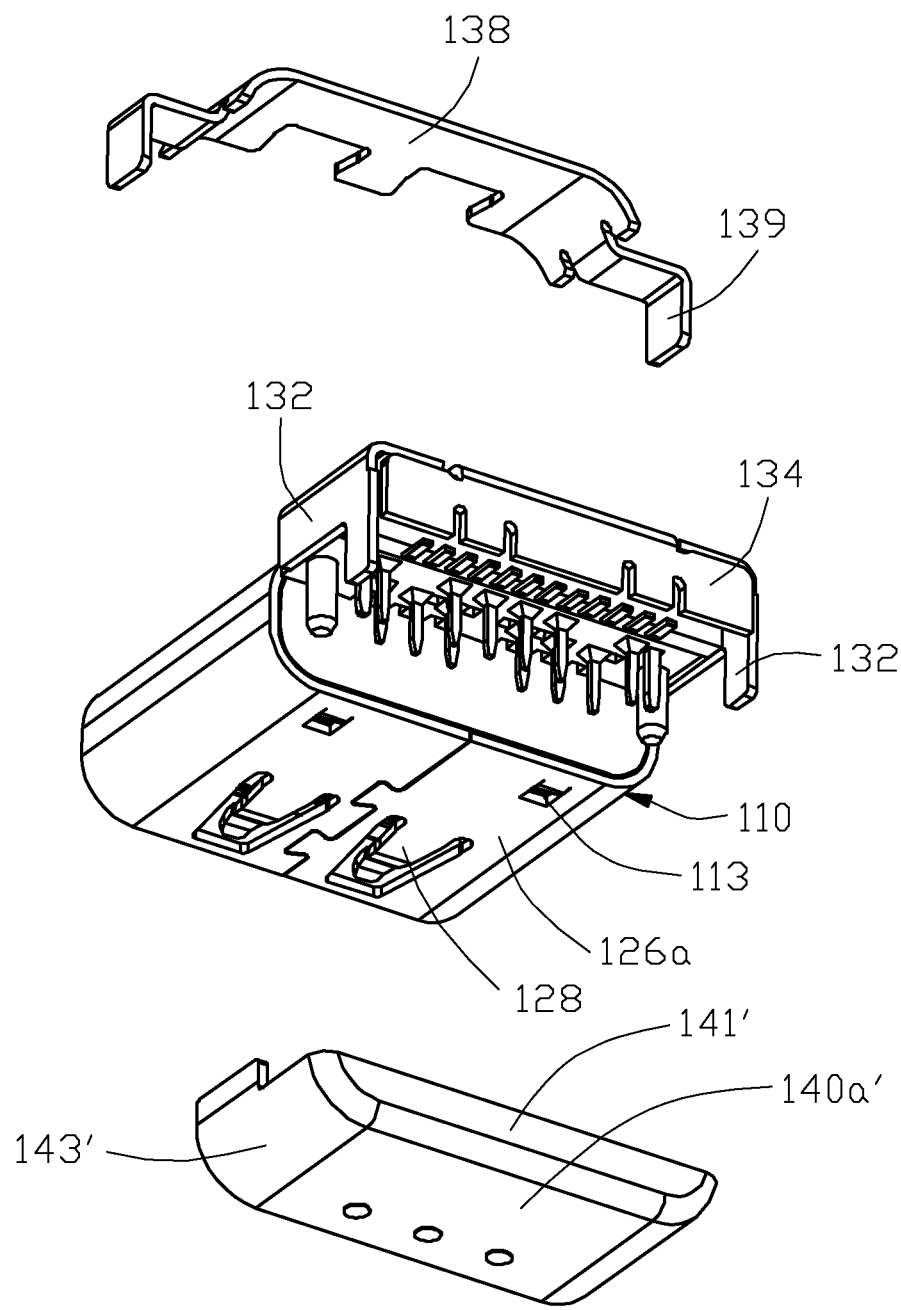
FIG. 23(B) is a further rear exploded perspective view of the receptacle connector of FIG. 21(B).
Figure 24:
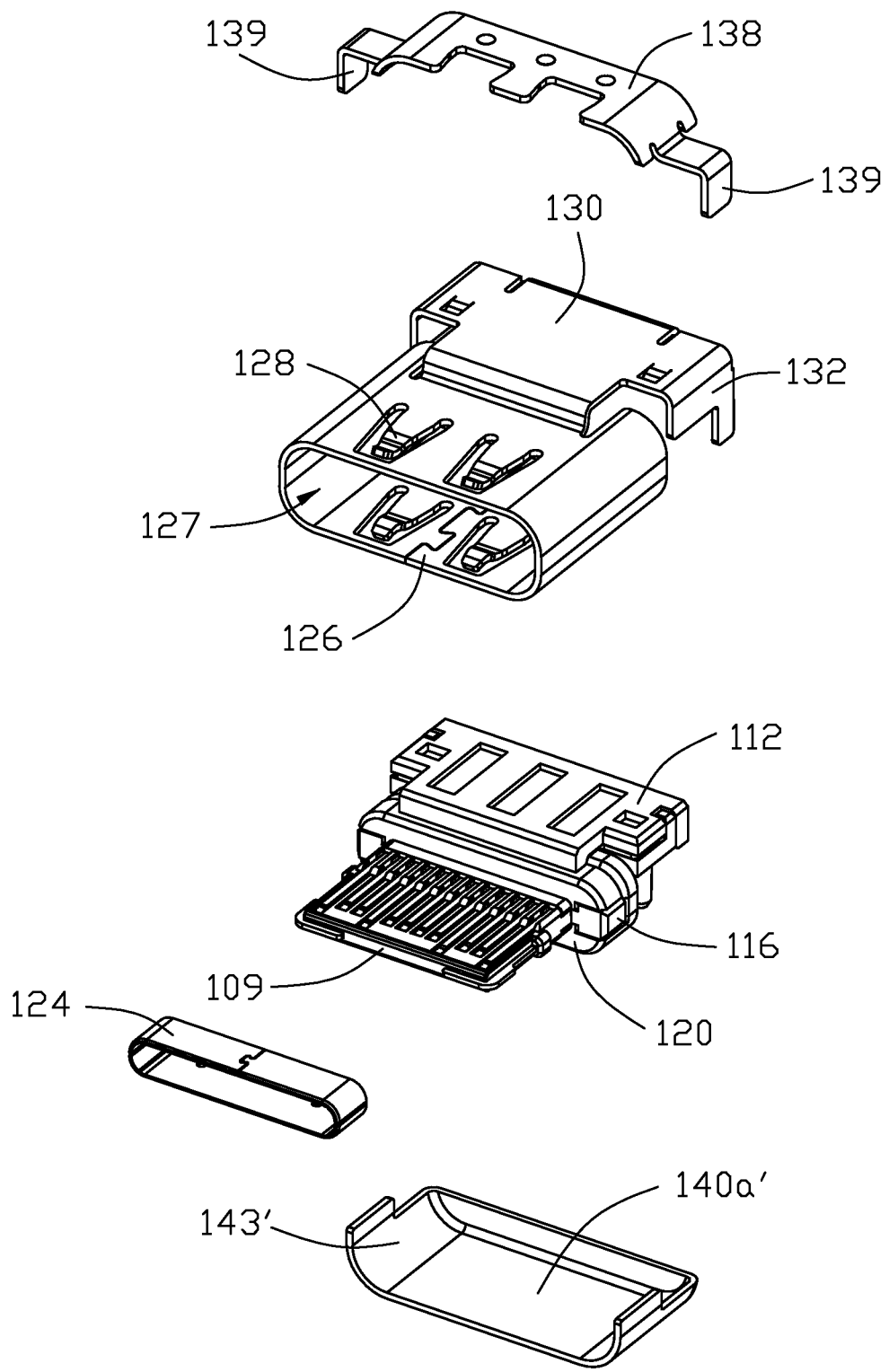
FIG. 24 is a further front exploded perspective view of the receptacle connector of FIG. 23(A)
Figure 25:
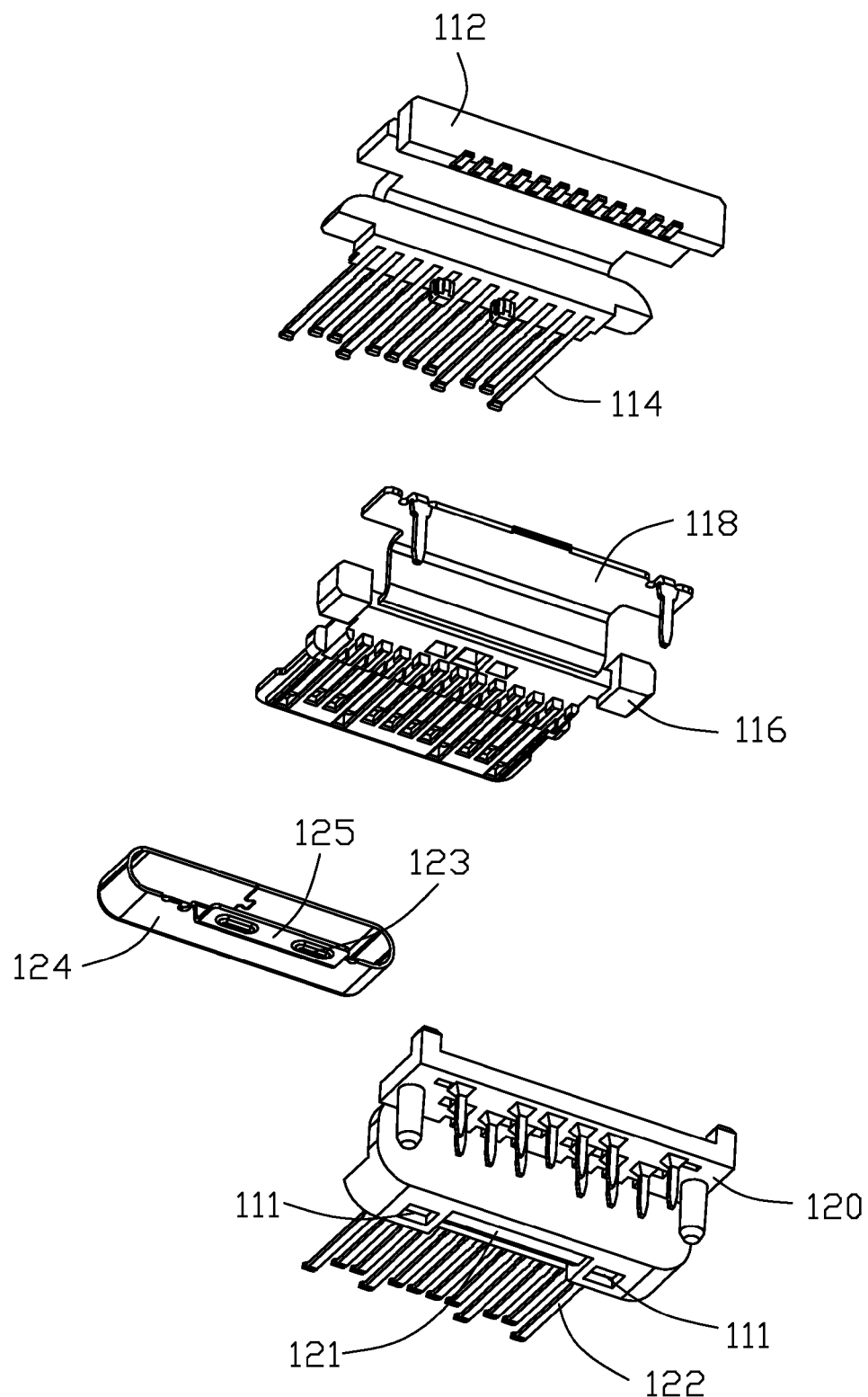
FIG. 25 is further rear exploded perspective view of the receptacle connector of FIG. 24.
Figure 26:
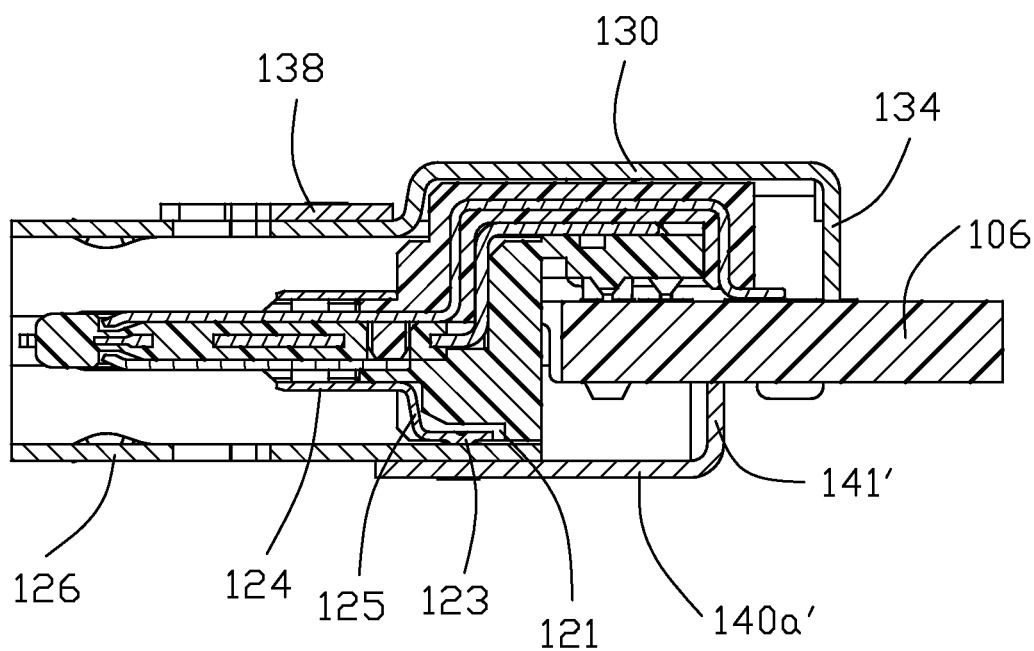
FIG. 26 is a cross-sectional view of the receptacle connector mounted upon the printed circuit board of FIG. 21(A).
Figure 27A:
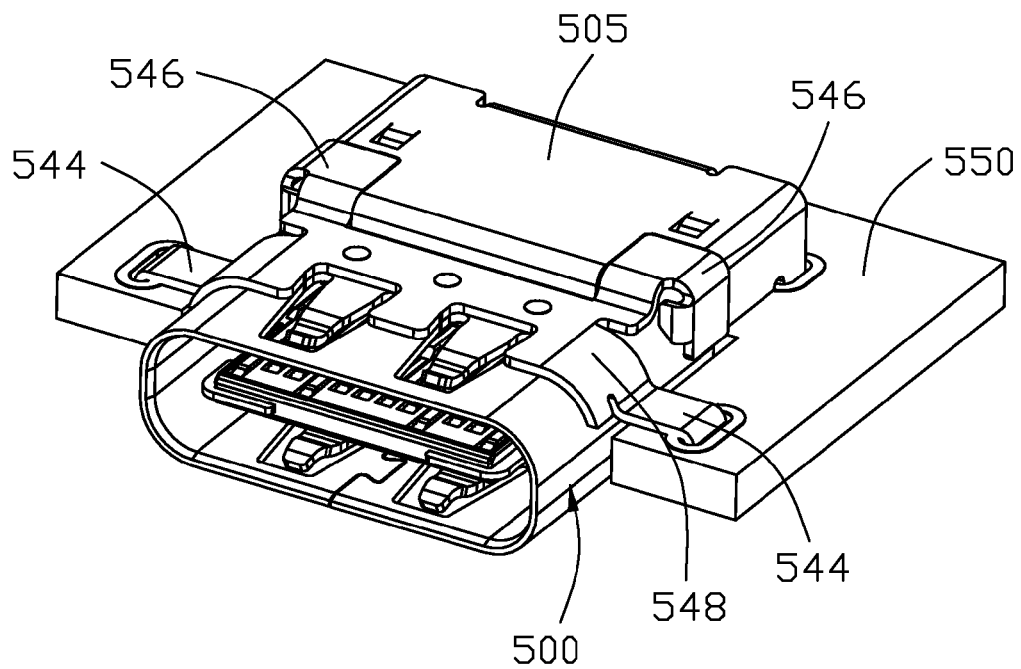
FIG. 27(A) is a front assembled perspective view of a fourth embodiment of the receptacle connector mounted upon the printed circuit board.
Figure 27B:
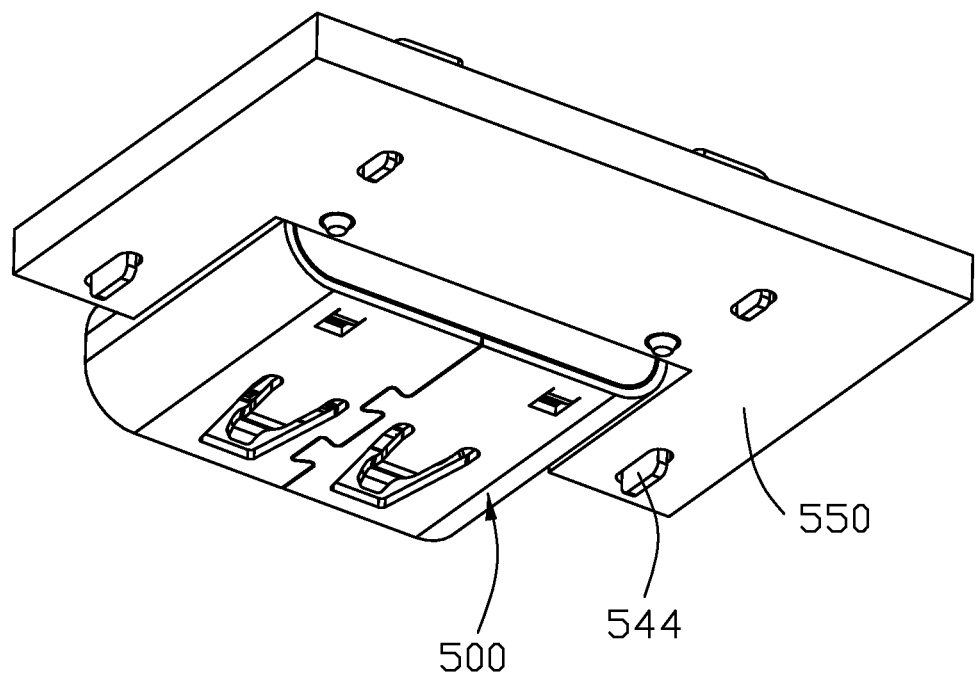
FIG. 27(B) is a rear assembled perspective view of the receptacle connector 27(A) mounted upon the printed circuit board.
Figure 28A:
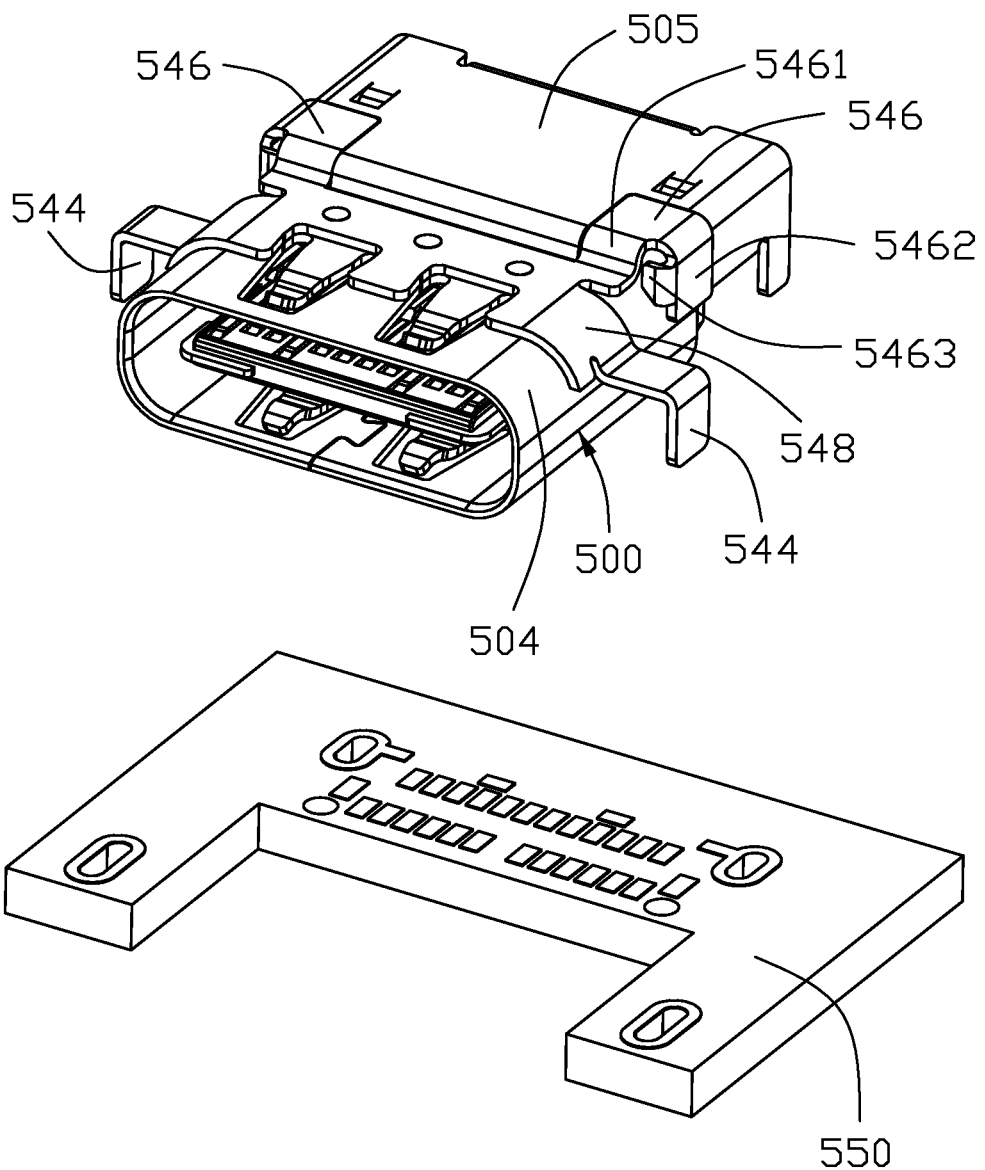
FIG. 28(A) is a front perspective view of the receptacle connector of FIG. 27(A) moved away from the printed circuit board.
Figure 28B:
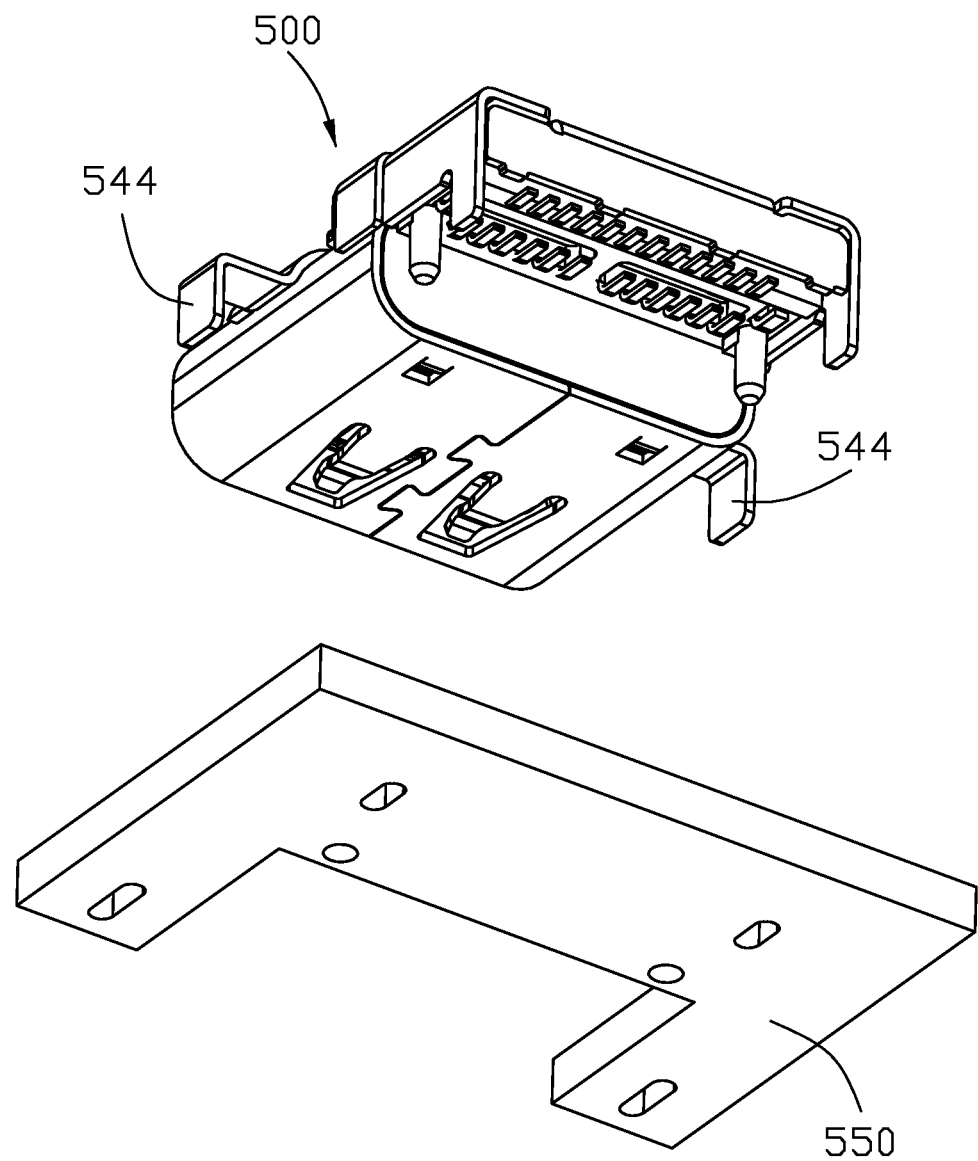
FIG. 28(B) is a rear perspective view of the receptacle connector of FIG. 27(B) moved away from the printed circuit board.
Figure 29:
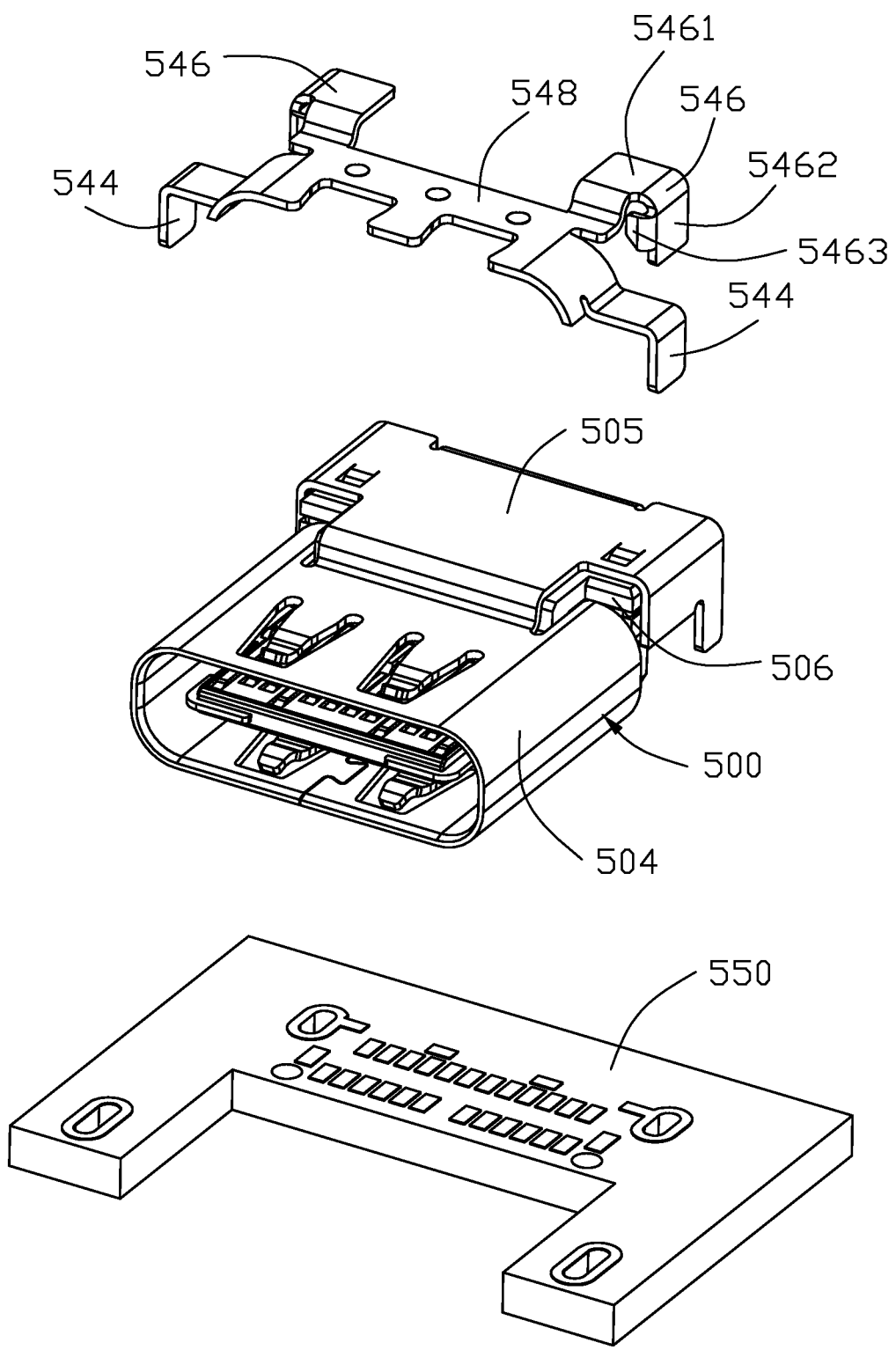
FIG. 29 is a front perspective view of the receptacle connector of FIG. 28(A) moved away from the printed circuit board without the bracket attached thereto.
Figure 30A:
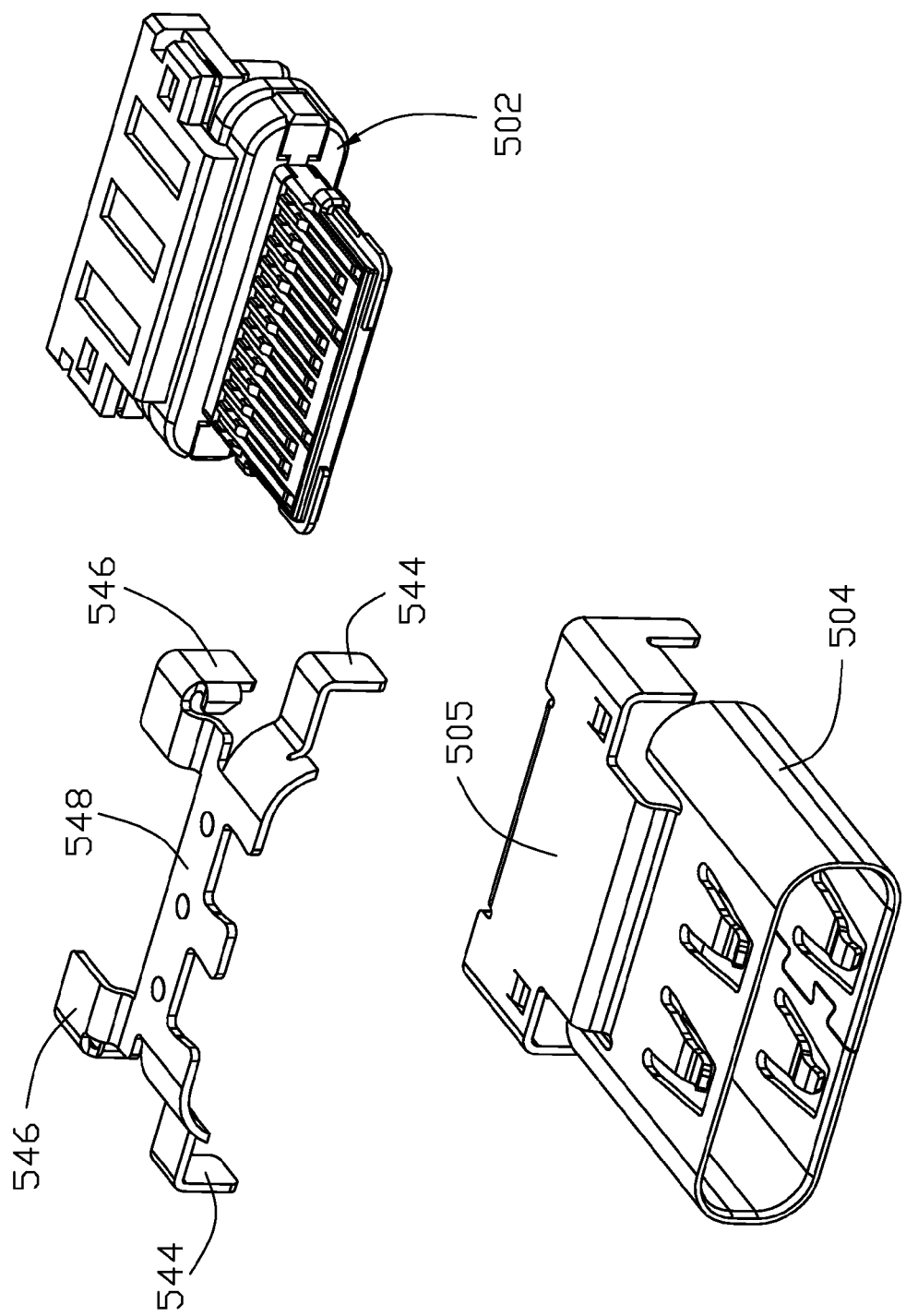
FIG. 30(A) is a front exploded perspective view of the receptacle connector of FIG. 29.
Figure 30B:
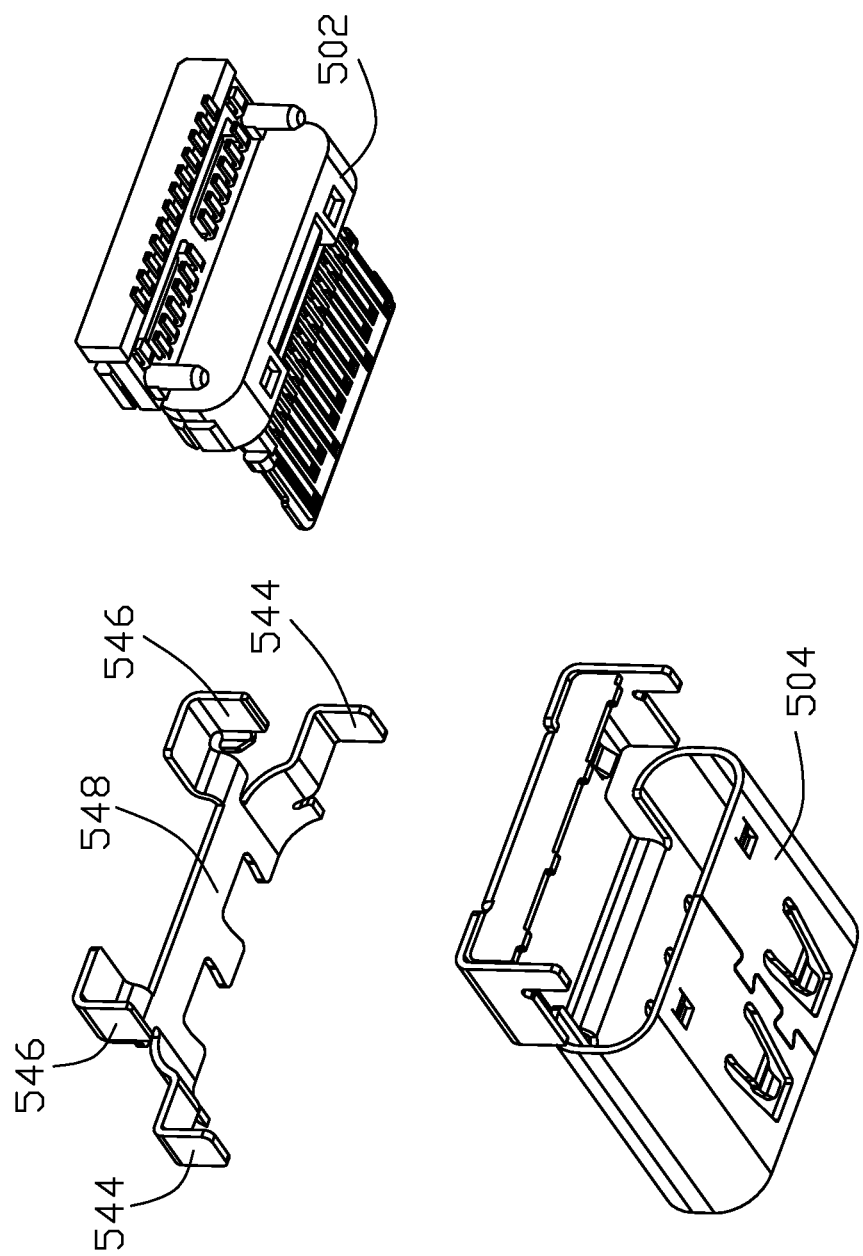
FIG. 30(B) is a rear exploded perspective view of the receptacle connector of FIG. 28(B).
Figure 31A:
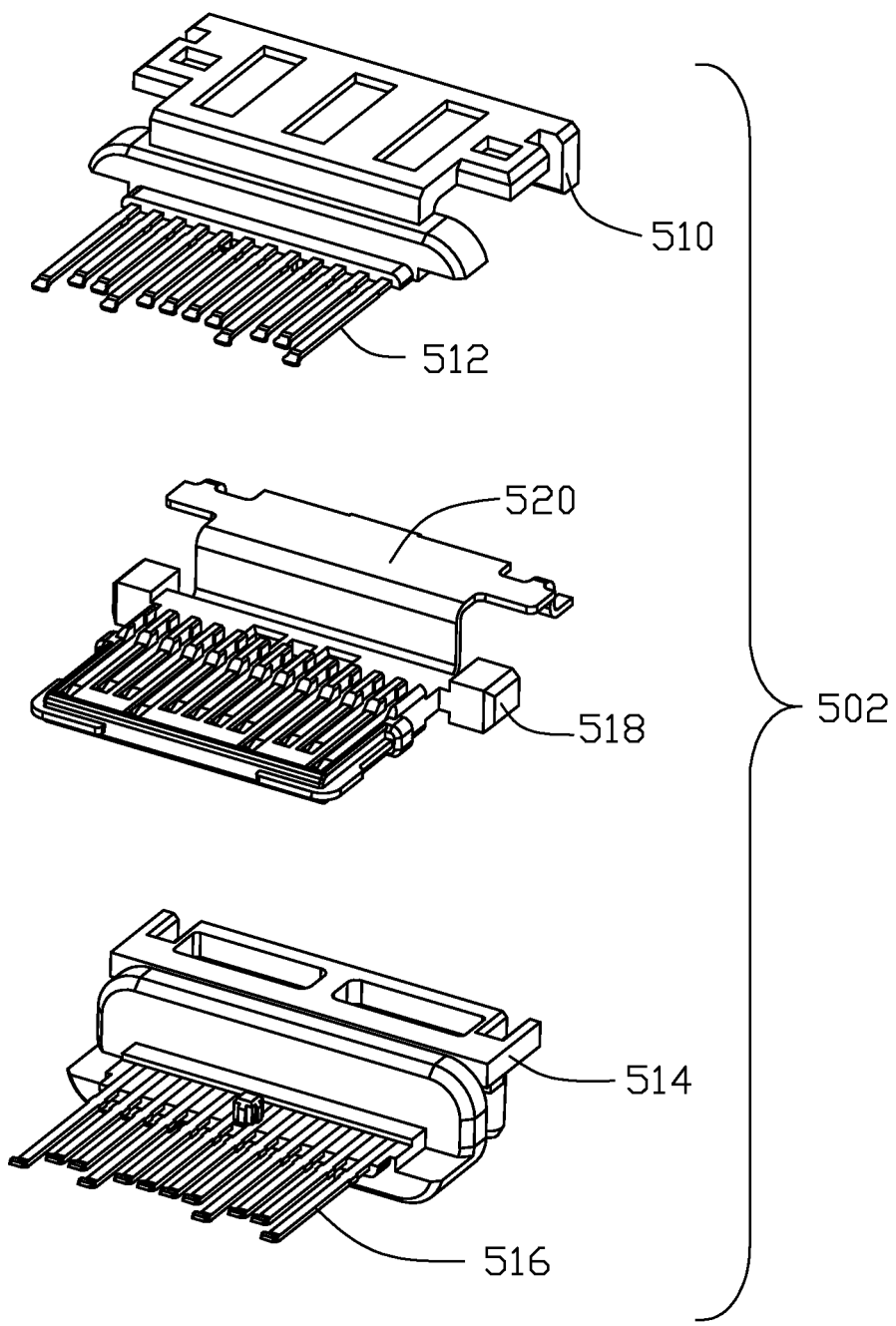
FIG. 31(A) is a front partially exploded perspective view of the receptacle connector of FIG. 30(A)
Figure 31B:
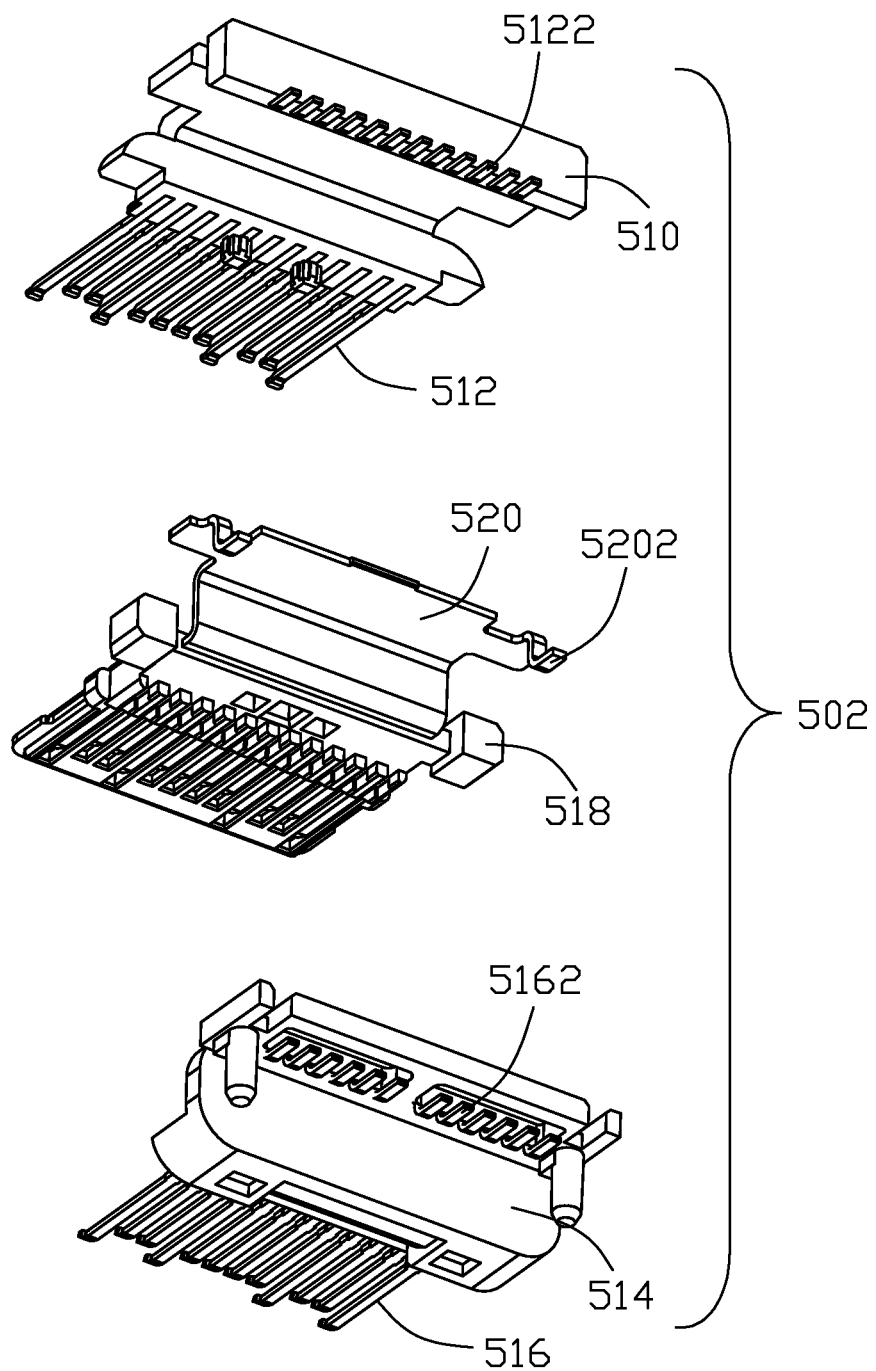
FIG. 31(B) is a rear partially exploded perspective view of the receptacle connector of FIG. 30(B).
Figure 32A:
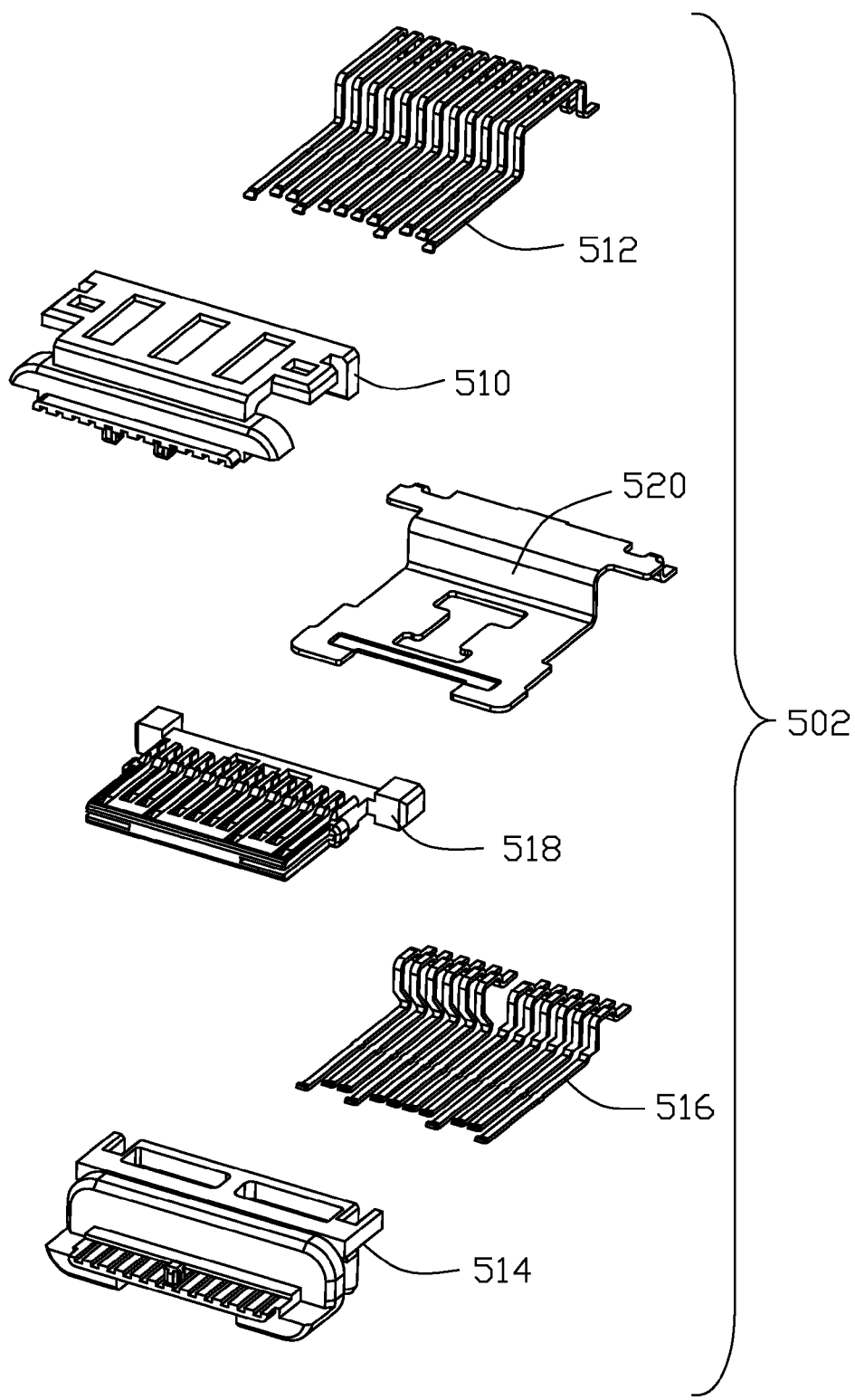
FIG. 32 (A) is a front partially exploded perspective view of the receptacle connector of FIG. 31(A)
FIG. 32(B) is a rear partially exploded perspective view of the receptacle connector of FIG. 31(A).
Figure 32B:
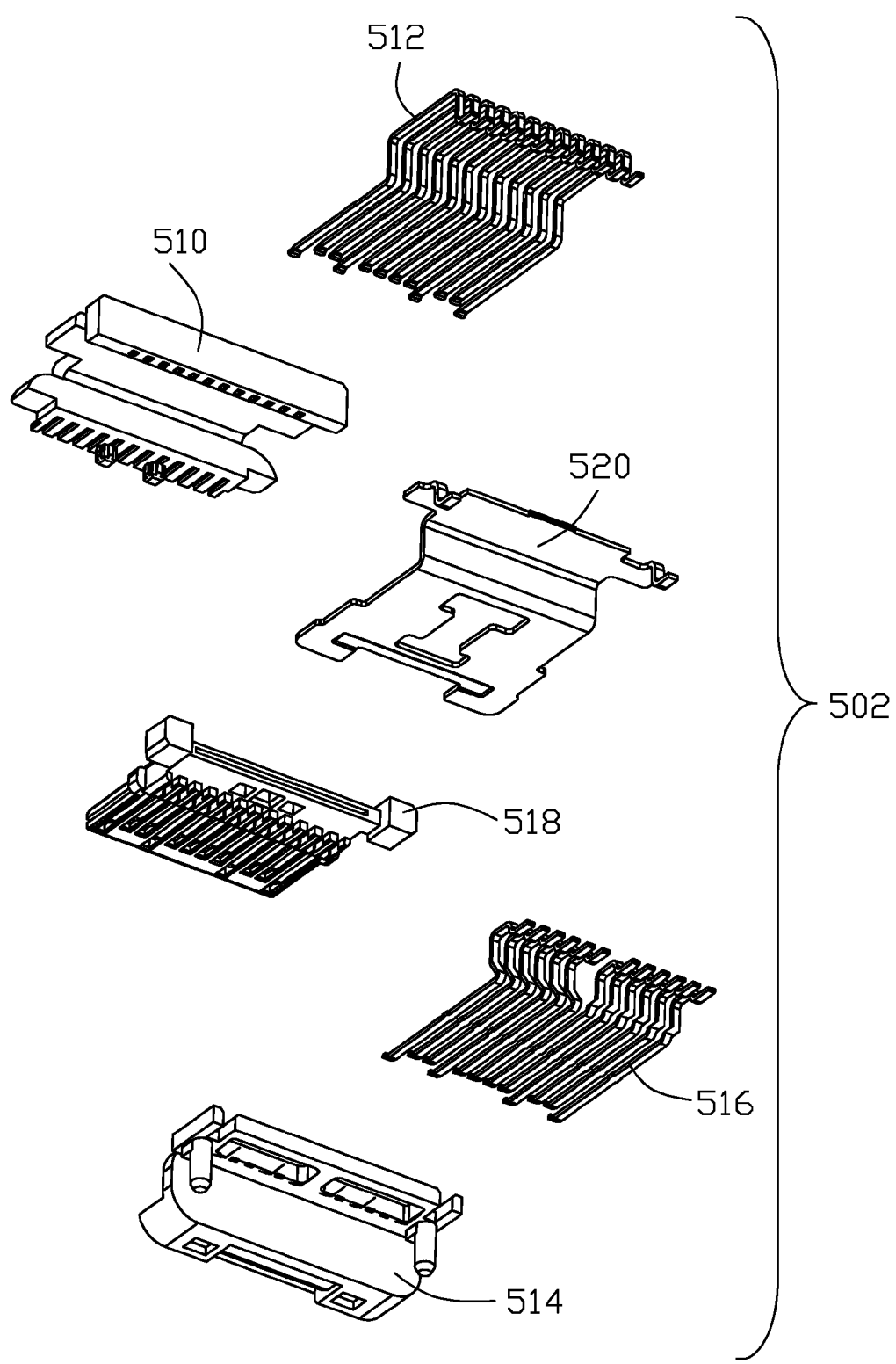
Figure 33:
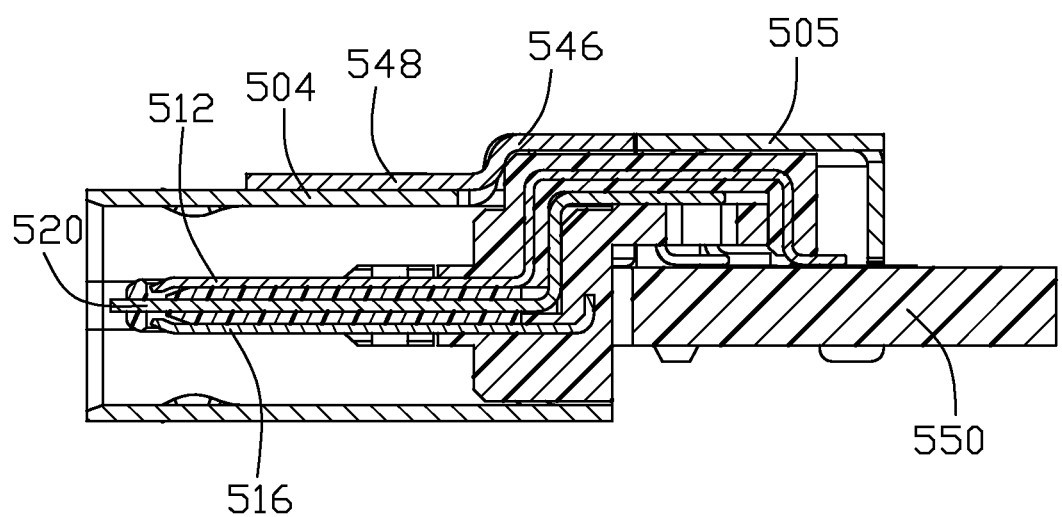
FIG. 33 is a cross-sectional view of the receptacle connector of FIG. 27(A) mounted upon the printed circuit board.
Figure 34A:
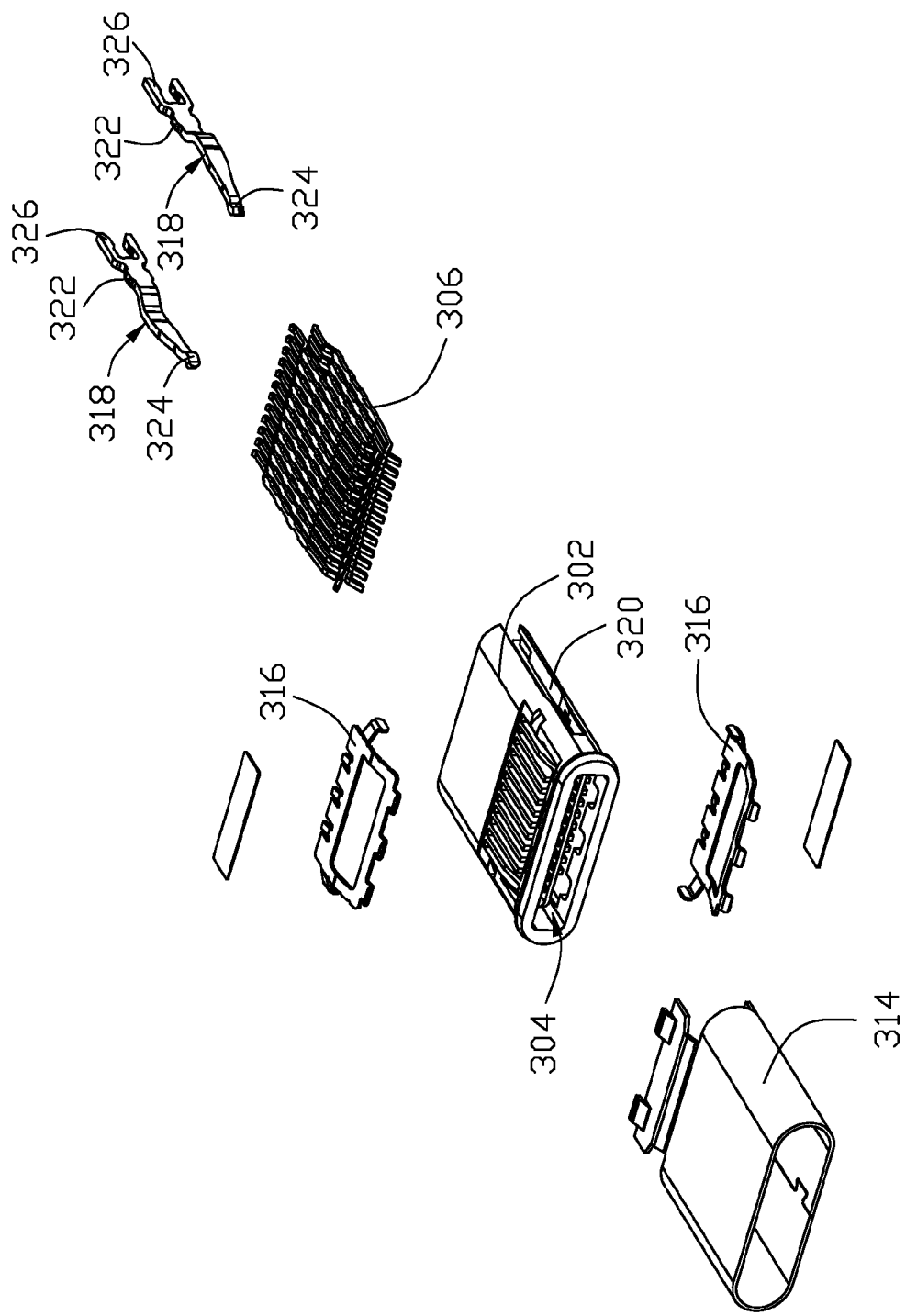
FIG. 34(A) is a front exploded perspective view of a fifth embodiment of the plug connector, similar to what is shown in FIG. 13(A).
Figure 34B:
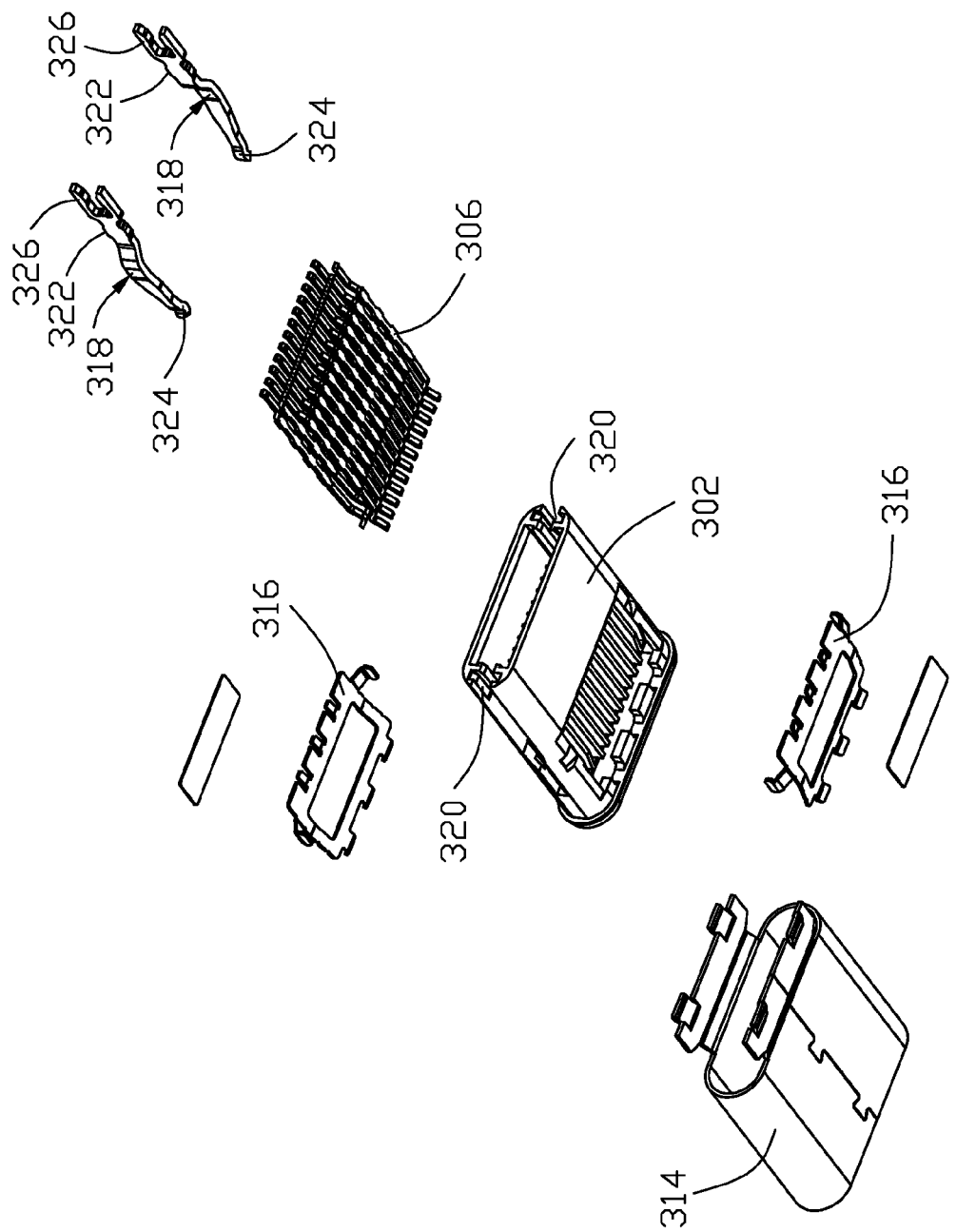
FIG. 34(B) is a rear exploded perspective view of the plug connector, of FIG. 34(B).
Figure 35A:
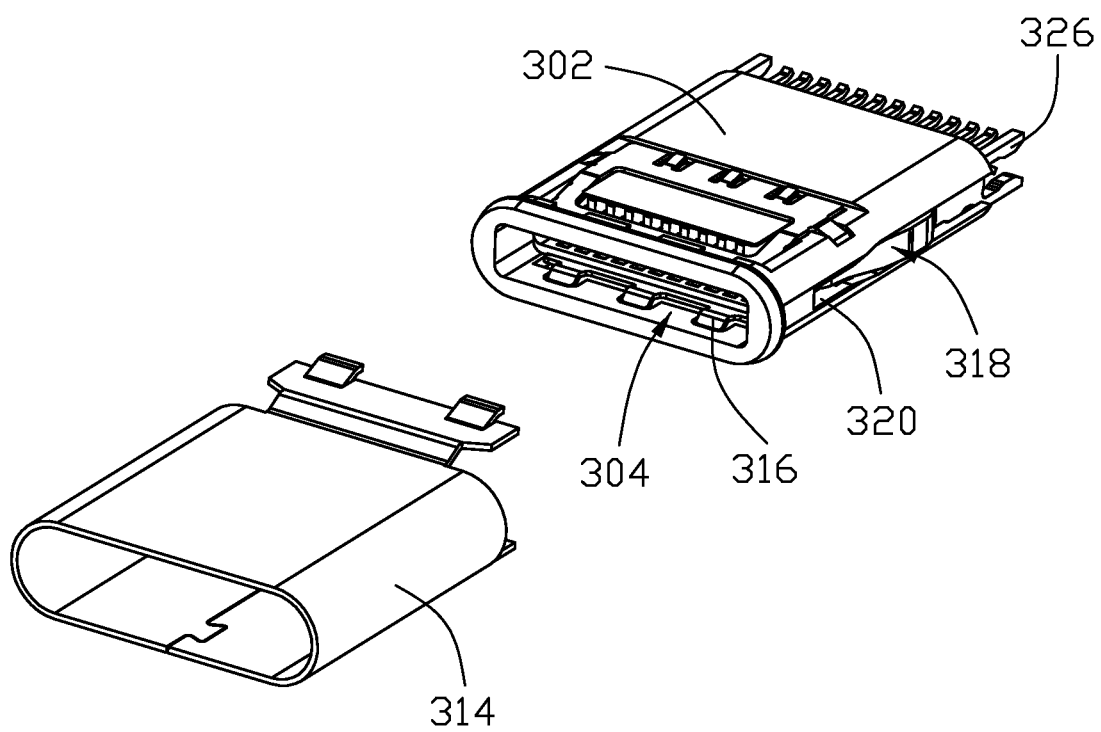
FIG. 35(A) is a front partially exploded perspective view of a plug connector of a fifth embodiment of this present invention similar to FIG. 34(A).
Figure 35B:
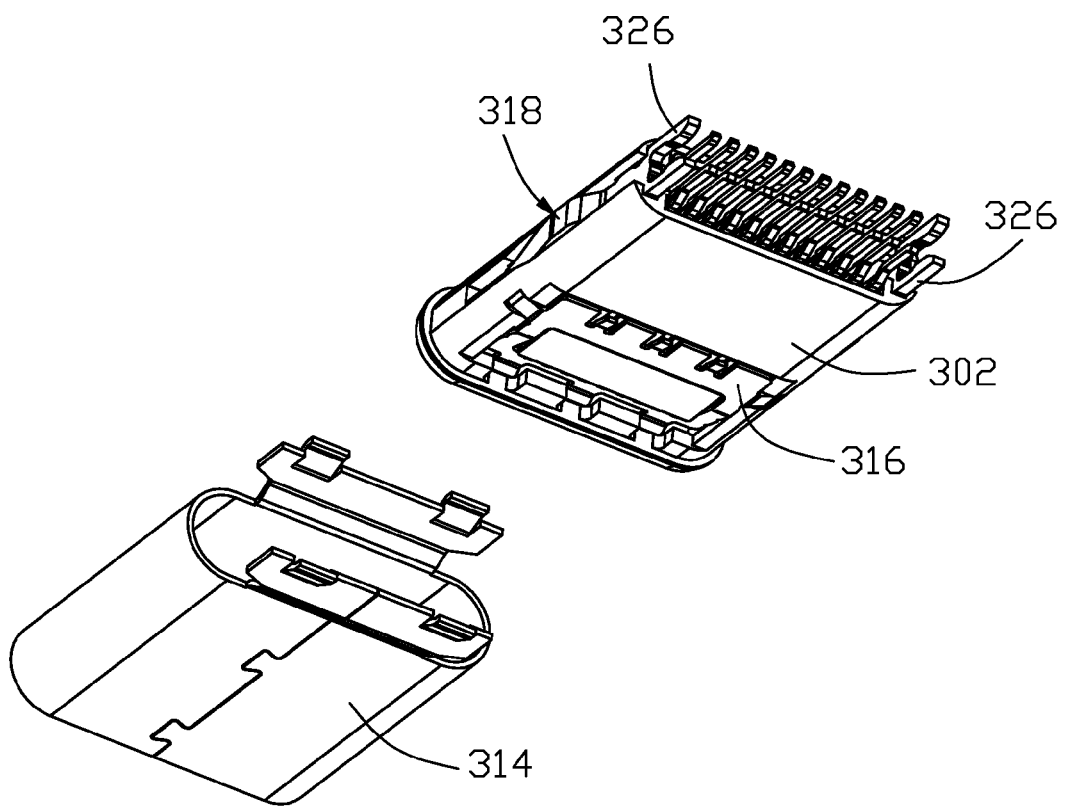
FIG. 35(B) is a rear partially exploded perspective view of the plug connector of FIG. 34(B).
Figure 36:
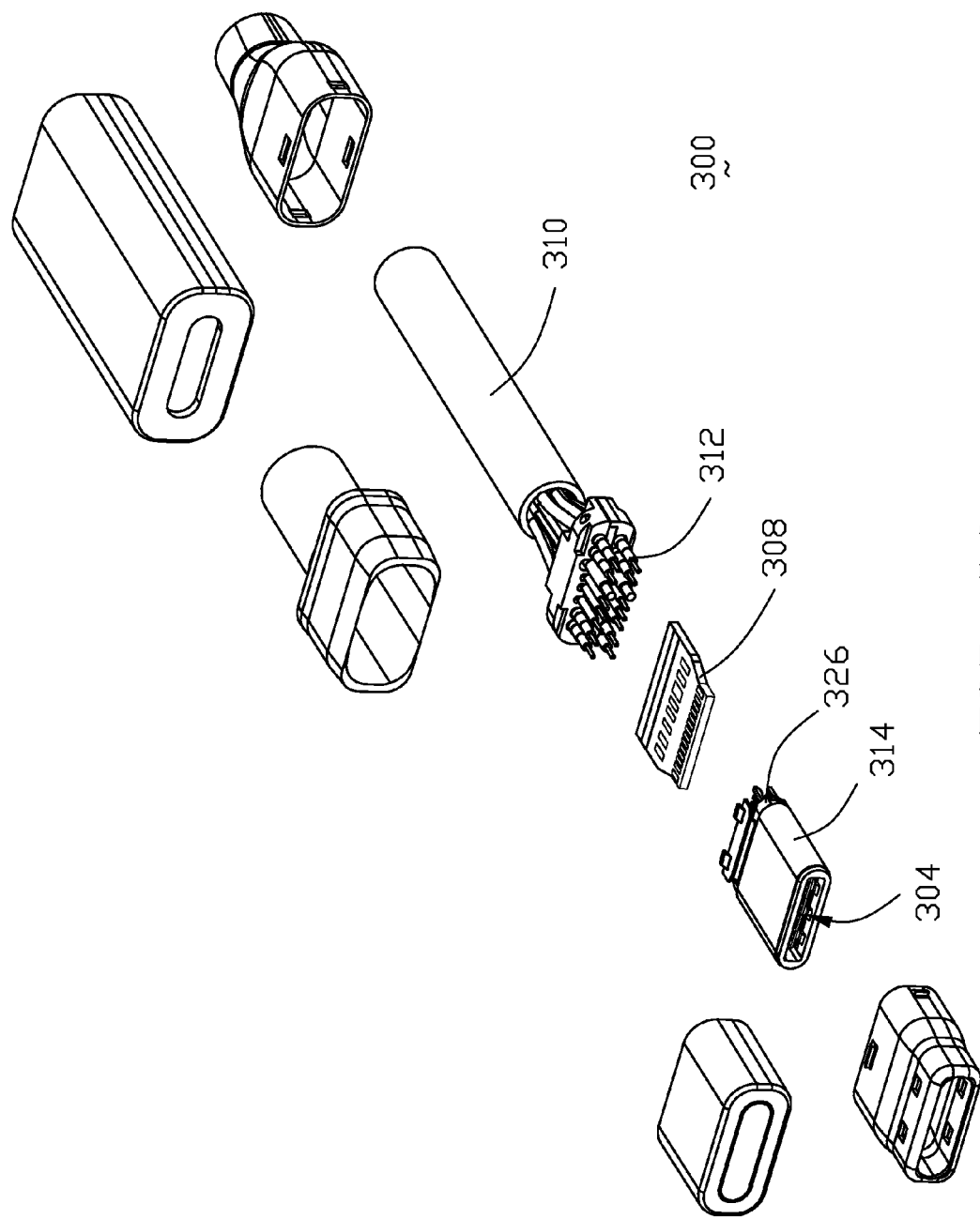
FIG. 36 is a front assembled perspective view of the plug connector further assembled with cabled and other parts.
Figure 37A:
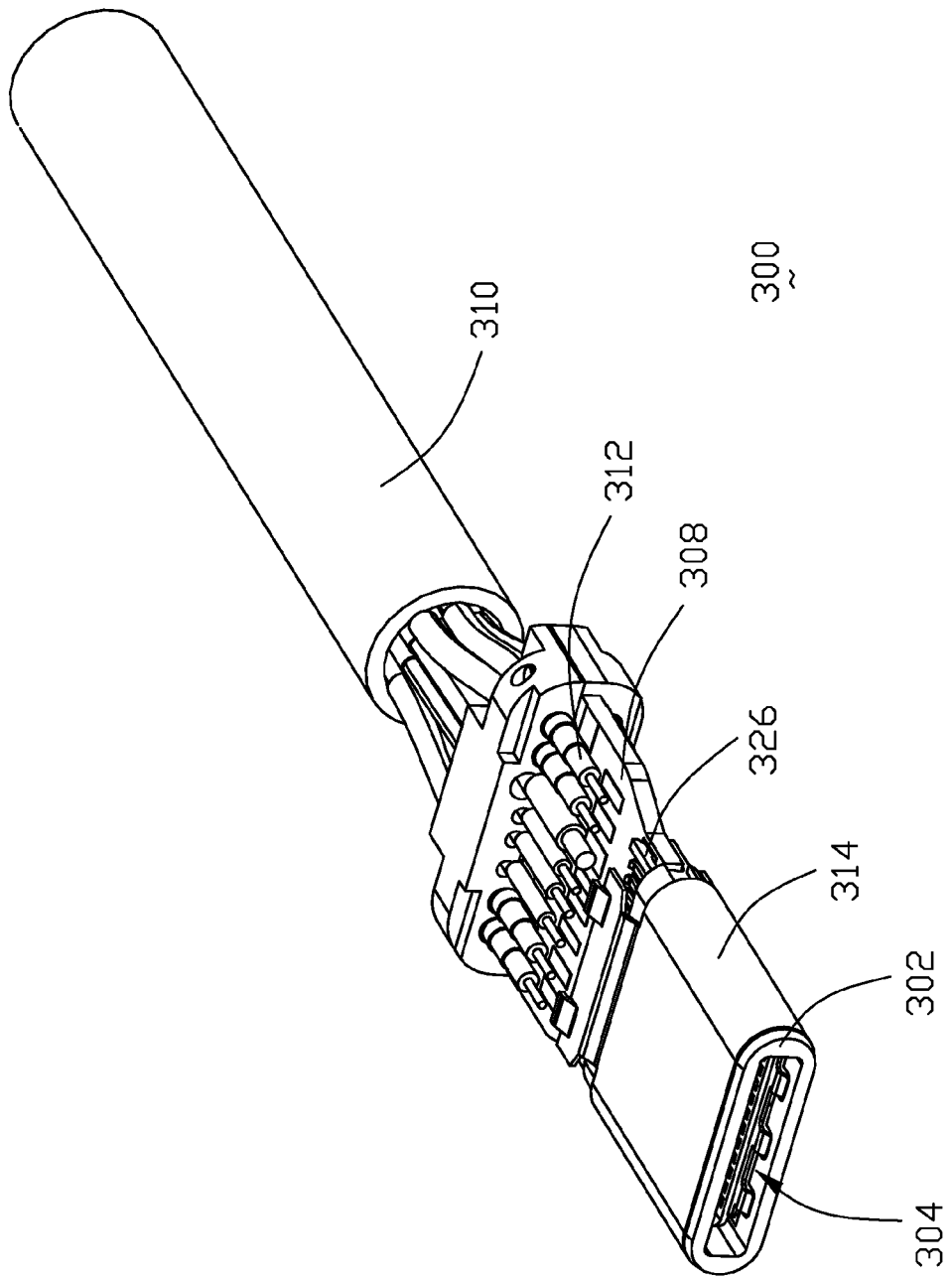
FIG. 37(A) is a front partially assembled perspective view of the plug connector of FIG. 36.
Figure 37B:
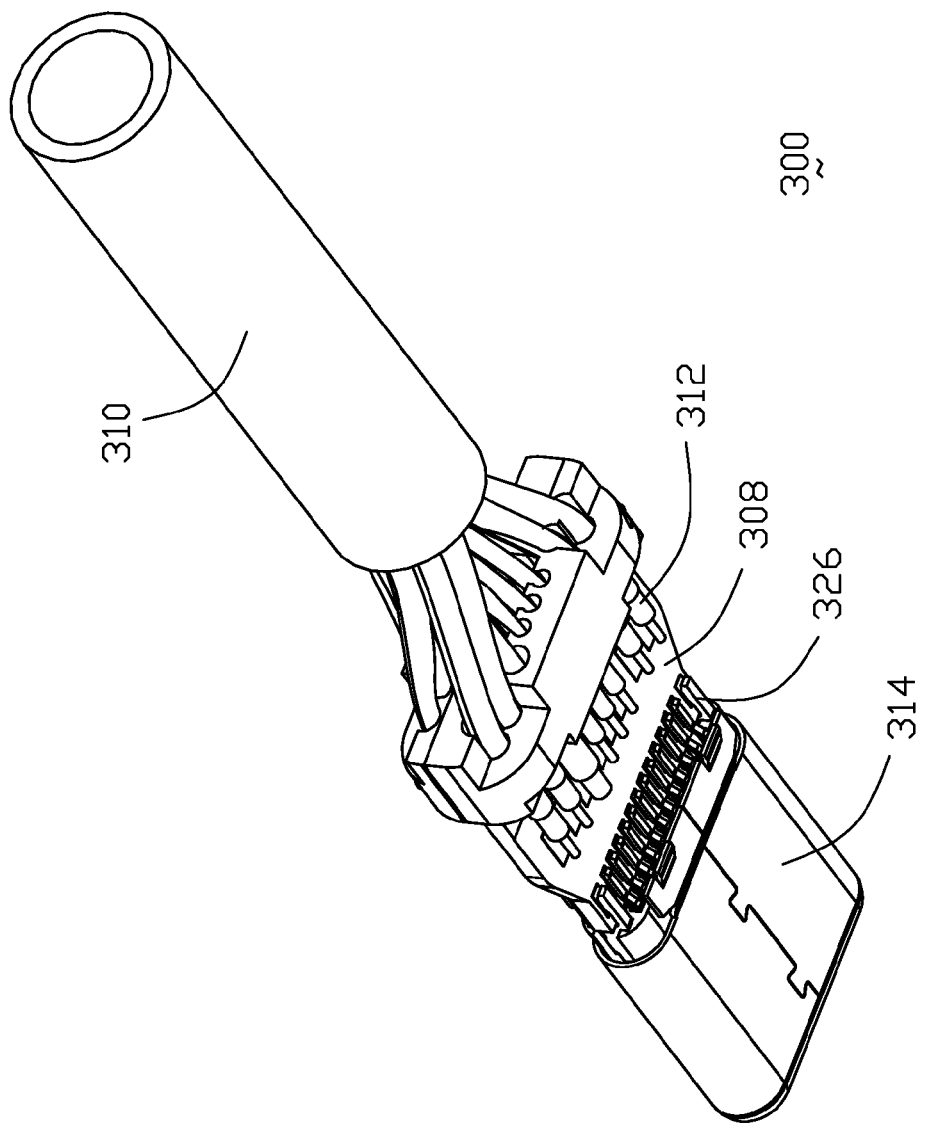
FIG. 37(B) is a rear partially assembled perspective view of the plug connector of FIG. 36.
Figure 38:
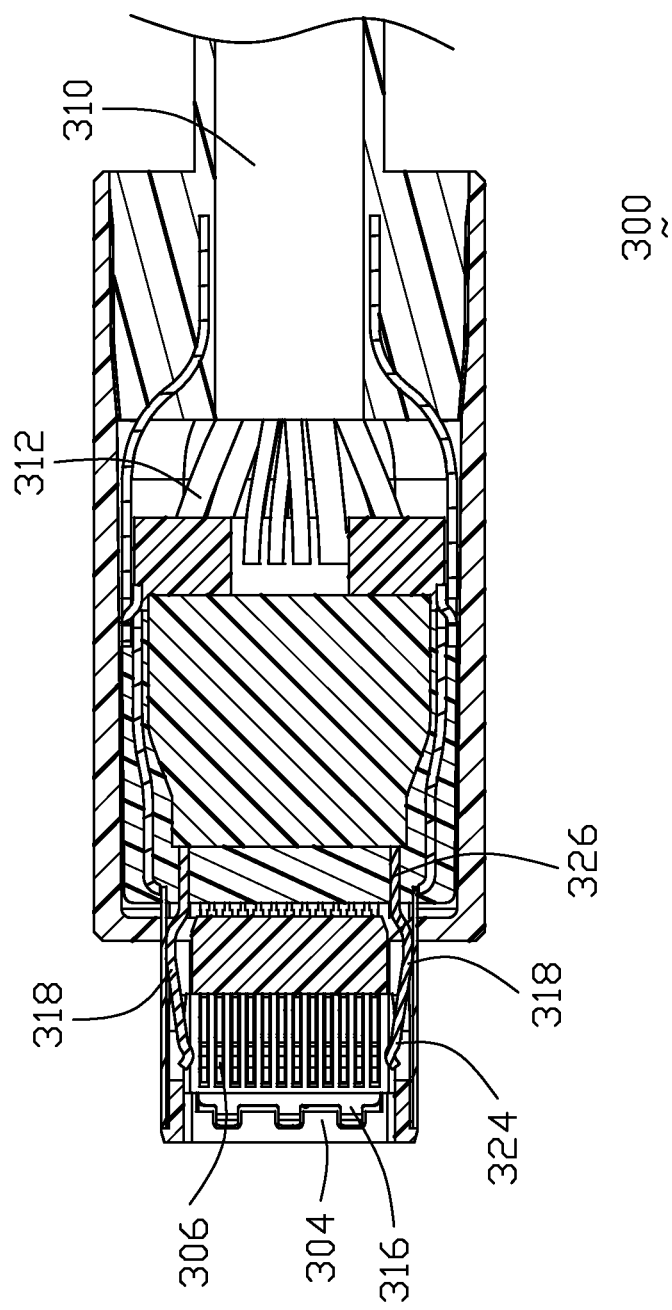
FIG. 38 is a cross-sectional view of the assembled plug connector.
Figure 39A:
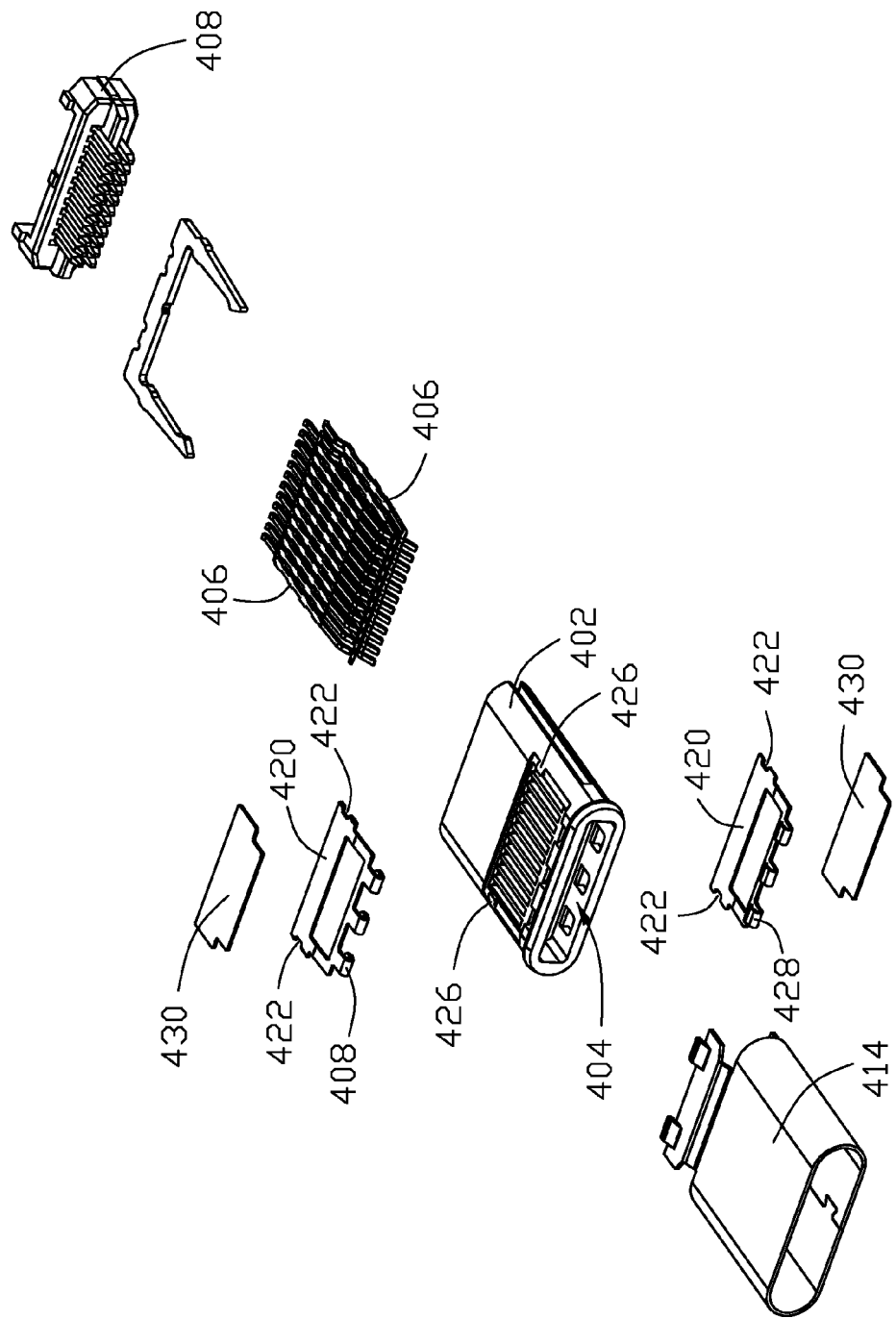
FIG. 39(A) is a front exploded perspective view of a sixth embodiment of the plug connector, similar to what is shown in FIG. 13(A).
Figure 39B:
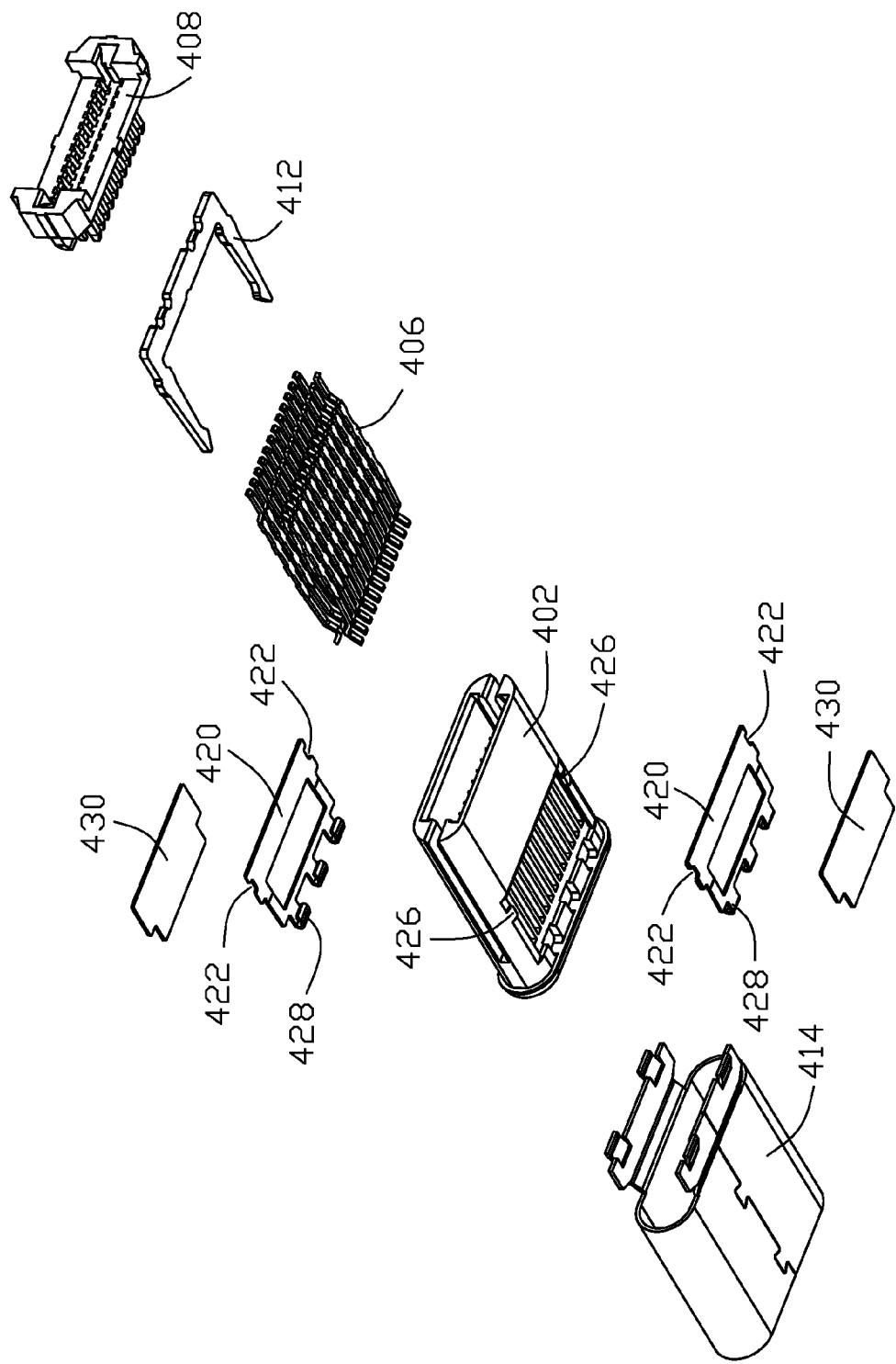
FIG. 39(B) is a rear exploded perspective view of the plug connector of FIG. 39(A).
Figure 40A:
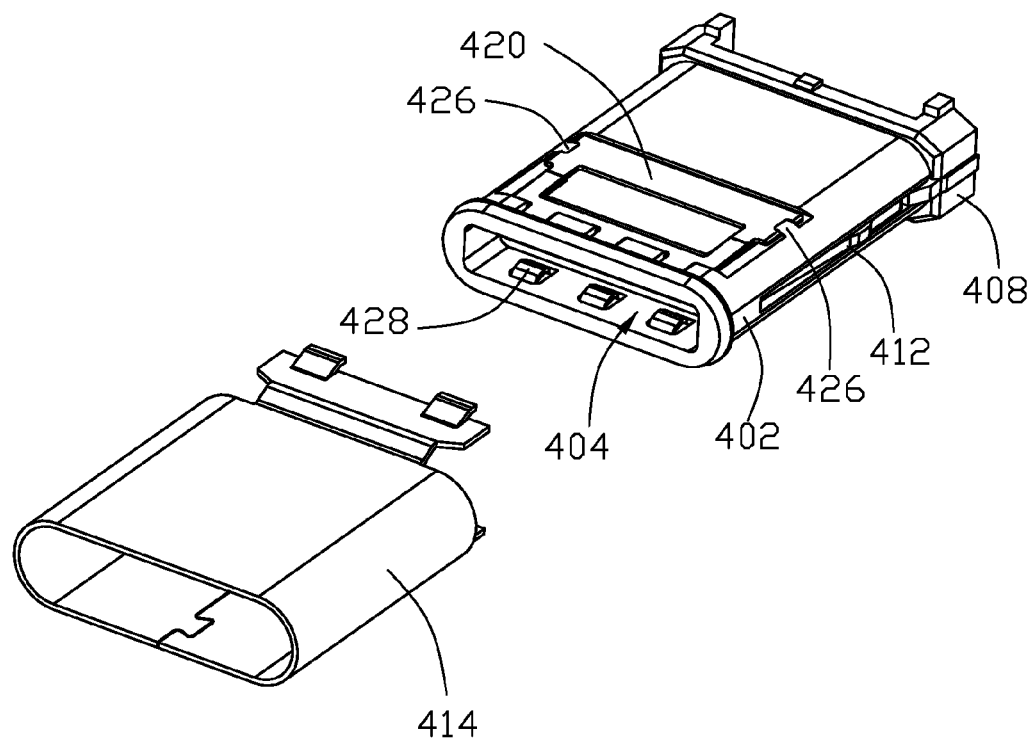
FIG. 40(A) is a front partially assembled perspective view of the plug connector of FIG. 39(A).
Figure 40B:
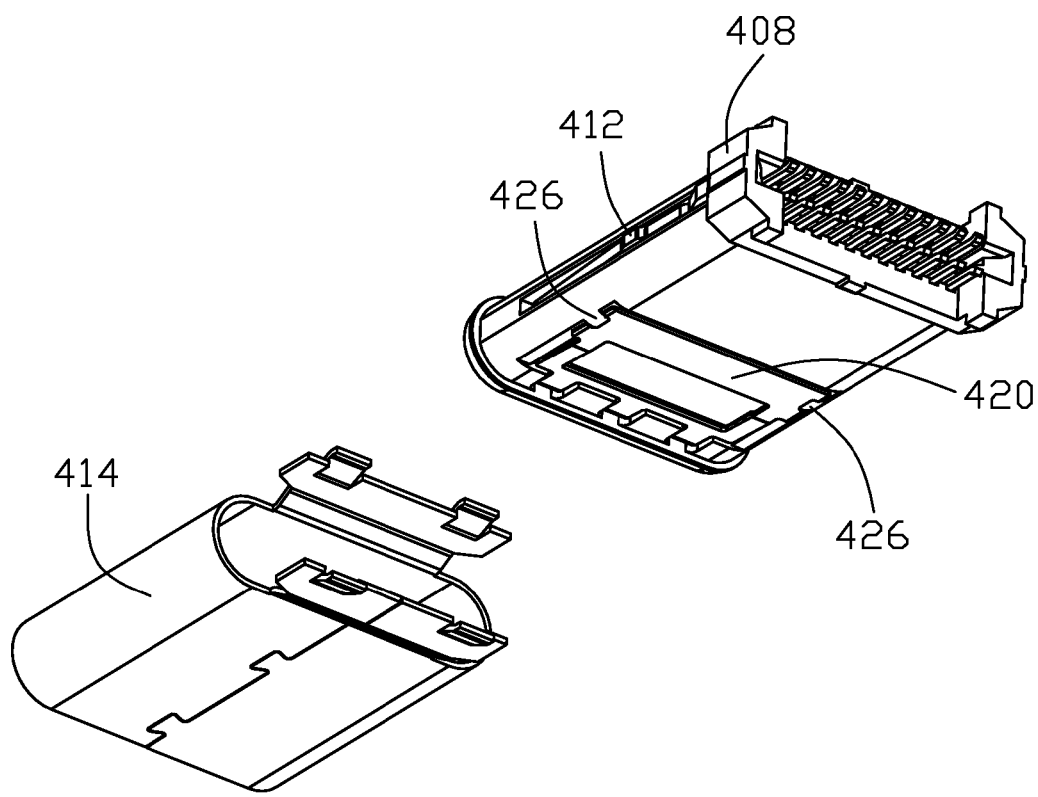
FIG. 40(B) is a rear partially assembled perspective view of the plug connector of FIG. 39(B).
Figure 41A:
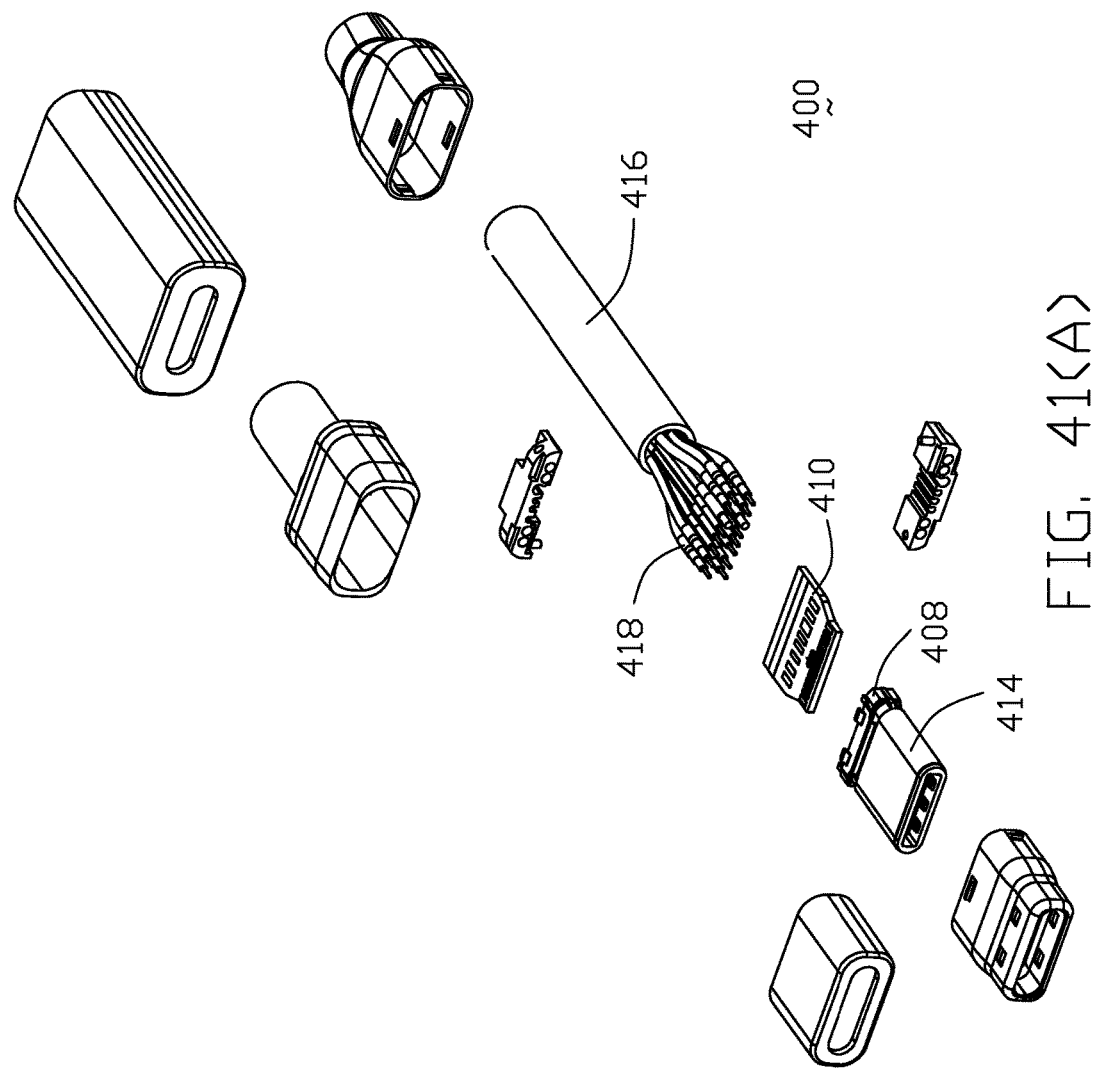
FIG. 41(A) is a front exploded perspective view of the plug connector of FIG. 40(A) further assembled with cables and other parts.
Figure 41B:
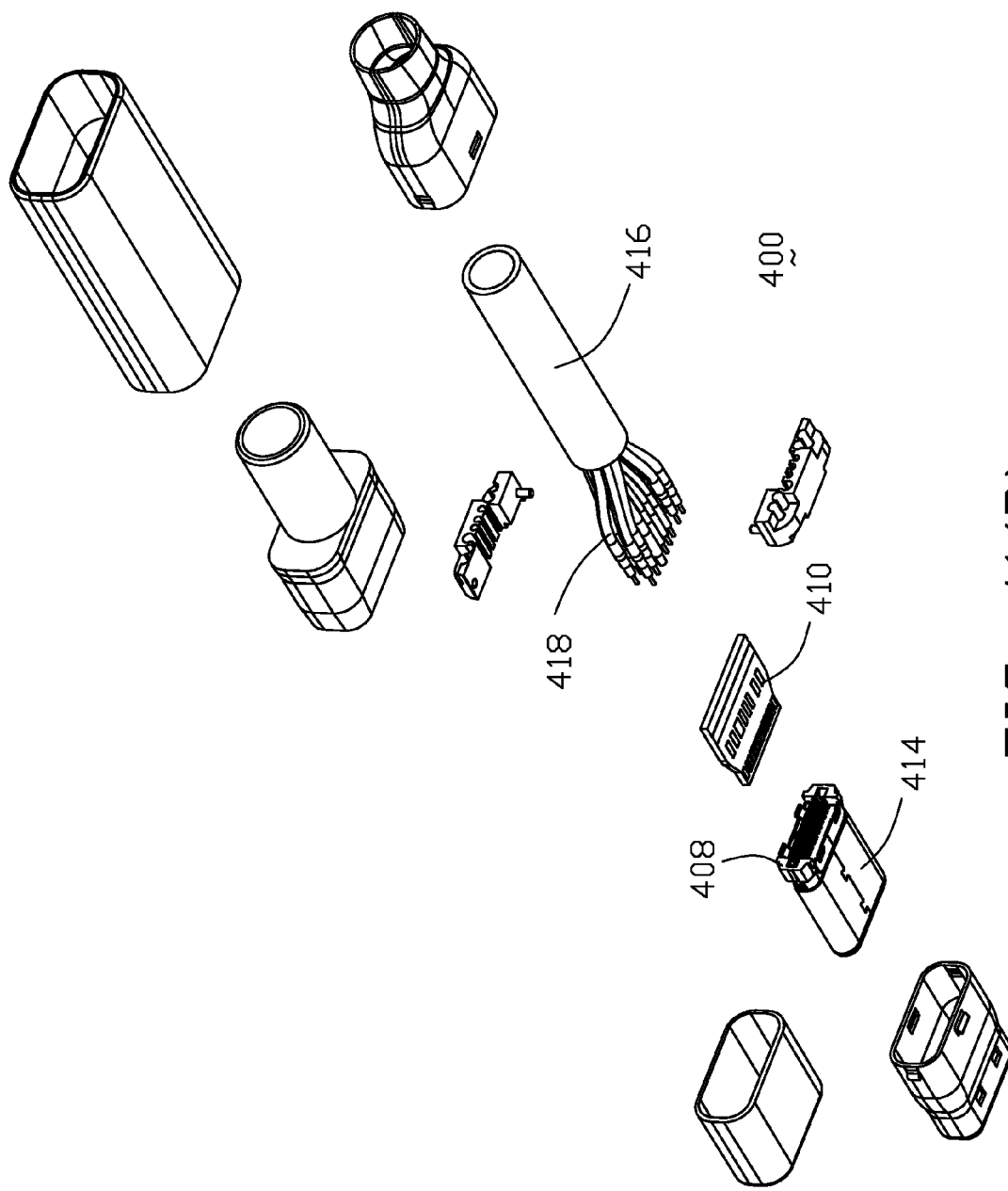
FIG. 41(B) is a rear exploded perspective view of the plug connector of FIG. 41(A).
Figure 42A:
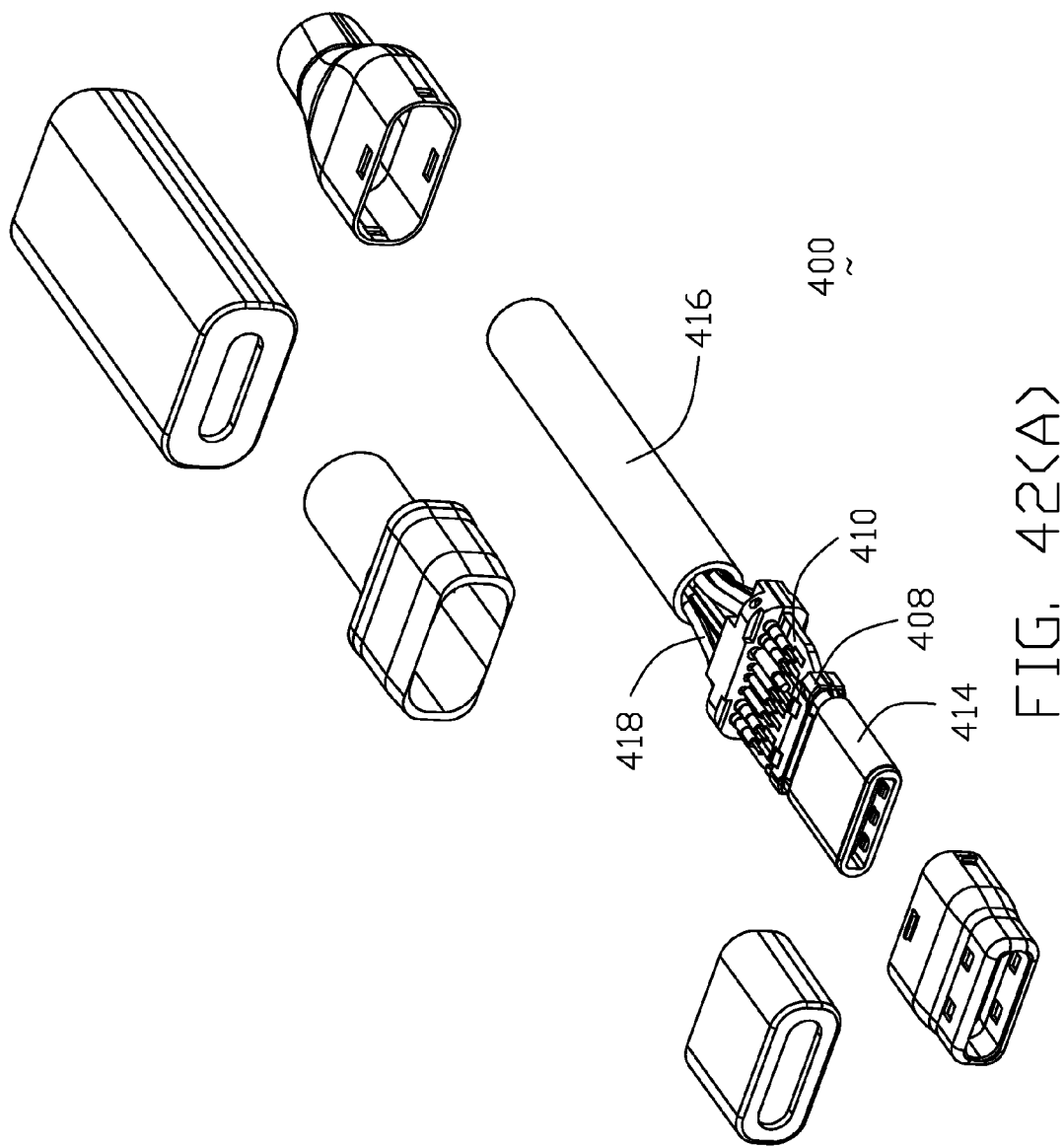
FIG. 42 (A) is a further front partially assembled perspective view of the plug connector of FIG. 41(A).
FIG. 42(B) is a further rear partially assembled perspective view of the plug connector of FIG. 41(B).
Figure 42B:
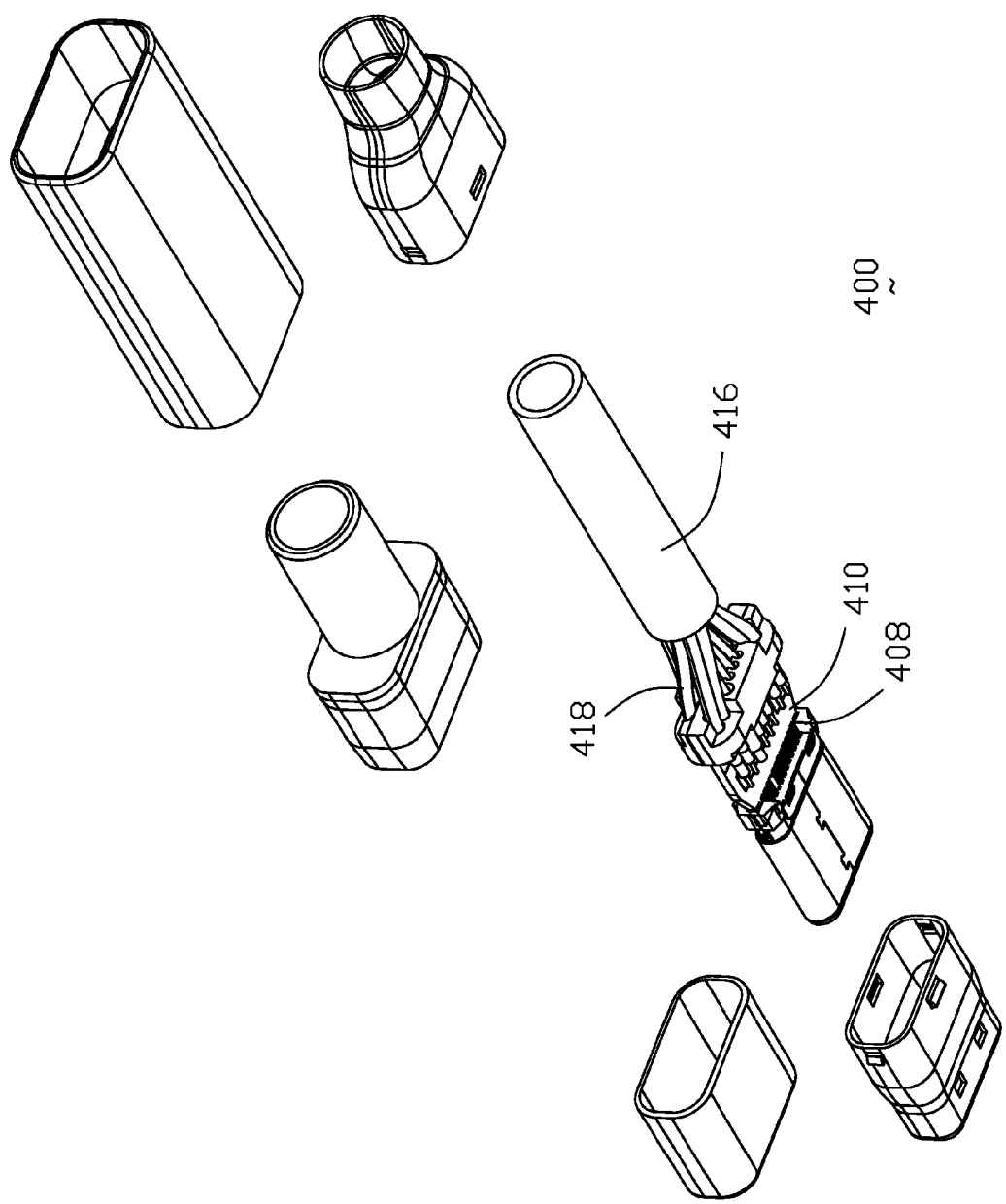
Figure 43:
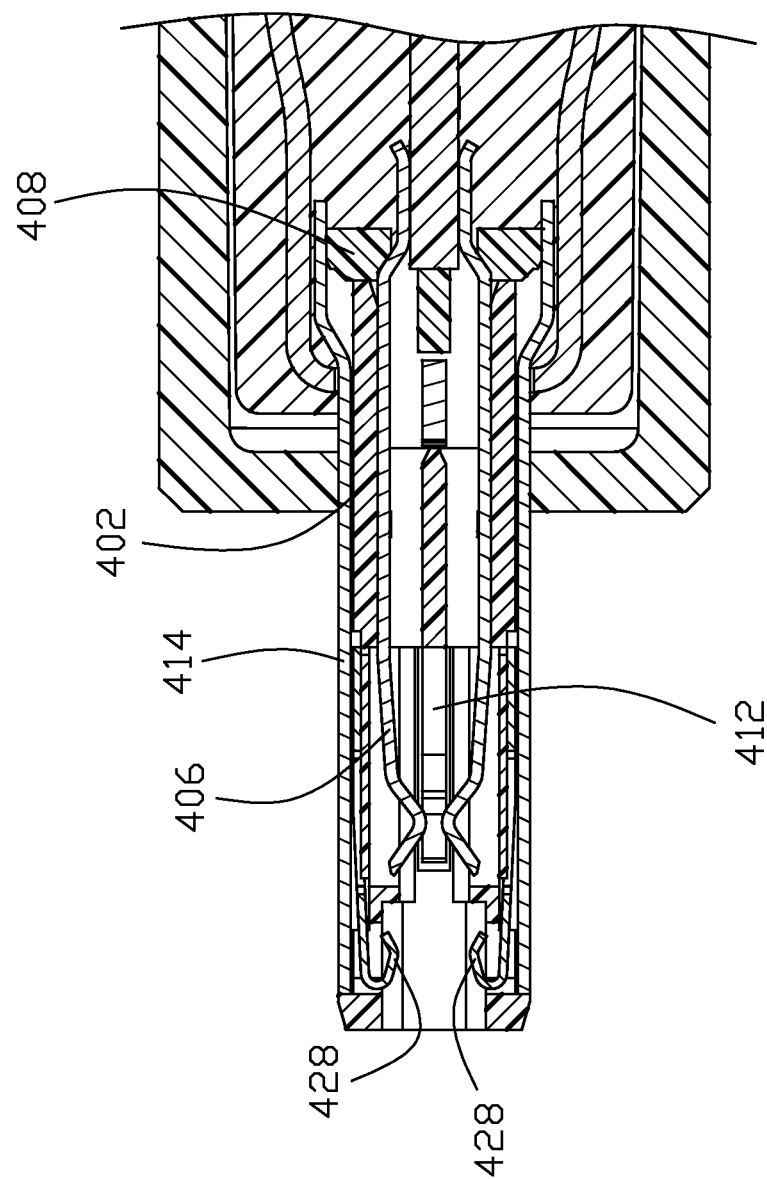
FIG. 43 is a cross-sectional view of the assembled plug connector of FIG. 42(A).
Figure 44:
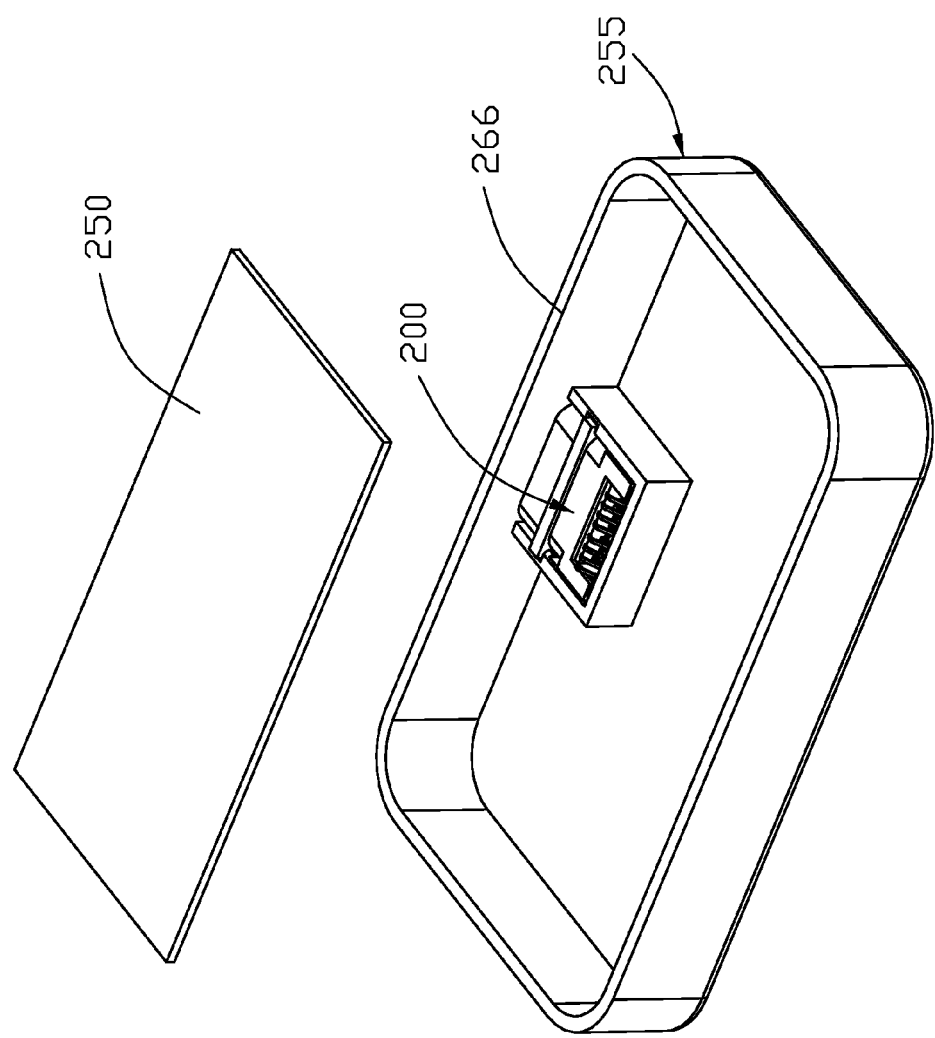
FIG. 44 is a rear perspective view of a seventh embodiment of the receptacle connector mounted in a case of a mobile device.
Figure 45:
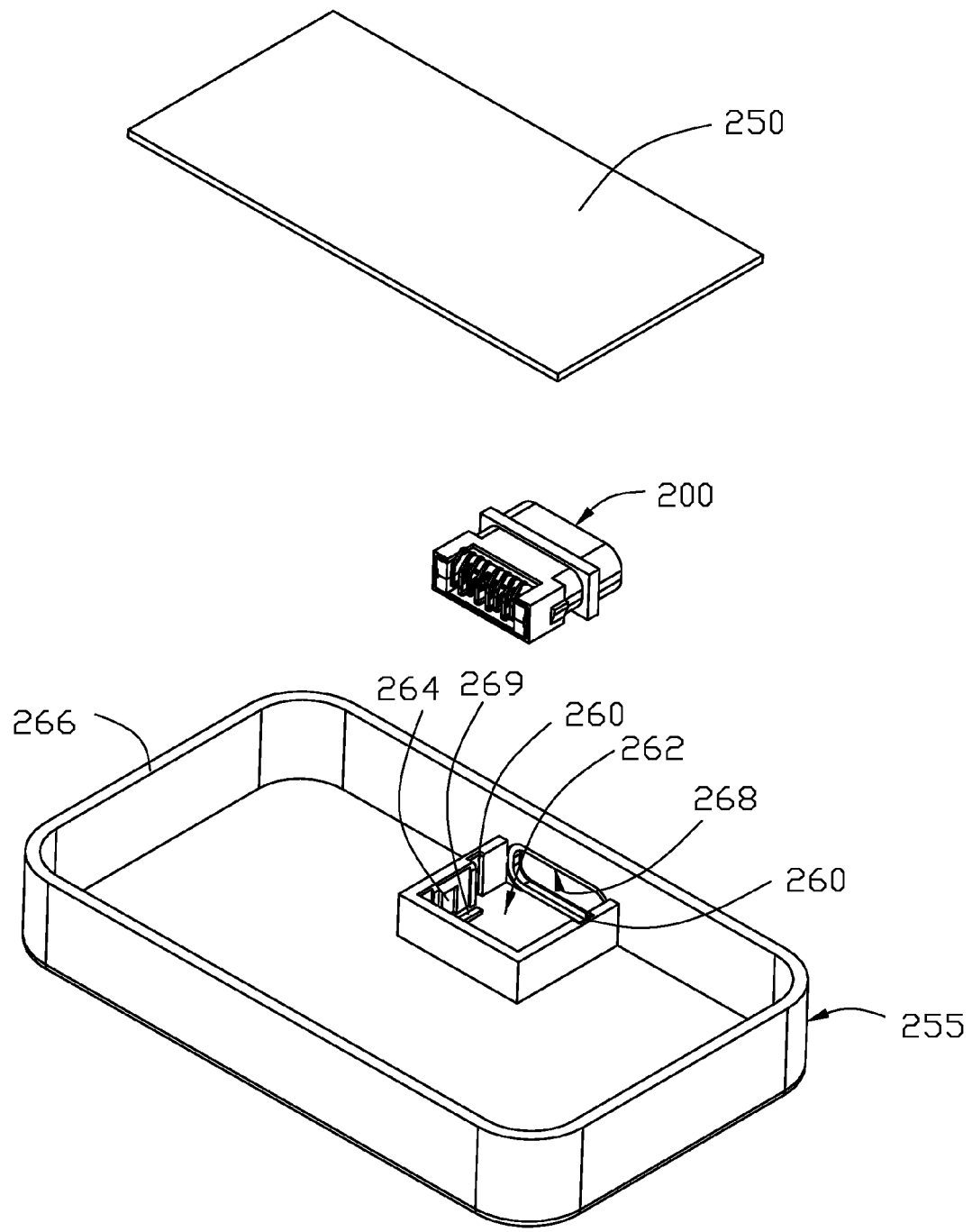
FIG. 45 is a rear perspective view of the receptacle connector of FIG. 27 removed away from the case.
Figure 46A:
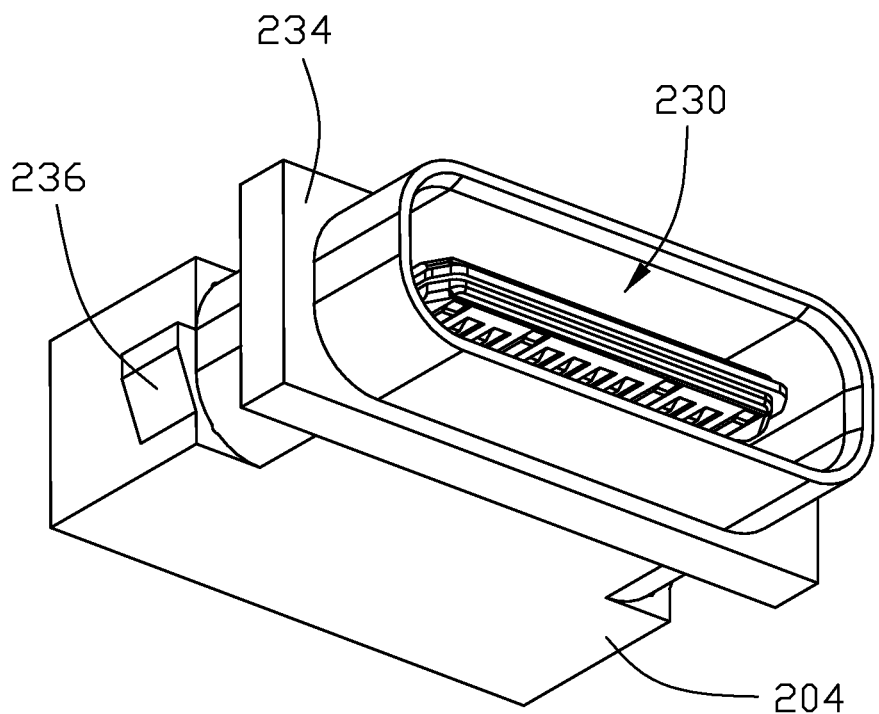
FIG. 46(A) is a front assembled perspective view of the receptacle connector of FIG. 44.
Figure 46B:
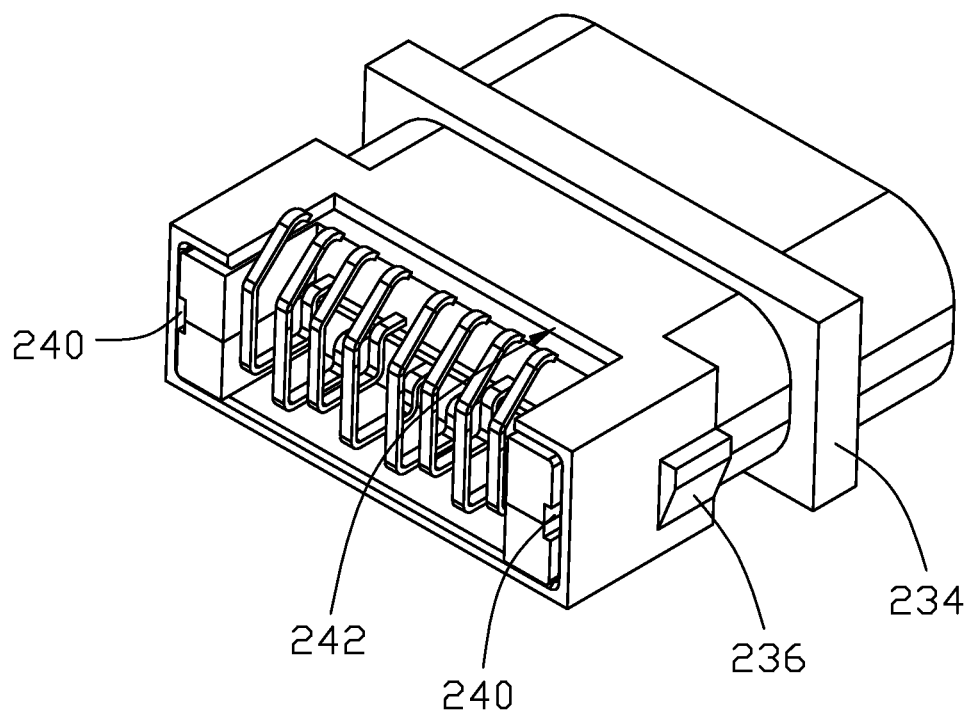
FIG. 46(B) is a rear assembled perspective view of the receptacle connector of FIG. 44.
Figure 47:
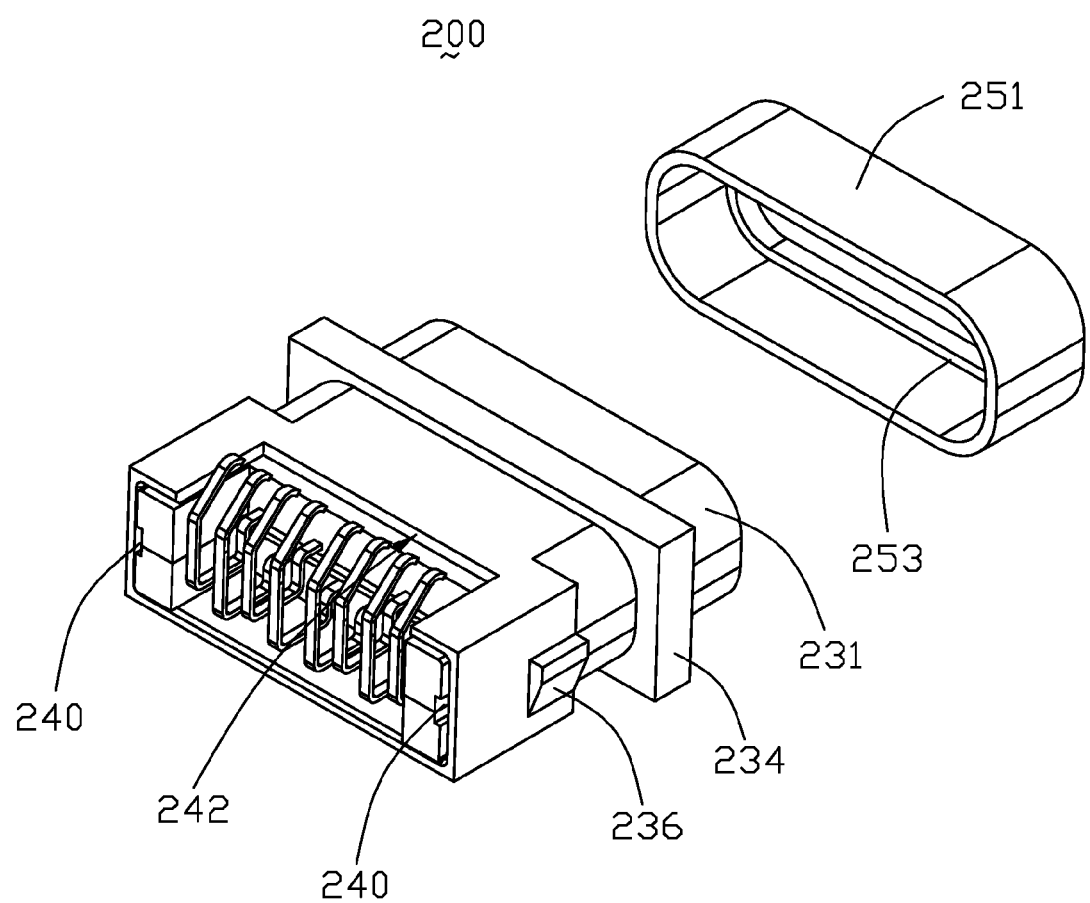
FIG. 47 is a rear exploded perspective view of the receptacle connector of FIG. 44.
Figure 48:
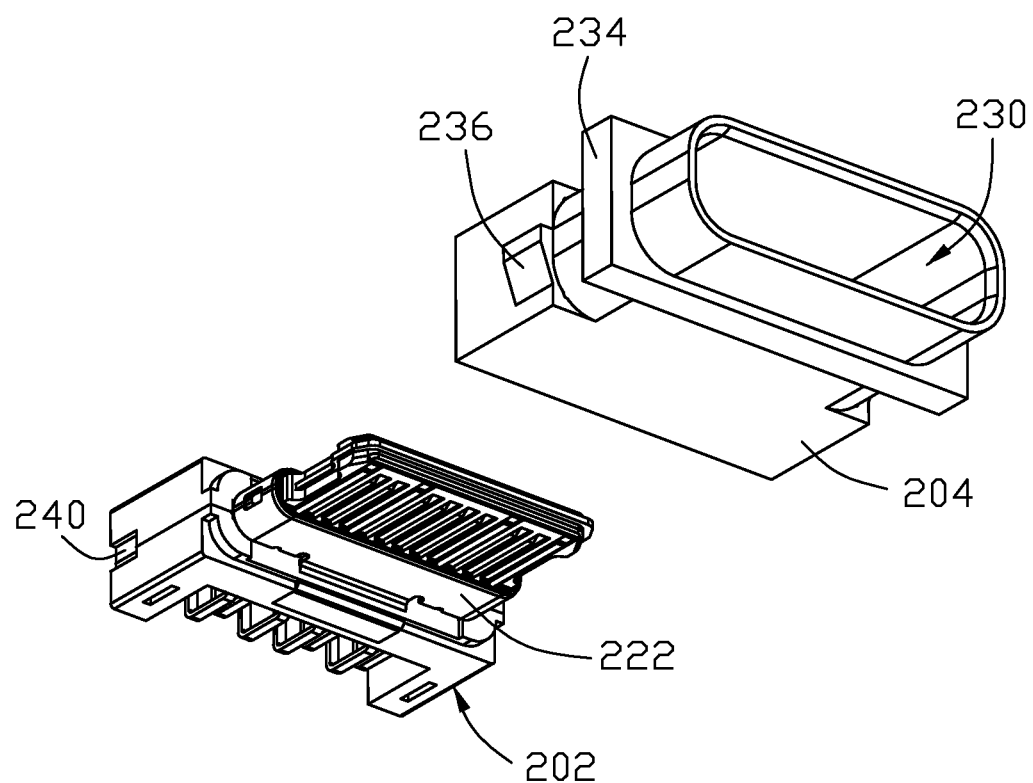
FIG. 48 is a front exploded view of the receptacle connector of FIG. 44.
Figure 49:
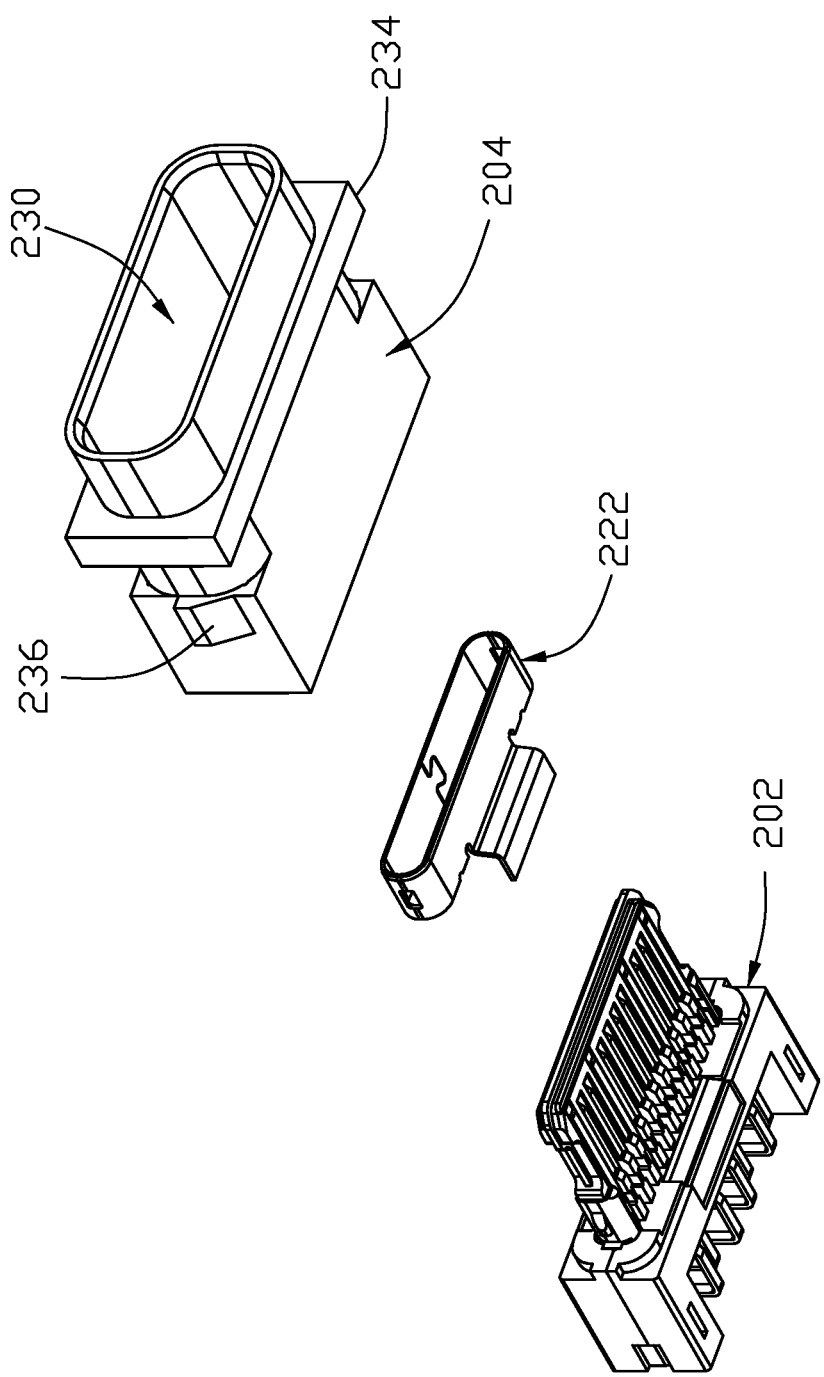
FIG. 49 is a further front exploded view of the receptacle connector of FIG. 29.
Figure 50:
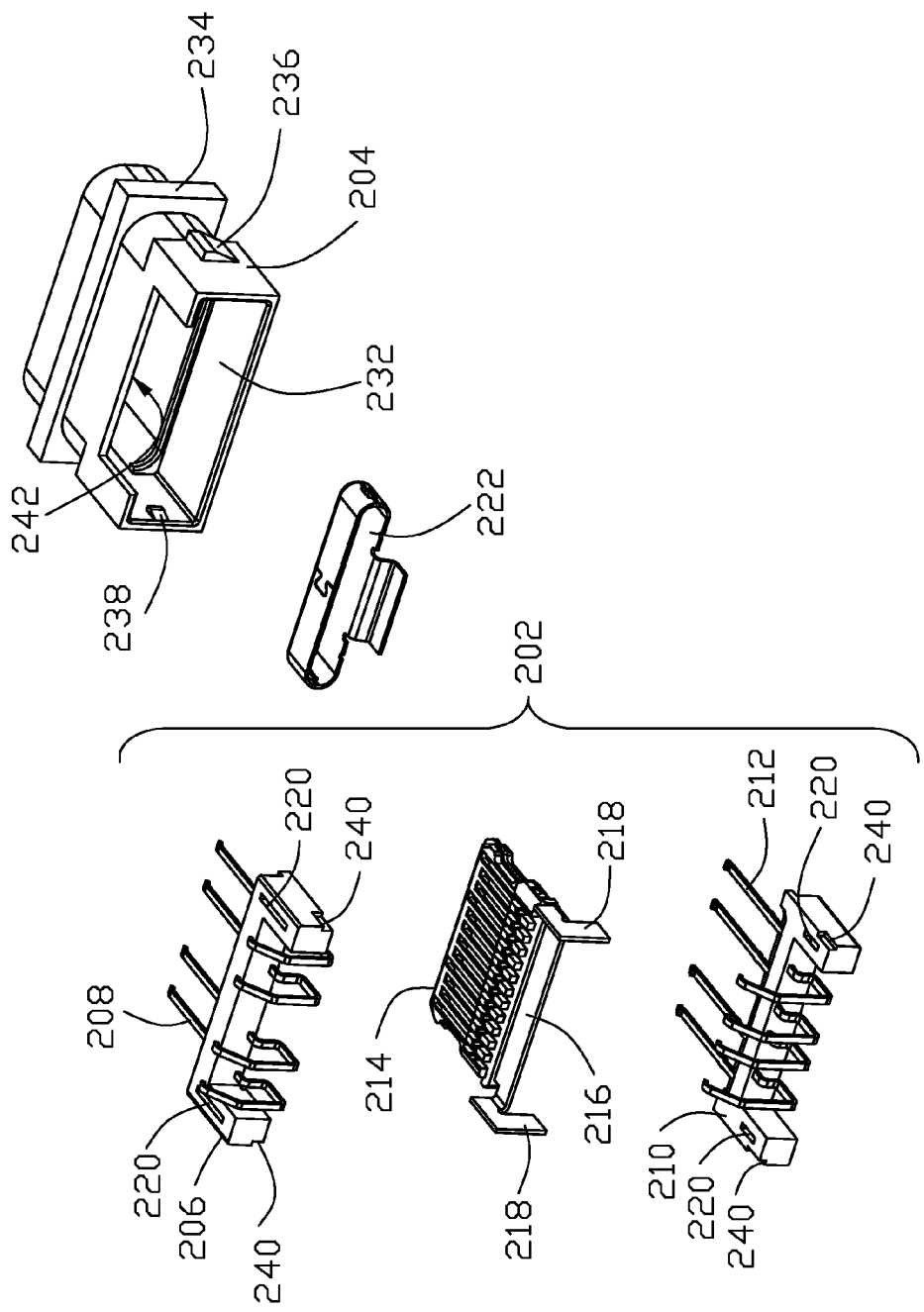
FIG. 50 is a further rear exploded perspective view of the receptacle connector of FIG. 30
Figure 51:
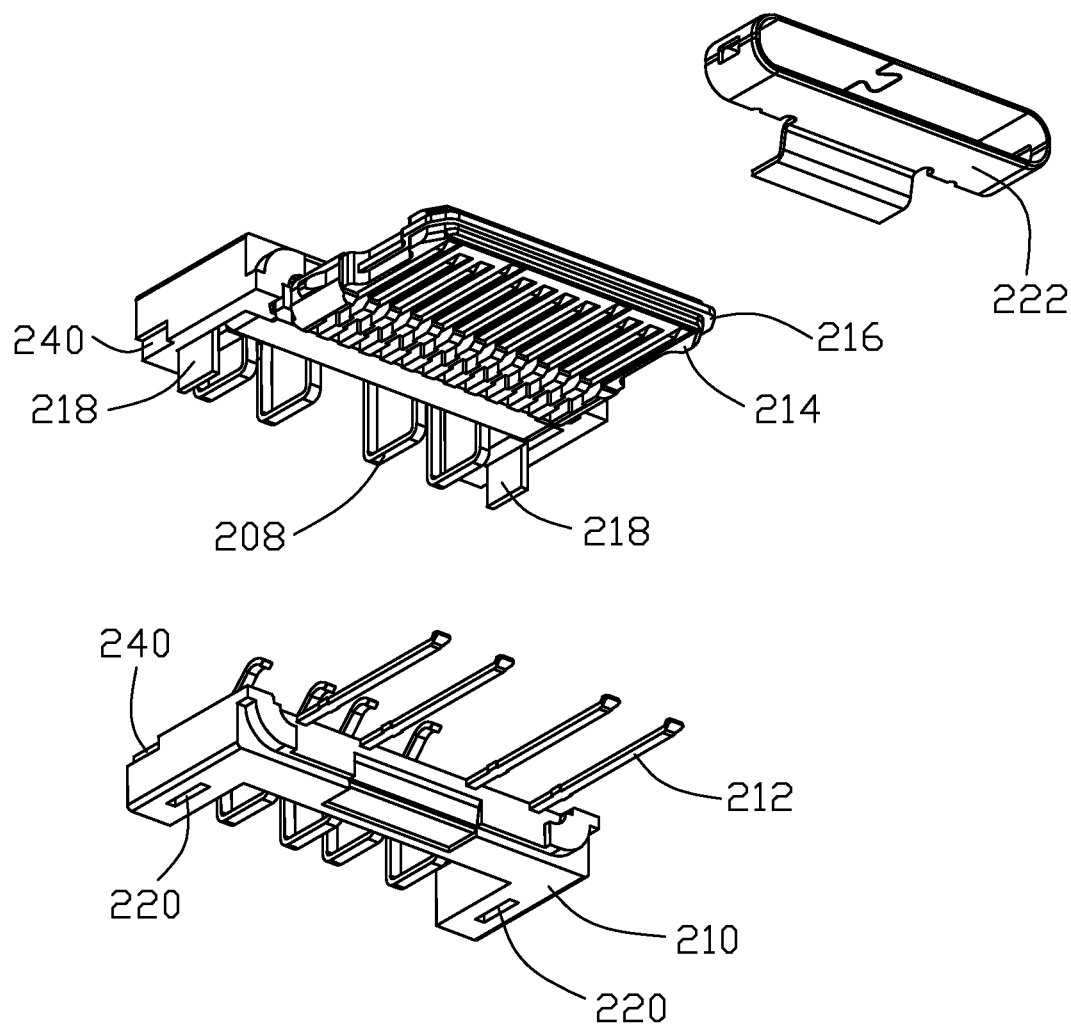
FIG. 51 is a further front exploded perspective view of the receptacle connector of FIG. 50.
Figure 52:
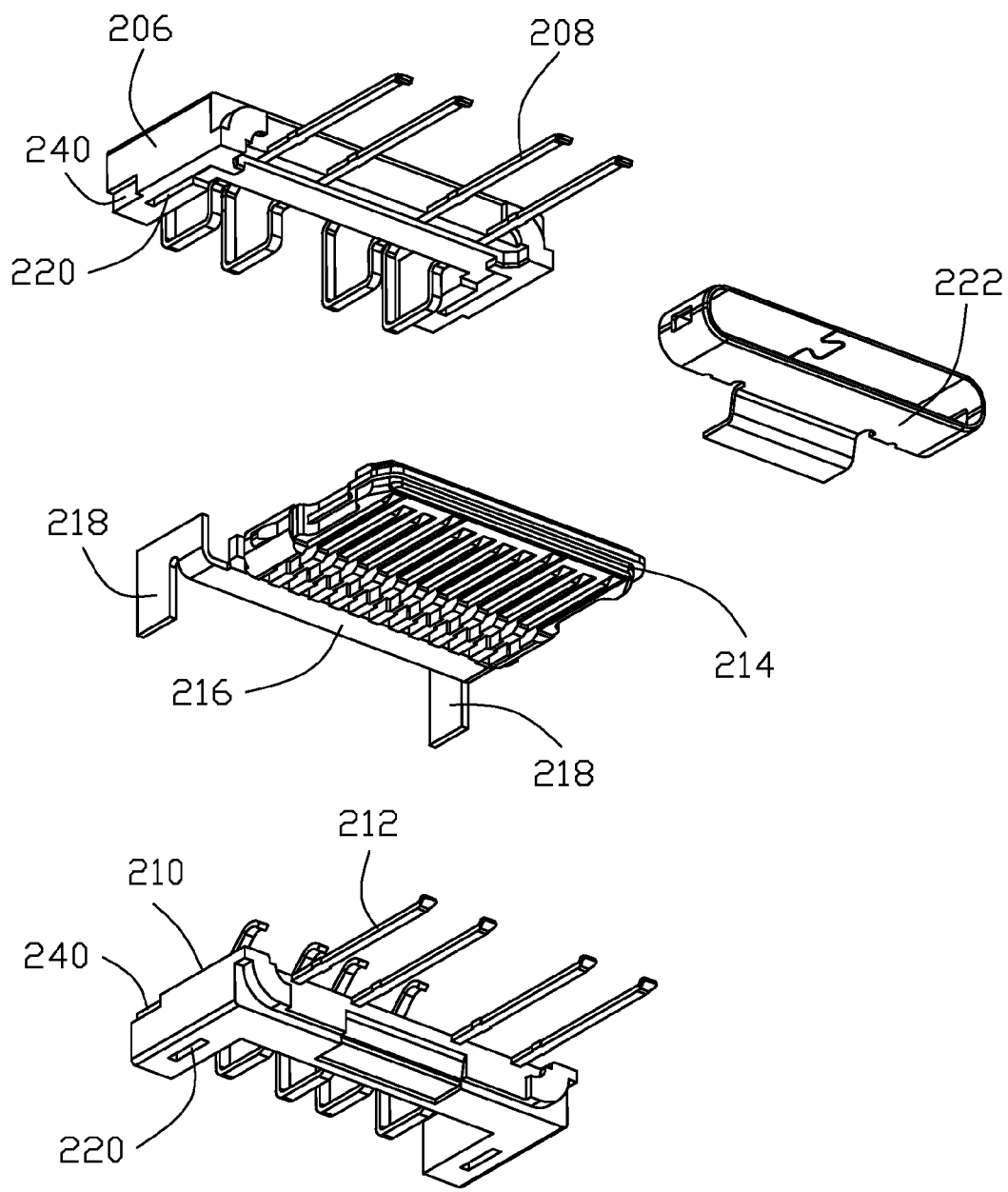
FIG. 52 is a further front exploded perspective view of the receptacle connector of FIG. 51.
Figure 53:
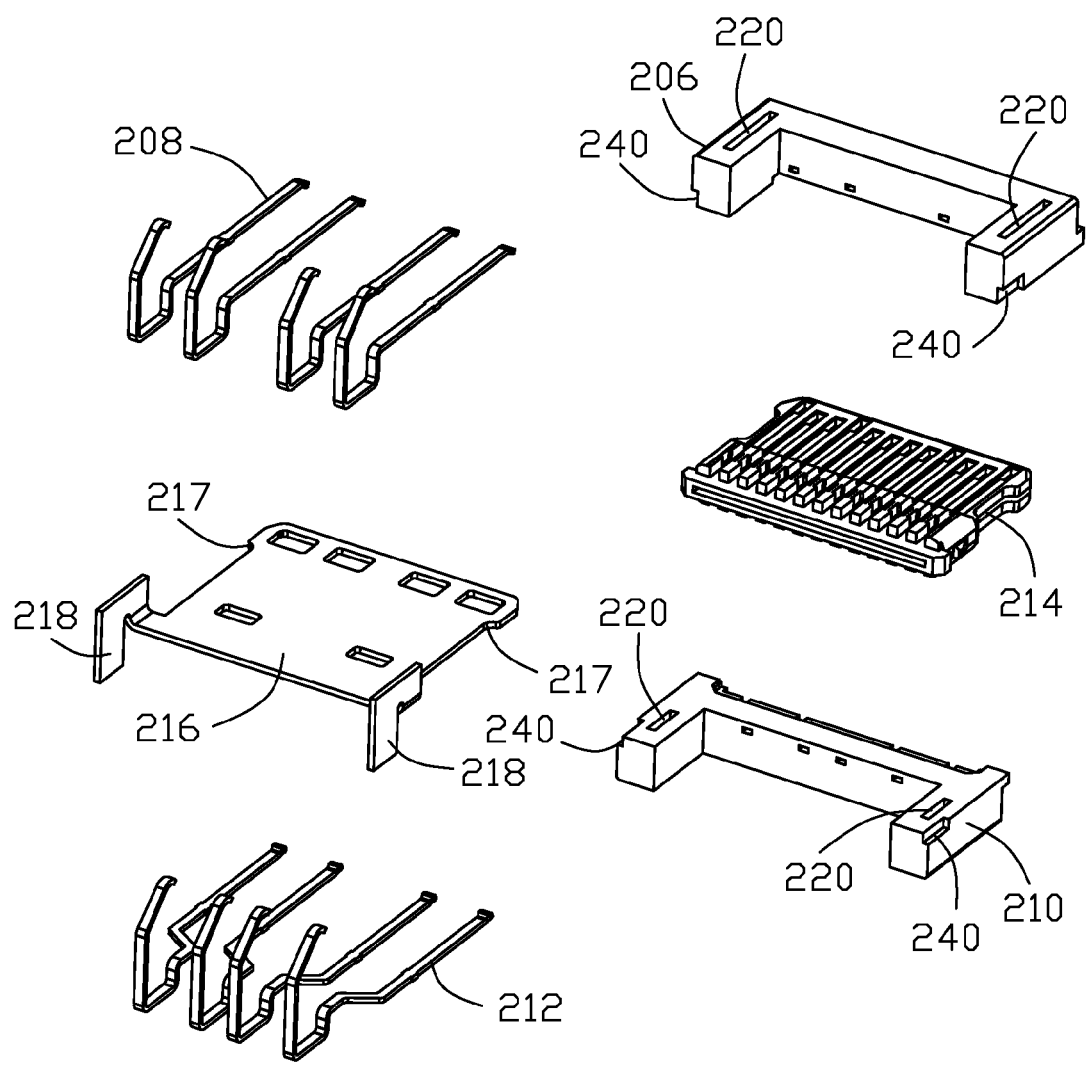
FIG. 53 is a further rear exploded perspective view of the receptacle connector of FIG. 52.
Figure 54:
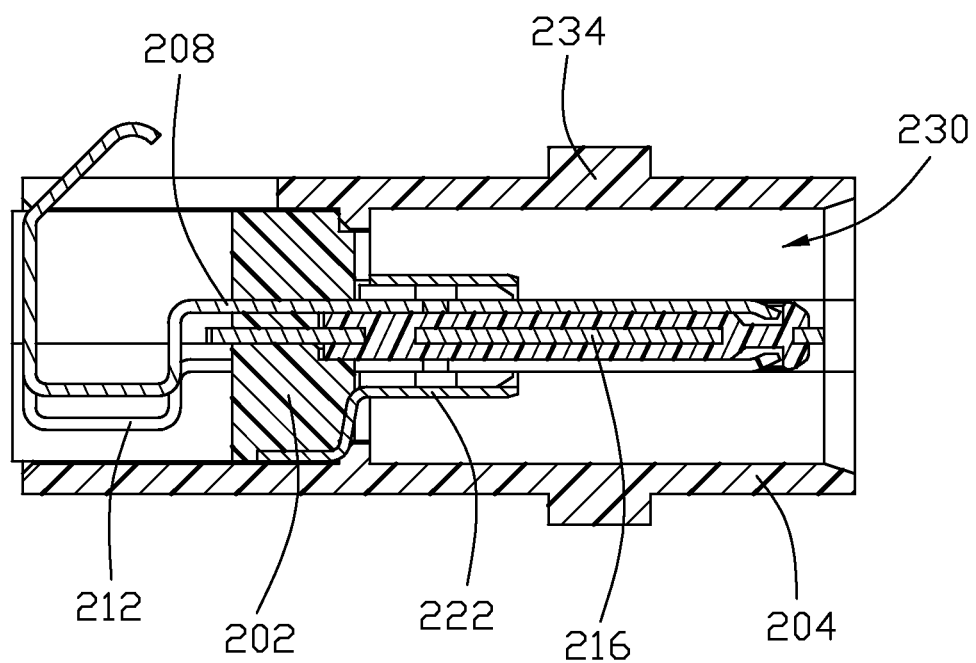
FIG. 54 is a cross-sectional view of the receptacle connector of FIG. 46(A).
Figure 55:
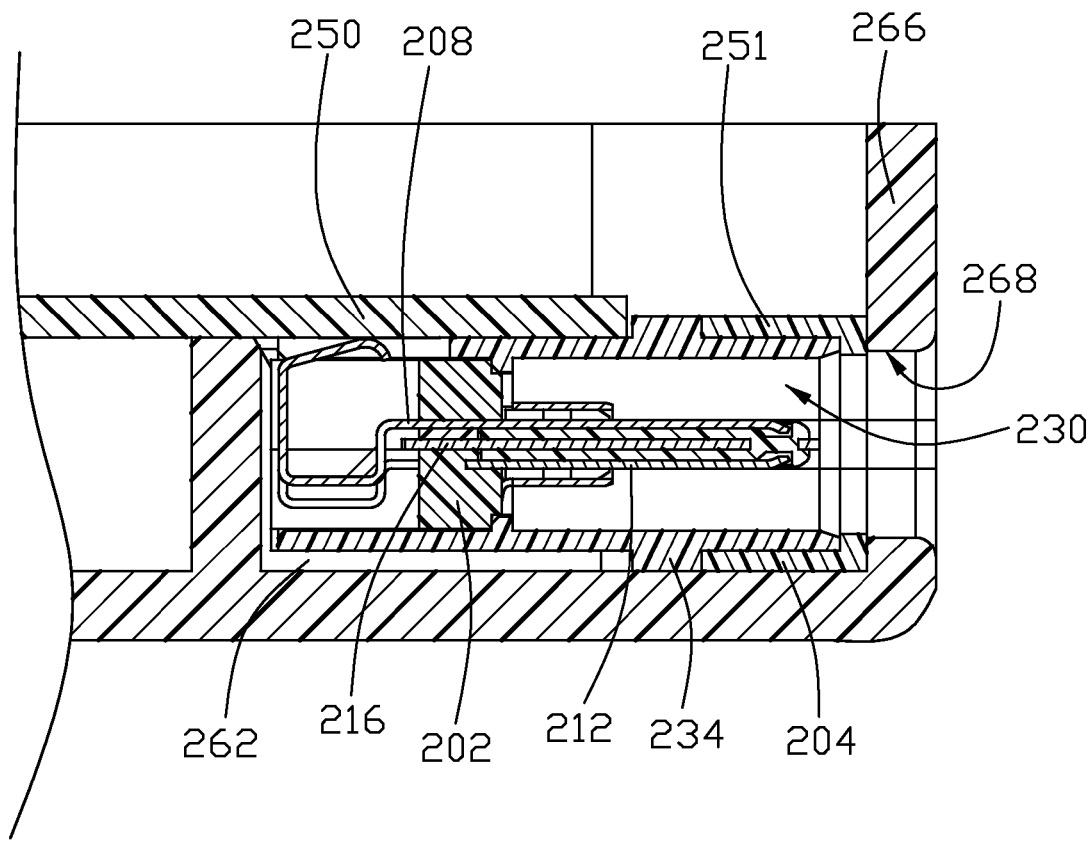
FIG. 55 is a cross-sectional view of the receptacle connector of FIG. 44 in the case.

Referring to FIGS. 9-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two faces in the vertical direction to be commonly inserted into a back side of the housing 12 wherein the blade 31 is essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the comb structures on the bland 31, the forward protrusions 33, the slots 13 and an interior rear face of the housing 12.

A cable 41 behind the paddle card 38, encloses a plurality of wires 42 regulated by a pair of organizer 43 to be soldered upon a rear region of the paddle card 38. Via the protrusions and openings (not labeled), an auxiliary rear shell 17 grasps the shell 16 to shield the paddle card 38, and a clipper 44 grasps the rear shell 17 and further the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

Referring to FIGS. 15(A)-20 showing a second embodiment of the receptacle connector 110 similar to that disclosed in the first embodiment, the receptacle connector 110 includes the upper piece 112 with the upper contacts 114 insert molded therein, the middle piece 116 with the shielding plate 118 therein, and the lower piece 120 with the lower contacts 122 therein wherein the upper piece 112 and the lower piece 120 are commonly sandwich the middle piece 116 therebetween with an EMI metallic collar 124 surrounds all. A metallic shield 126, i.e., i.e., the capsular segment 126a (labeled in FIG. 17(A)) defined as the mating port portion encloses the assembled upper piece 112, the middle piece 116 and lower piece 120 and forms a mating cavity 127 in which a mating tongue 129 formed by the middle piece 116 forwardly extends. Notably, similar to that in the first embodiment, the shielding plate 118 forms a pair of lateral edge sections 119 for locking to the corresponding latch of the complementary plug connector. Also, similar to that in the first embodiment, the metallic shield 126 further forms an upside-down U-shaped structure, i.e., the rear covering portion 13 (labeled in FIG. 16(A)) including a top wall 130, a pair of side walls 132 and further a rear wall 134 so as to relatively completely shield the rear portions of the upper piece 112 and lower piece 120 above the printed circuit board 106. Different from what is disclosed in the first embodiment, the mating port portion 126a of the shield 126 does not defines a sealed type capsular mating cavity 127 but with two pairs of spring tangs 128 for engagement with the mated plug connector. In addition, a metallic top bracket 138 covering an upper part of the capsular segment 126a of the shield 126, is optionally welded to the shield 126 and mounted upon the top surface of the printed circuit board 106 via a pair of mounting legs 139, and a metallic bottom bracket 140 covering a lower part of the capsular segment 126a of the shield 126, is optionally welded to the shield 126 and optionally soldered, with the soldering pads 142, to an under surface of the printed circuit board 106 to completely shield the through holes 108 which receive the mounting tails of the lower contacts 122 and those of the shield 126. The bottom bracket 140 as shown in FIG. 16(A) and FIG. 16(B) includes a bottom wall 140a and a rear wall 141 bending from a rear edge of the bottom wall 140a, and two front sidewalls 143 and two rear sidewall 145 curvedly extending from opposite ends of the bottom wall 140a. The front sidewalls 143 snug surrounding the capsular segment 126a and the rear sidewalls 145 are separated from each other. Said soldering pads 142 bend from the rear sidewall 145 and the rear wall 141. Please referring to FIG. 20, the bottom wall 140a and the rear wall 141 surround the mounting tails 108 of the lower contacts 122 and those of the shield 126 therein. The rear wall 134 of the rear covering portion 130 surrounds the mounting legs of the upper contacts therein. In this embodiment, the lower piece 120 forms a pair of recesses 111 to receive the corresponding retention tangs 113 of the shield 126.

Referring to FIGS. 21(A)-26 showing a third embodiment of the receptacle connector similar to those disclosed in the second embodiments, a metallic bottom bracket 140' covering a lower part of the capsular segment 126a of the shield 126, is optionally welded to the shield 126 and positioned to an under surface of the printed circuit board 106 to completely shield the through holes 108 which receive the mounting tails of the lower contacts 122 while leaving those receiving the shield 126 opened. Notably, same with that in the first embodiment, the collar 124 is equipped with an L-shaped extending plate 125 received in the recess 121 of the lower piece 120 wherein the extending plate 125 forms a pair of protrusions 123 to mechanically and electrically connect to the shield 126. The bottom bracket 140' includes a bottom wall 140a', a rear wall 141' and two sidewalls 143', those four walls are integrated and formed by drawing. Different from the second embodiment, the sidewalls has no soldering pads 142, and the bottom bracket 140' is formed by drawing technology.

FIGS. 27(A)-33 disclose fourth embodiment of the receptacle connector 500 for use with a flippable plug connector. The receptacle connector 500 mounted upon a printed circuit board 550 via assistance of the bracket 548, includes a terminal module 502 enclosed within a metallic shield 504. The terminal modules 502 includes an upper insulator 510 associated with the upper contacts 512, and a lower insulator 514 associated with the lower contacts 516 to commonly sandwich a middle insulator 520 associated with an EMI metallic shielding plate 520 having a pair of lateral edge sections to engage the corresponding latches of the complementary plug connector. The significant difference relative to the first embodiment is to provide the dual row contacts both with surface mount tail sections 5122, 5162 and surface mount tail sections 5202 of the shielding plate 520 rather than including through hole type tail sections. Under this situation, no RFI leakage can be formed through such an inexistent vias in which the original through hole tail sections extend. Understandably, to have two rows of surface mount type tail sections, the tail sections of the upper row contacts and those of the lower row contacts should be offset from each other for easy inspection and trace routing. Another primary difference relative to the first embodiment is to provide the bracket 548 soldered upon the shield 504 with additionally a pair of raised portions 546 at two rear corners where the corresponding portions of the terminal module 502 are originally exposed outside of the plate, i.e., rear covering portion 505 of the shield 504. In this embodiment, such an originally exposed portion of the upper insulator 510 is the front/corner portion of the horizontal portion behind the capsular portion where the gap 506 is located. Therefore, via the pair of block like raised portion 546 of the bracket 548, majority of gaps is sealed to reduce RFI leakage. The raised portion 546 includes a first segment 5461 extending in a front and rear direction and transverse direction, a second segment 5462 extending in the front and rear direction and a vertical direction and a third segment 5463 bending from the second segment 5462 and extending in the transverse direction and the vertical direction. The raised portion 546 shielding a gap 506 formed between the shielding 504 and the covering portion 505. Thus, the bracket 548 performs a significant RFI leakage reduction function in addition to the hold down function. Notably, the raised portion 546 is not intimately seated upon the corresponding shield 504 or housing 502 but with a space therebetween in this embodiment for manufacturing consideration. On the other hand, similar to the first embodiment, the bracket 548 includes a pair of mounting legs 544 inserted into the printed circuit board 550.

FIGS. 34(A)-38 disclose a fifth embodiment of the flippable plug connector 300 similar to the plug connector 50 disclosed in the first embodiment. The plug connector 300 includes an insulative housing 302 forming a receiving cavity 304. Two rows of contacts 306 are assembled within the housing 302 with the front contacting sections extending into the receiving cavity 304 and a rear connecting sections soldered upon a front region of a paddle card 308 which is located behind the housing 302. A cable 310 includes a plurality of wires 312 soldered upon a rear region of the paddle card 308. A metallic shell 314 encloses the housing 302. A pair of metallic spring plates 316 are assembled to the housing 302 and sandwiched between the housing 203 and the shell 314. The primary difference relative to the first embodiment is to provide a pair of discrete latches 318, in place of a single U-shaped latch piece disclosed in the first embodiment, retained within two opposite slots 320 of the housing 302 via the barbs 322, wherein a front section 324 of the latch 318 extends into the receiving cavity 304 and the rear section 326 defining a fork structure to sandwich a front edge region of the paddle card 308 in a soldered manner. Understandably, this arrangement may allow a relatively larger tolerance during manufacturing advantageously.

FIGS. 39(A)-43 disclose a sixth embodiment of the flippable plug connector 400. The plug connector 400 includes an insulative housing 402 forming a receiving cavity 404. Two rows of contacts 406 are assembled within the housing 402 with the front contacting sections extending into the receiving cavity 404 and rear connecting sections regulated by a spacer 408 to reach a front region of the paddle card 410. A U-shaped latch 412 is retained in the housing 402 in front of the spacer 408 with front sections extending into the receiving cavity 404. A metallic shell 414 encloses the housing 402. A cable 416 includes a plurality of wires 418 soldered to a rear region of the paddle card 410. The primary difference relative to the first embodiment, is to provide the spring plate 420 without the retention tab 28 disclosed in the first embodiment but forming an engagement notch 422 to receive a protrusion 426 on the housing 402 so as not to lessen the housing material for strength consideration. On the other hand, the 0.05 mm tape 30 disclosed in the first embodiment, has been replaced with the 0.1 mm plastic plate 430. Additionally, the front contacting section 428 is structured with a bellow shape instead of a cantilevered type so as to leave a sufficient distance with regard to the contacting sections of the contacts for not shorting therebetween.

Referring to FIGS. 44-55 showing a seventh embodiment of a receptacle connector 200, the receptacle connector 200 is essentially a power only type of less contacts thereof. The receptacle connector 200 includes a terminal module 202 enclosed in a housing 204. Understandably, in this embodiment the housing 204 is insulative. Anyhow, the housing 204 may be metallic via a die casting method or a metallic drawing piece associated with an overmolded insulator. The terminal module 202 is essentially composed of the upper insulator 206 with the upper contacts 208 insert-molded therein, the lower insulator 210 with the lower contacts 212 insert-molded therein, and the middle insulator 214 with the shielding plate 216 insert-molded therein, wherein the middle insulator 214 forming the mating tongue thereof, is sandwiched between the upper insulator 206 and the lower insulator 210 with the securing sections 218 secured into the corresponding retention slots 220 in the upper insulator 206 and those in the lower insulator 210. The tails of the upper contacts 208 and the lower contacts 212 are of a compression mount for reliable and replaceable connection to the printed circuit board 250. A metallic collar 222 surrounds the terminal module 202. The shielding plate 216 forms a pair of lateral edge sections 217 exposed outside of the mating tongue to be engaged with a pair of latching structures of the mated plug connector (not shown). The housing 204 forms a front capsular mating cavity 230 and a rear rectangular receiving cavity 232 communicate with each other along the front-to-back direction to commonly receive the terminal module 202 therein. The housing 204 forms transverse retention plate 234 on an exterior side for reception within the corresponding retention grooves 260 in the receiving space 262 of the case 266 of a mobile device 255, and a pair of retention lugs 236 for reception within the corresponding retention recesses 264 so as to have the connector 200 assembled securely within the corresponding receiving space 262 of the mobile device 255. The housing 204 further forms a pair of securing lugs 238 received in the corresponding recessions 240 to secure the terminal module 202 within the receiving cavity 232 of the housing 204. The housing 202 forms an upward opening 242 to allow the tails of the upper contacts 208 and the lower contacts 214 to extend therethrough upwardly to contact the printed circuit board 250. The case 266 forms a through opening 268 to communicate the receiving space 262 with an exterior. A pair of supporting ribs 269 are formed in the receiving space 262 to support the connector 200. Two pairs of press fit ribs (not labeled) and each pair being by two sides of the retention recess 264, are formed on the side walls facing the receiving space 262 to press against the inserted connector 200 for retention. A rubber seal 251 surrounds the front capsular portion 231 of the housing 204 and forms a shoulder 253 to abut against a front edge of the front capsular portion 231 in a compressed manner, along the front-to-back direction, when the connector 200 is assembled in the receiving space 262. Under this arrangement, the connector 200 is first downwardly assembled into the receiving space 262 and the printed circuit board 250 is successively assembled thereto to have the tails of the upper contacts 208 and the lower contacts 212 to mechanically and electrically connect thereto in a compressing manner. Understandably, compared with other previous embodiments, the connector 200 has less contacts which only perform power delivery. Anyhow, the additional signal contacts are optionally provided in the same connector, if desired. Additionally, similar to the previous embodiment, the plug connector is flippable with regard to the receptacle connector 200.

Figure 56:
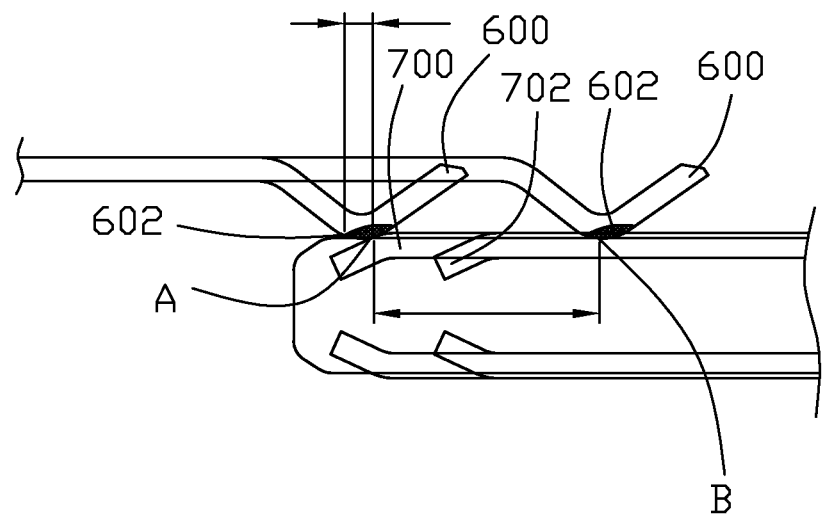
FIG. 56 is an illustrative side view to show how the contacts are coupled to each other during the regular plug connector is mated with the receptacle connector.
Figure 57:
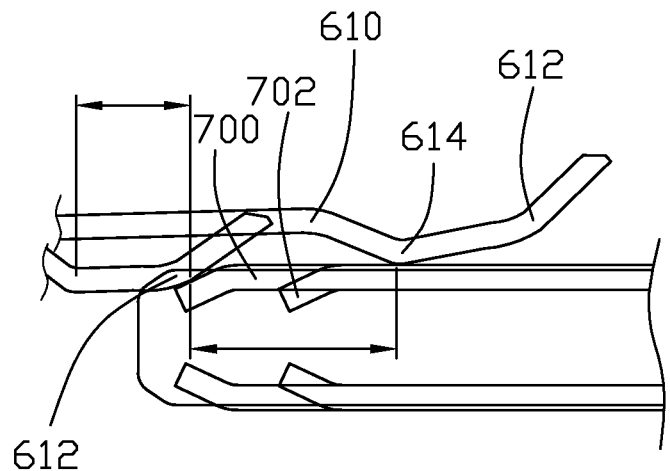
FIG. 57 is an illustrative side view to show the power contact of the embodiment of the plug connector mated with the contact of the receptacle connector.
Figure 58:
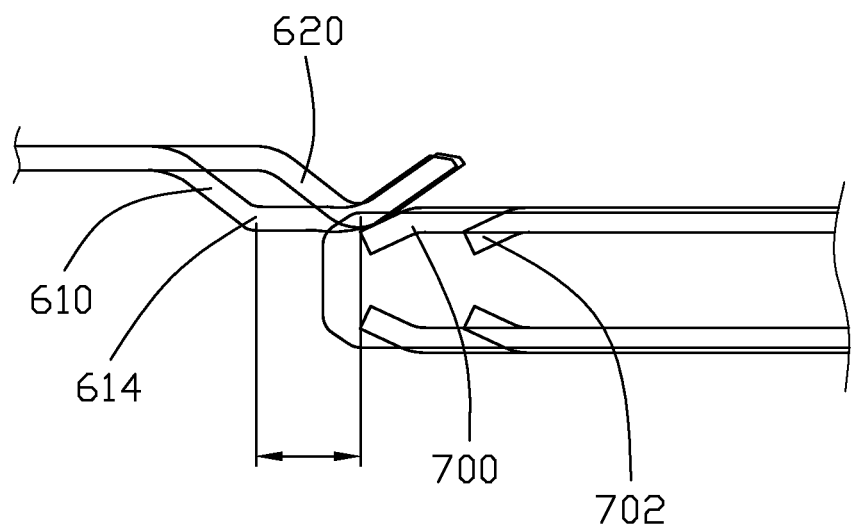
FIG. 58 is an illustrative side view to show both the power contact and the signal contact of the plug connector of FIG. 57 mated with the contact of the receptacle connector.
Figure 59:
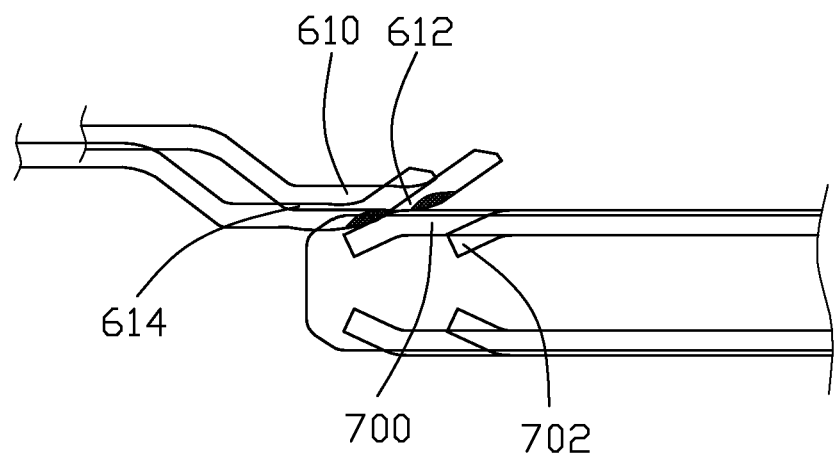
FIG. 59 is an illustrative side view to show how the contacting area of the power contact of the plug connector of FIG. 57 is not affected by insertion damage during mating.

Referring to FIG. 56 the deflectable power contact 600 of the plug connector forms an angled contacting area 602, the blacken area on the angled contacting area 602 means the arc damaged region during breaking, and position "A" of the flat power contact 700 of the receptacle connector shows the breaking point and position "B" thereof shows the contacting point when mated with the same one power contact 600 of the plug connector. Notably, in the receptacle econnector, the signal contact 702 has a more rearward breaking point than the power contact 700. Clearly, the contacting area 602 includes the arc damaged region, thus making the connection inferior. FIG. 57 shows the power contact 610 moves between the initial/breaking position where the breaking point 612 contacts the power contact 700 of the receptacle connector, to the full/contact position where the contacting point 614 contacts the power contact 700 of the receptacle connector. In this embodiment the breaking point 612 and the contacting point 614 is distance from each other with around 0.75 mm optionally along an oblique extending line. FIG. 58 shows the signal contact 620 still has the same original angled contacting section which is spaced from the contacting point with 0.5 mm in a side view. FIG. 59 shows in the power contact of the plug connector how the arc damaged area is avoided in the contacting point due to such an obliquely extending line. Understandably, the arc damage essentially occurs around the last breaking piece so only the power contact is involved therewith for this improvement.

However, the disclosure is illustrative only, changes may be made in detail, especially in matter of shape, size, and arrangement of parts within the principles of the invention.

What is claimed is:

1. A receptacle connector for being mounted in a notch defined on a printed circuit board (PCB), comprising:
   an insulative housing defining a base and a mating tongue forwardly extending therefrom;
   a first row of contacts disposed in the housing with contacting sections exposed upon a first surface of the mating tongue and surface mount type tail sections for mounting on the PCB;
   a second row of contacts disposed in the housing with contacting sections exposed upon a second surface of the mating tongue and through hole type tail sections for mounting in the PCB;
   a metallic shield comprising a capsular segment surrounding the mating tongue to define a mating cavity and a rear wall covering a rear face of the base to surrounding the surface mount type tail sections of the first row of contacts; and
   a metallic lower bracket attached to the metallic shielding; wherein
   the lower bracket located upon a bottom side of the shield and comprises a bottom wall, two sidewalls and a rear wall commonly surrounding the through hole type tail sections of the second row of contacts.

2. The receptacle connector as claimed in claim 1, wherein each sidewall of the lower bracket comprises a front sidewall and a rear sidewall separated from each other, the front sidewalls of the sidewalls are soldered to the capsular segment of the shield.

3. The receptacle connector as claimed in claim 2, wherein the rear sidewalls and rear wall of the lower bracket define soldering pads for being soldered to the PCB.

4. The receptacle connector as claimed in claim 3, wherein the rear wall of the lower bracket bend from the bottom wall and is aligned with the rear sidewalls of the lower bracket.

5. The receptacle connector as claimed in claim 1, wherein the lower bracket is formed by drawing.

6. The receptacle connector as claimed in claim 1, comprising an upper bracket located upon a top side of the shield, wherein the upper bracket comprises a pair of mounting legs for being inserted into the PCB.

7. The receptacle connector as claimed in claim 6, wherein the upper bracket includes a pair of block like raised portions to cover two opposite lateral sides of the housing which is originally exposed via gaps of an extending plate of the shield.

8. The receptacle connector as claimed in claim 1, further including a metallic shielding plate embedded within the mating tongue, wherein said shielding plate includes a pair of rigid locking notches in two opposite lateral sides for locking to a pair of latches of a complementary plug connector.

9. A receptacle connector assembly comprising:
   an insulative housing including a front capsular portion from which a mating tongue forwardly extends along a front-to-back direction, and a rear horizontal portion unitarily extends rearwardly along said front-to-back direction, wherein a pair of opposite gaps are formed between the capsular portion and the horizontal portion in a transverse direction perpendicular to said front-to-back direction so as to forwardly expose a pair of corresponding corner portions of said horizontal portion;
   a plurality of contacts disposed in the housing with contacting sections exposed upon the mating tongue;
   a metallic shielding plate embedded within the mating tongue with a pair of rigid locking notches in two lateral sides for locking with a pair of latches of a complementary plug connector;
   a metallic shielding assembly including a metallic shield and a metallic bracket, said metallic shield forming a front capsular part and a rear covering part, the front capsular part enclosing the capsular portion and the mating tongue of the housing to form a mating cavity, and the rear covering part covering the horizontal portion of the housing, the bracket fastened upon the shield; wherein said metallic shielding assembly includes a pair of segment structures on two opposite ends in said transverse direction to shield the pair of corresponding gaps in both the front-to-back direction and the transverse direction.

10. The receptacle connector assembly as claimed in claim 9, wherein the segment structures are formed unitarily on said bracket.

11. The receptacle connector assembly as claimed in claim 9, wherein said segment structure includes a first part extending along the front-to-back direction to shield the gap in the transverse direction, and a second part extending from the first part in the transverse direction to shield the gap in the front-to-back direction.

12. The receptacle connector assembly as claimed in claim 9, wherein in the metallic shield, said front capsular part and the rear covering part are unitarily formed with each other.

13. The receptacle connector assembly as claimed in claim 9, wherein said bracket unitarily forms mounting legs for mounting to a printed circuit board on which tails of the contacts are mounted.

14. The receptacle connector assembly as claimed in claim 13, wherein said rear covering part includes mounting legs for mounting to said printed circuit board.

15. The receptacle connector assembly as claimed in claim 9, wherein the rear horizontal portion is higher than the front capsular portion so as to allow the front capsular portion enclosed within the front capsular part of the shield to be located within a notch of a printed circuit board and the rear horizontal portion enclosed in the rear covering part to be located upon the printed circuit board with corresponding tails of the contacts under said rear horizontal portion for mounting to the printed circuit board.

* * * * *